US012777846B2

(12) United States Patent
Yoshiyasu et al.

(10) Patent No.: US 12,777,846 B2
(45) Date of Patent: Oct. 27, 2026

(54) MIXED MATERIAL FOR LIGHT-EMITTING DEVICE

(71) Applicant: Semiconductor Energy Laboratory Co., Ltd., Kanagawa-ken (JP)

(72) Inventors: Yui Yoshiyasu, Atsugi (JP); Naoaki Hashimoto, Sagamihara (JP); Tatsuyoshi Takahashi, Atsugi (JP); Sachiko Kawakami, Atsugi (JP); Satoshi Seo, Sagamihara (JP)

(73) Assignee: Semiconductor Energy Laboratory Co., Ltd. (JP)

(*) Notice: Subject to any disclaimer, the term of this patent is extended or adjusted under 35 U.S.C. 154(b) by 174 days.

(21) Appl. No.: 18/793,024

(22) Filed: Aug. 2, 2024

(65) Prior Publication Data

US 2024/0397818 A1 Nov. 28, 2024

Related U.S. Application Data

(63) Continuation of application No. 17/703,524, filed on Mar. 24, 2022, now Pat. No. 12,063,856.

(30) Foreign Application Priority Data

Mar. 31, 2021 (JP) ................................ 2021-061504

(51) Int. Cl.
*H10K 85/60* (2023.01)
*H10K 50/16* (2023.01)

(52) U.S. Cl.
CPC ....... *H10K 85/6572* (2023.02); *H10K 85/615* (2023.02); *H10K 85/626* (2023.02); *H10K 85/654* (2023.02); *H10K 50/16* (2023.02)

(58) Field of Classification Search
CPC ...................................................... H10K 50/16
See application file for complete search history.

(56) References Cited

U.S. PATENT DOCUMENTS 5,652,067 A 7/1997 Ito et al.
7,211,824 B2 5/2007 Lazarev
(Continued)

FOREIGN PATENT DOCUMENTS

CN 104247076 A 12/2014
JP 2004-307384 A 11/2004
(Continued)

OTHER PUBLICATIONS

Taiwanese Office Action (Application No. 111111959) Dated Aug. 22, 2025.

*Primary Examiner* — Khanh T Nguyen
(74) *Attorney, Agent, or Firm* — Husch Blackwell LLP

(57) ABSTRACT

A novel mixed material for a light-emitting device with improved heat resistance is provided. The mixed material for a light-emitting device includes a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring.

26 Claims, 25 Drawing Sheets

(56) References Cited

U.S. PATENT DOCUMENTS

| | | | |
|---|---|---|---|
| 7,282,275 B2 | 10/2007 | Wolk et al. | |
| 9,159,942 B2 | 10/2015 | Seo et al. | |
| 9,478,749 B2 | 10/2016 | Suzuki et al. | |
| 9,515,278 B2 | 12/2016 | Suzuki et al. | |
| 9,905,782 B2 | 2/2018 | Inoue et al. | |
| 9,997,725 B2 | 6/2018 | Kawakami et al. | |
| 10,205,100 B2 | 2/2019 | Suzuki et al. | |
| 10,811,617 B2 | 10/2020 | Kawakami et al. | |
| 11,063,221 B2 | 7/2021 | Heil et al. | |
| 11,094,903 B2 | 8/2021 | Ohsawa et al. | |
| 11,588,125 B2 | 2/2023 | Ohsawa et al. | |
| 11,968,850 B2 | 4/2024 | Ohsawa et al. | |
| 2007/0096089 A1 | 5/2007 | Lazarev | |
| 2012/0068170 A1 | 3/2012 | Pflumm et al. | |
| 2016/0240794 A1 | 8/2016 | Yamada et al. | |
| 2016/0351833 A1 | 12/2016 | Hosoumi et al. | |
| 2020/0028084 A1* | 1/2020 | Song | C07C 211/61 |
| 2020/0199135 A1 | 6/2020 | Kurihara et al. | |
| 2021/0206775 A1 | 7/2021 | Watabe et al. | |
| 2021/0313520 A1 | 10/2021 | Seo et al. | |
| 2021/0363151 A1 | 11/2021 | Seo et al. | |
| 2022/0029111 A1 | 1/2022 | Seo et al. | |
| 2022/0285629 A1 | 9/2022 | Yoshiyasu et al. | |
| 2025/0374744 A1 | 12/2025 | Ohsawa et al. | |

FOREIGN PATENT DOCUMENTS

| | | |
|---|---|---|
| JP | 2006-121064 A | 5/2006 |
| JP | 2007-258237 A | 10/2007 |
| JP | 2008-112984 A | 5/2008 |
| JP | 5167747 | 3/2013 |
| JP | 2013-110224 A | 6/2013 |
| JP | 2014-209603 A | 11/2014 |
| JP | 2017-075114 A | 4/2017 |
| JP | 2017-514807 | 6/2017 |
| JP | 2018-201012 A | 12/2018 |
| TW | 200306345 | 11/2003 |
| TW | 202035418 | 10/2020 |
| WO | WO-2003/090502 | 10/2003 |
| WO | WO-2013/157591 | 10/2013 |
| WO | WO-2018/185642 | 10/2018 |

* cited by examiner

<Structure> Glass\NBPhen (10 nm)

<Structure> Glass\2mpPCBPDBq (10 nm)

<Structure> Glass\2mpPCBPDBq (10 nm)\NBPhen (10 nm)

<Structure> Glass\2mpPCBPDBq:NBPhen(0.5:0.5) (20 nm)

<Structure>Glass\ZADN (25 nm)

<Structure> Glass\mFBPTzn (5 nm)

<Structure> Glass\mFBPTzn : ZADN(1 : 1) (5 nm)

<Structure> Glass\NBPhen (10 nm)

<Structure> Glass\TmPPPyTz (35 nm)

<Structure> Glass\TmPPPyTz:NBPhen(1:1) (35 nm)

MIXED MATERIAL FOR LIGHT-EMITTING DEVICE

This application is a continuation of copending U.S. application Ser. No. 17/703,524, filed on Mar. 24, 2022 which is incorporated herein by reference.

BACKGROUND OF THE INVENTION

1. Field of the Invention

One embodiment of the present invention relates to a mixed material for a light-emitting device. One embodiment of the present invention also relates to a light-emitting device, a display module, a lighting module, a display device, a light-emitting apparatus, an electronic appliance, a lighting device, and an electronic device. Note that one embodiment of the present invention is not limited to the above technical field. The technical field of one embodiment of the present invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting apparatus, a lighting device, a memory device, an imaging device, a driving method thereof, and a manufacturing method thereof.

2. Description of the Related Art

Light-emitting devices (organic EL devices) including organic compounds and utilizing electroluminescence (EL) have been put to practical use. In the basic structure of such light-emitting devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal devices, such as high visibility and no need for backlight when used in pixels of a display, and are suitable as flat panel display devices. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be used for lighting devices and the like.

Displays or lighting devices including light-emitting devices can be used suitably for a variety of electronic appliances as described above, and research and development of light-emitting devices have progressed for more favorable characteristics.

Organic compounds used for a light-emitting device significantly affect the device characteristics. For this reason, whether the physical properties of the organic compounds used are fitted to the temperature range required based on the light-emitting device's manufacturing process or applications is very important to improve the reliability of light-emitting devices. This has promoted the development of materials with less morphological change due to heat, for example (Patent Document 1).

REFERENCE

[Patent Document 1] Japanese Published Patent Application No. 2017-75114

SUMMARY OF THE INVENTION

An object of one embodiment of the present invention is to provide a novel mixed material for a light-emitting device. An object of another embodiment of the present invention is to provide a novel mixed material for a light-emitting device that has improved heat resistance. An object of another embodiment of the present invention is to provide a novel light-emitting device that is highly convenient, useful, or reliable. An object of another embodiment of the present invention is to provide a novel mixed material for an organic semiconductor device. An object of another embodiment of the present invention is to provide a novel mixed material for an organic semiconductor device that has improved heat resistance. An object of another embodiment of the present invention is to provide a novel organic semiconductor device that is highly convenient, useful, or reliable. An object of another embodiment of the present invention is to provide a novel light-emitting apparatus that is highly convenient, useful, or reliable. An object of another embodiment of the present invention is to provide a novel electronic appliance that is highly convenient, useful, or reliable. An object of another embodiment of the present invention is to provide a novel lighting device that is highly convenient, useful, or reliable.

An object of another embodiment of the present invention is to provide a novel mixed material for a light-emitting device that can have improved heat resistance when formed into a thin film. An object of another embodiment of the present invention is to provide a light-emitting device with high heat resistance. An object of another embodiment of the present invention is to provide a light-emitting device with high resistance to heat in a manufacturing process. An object of another embodiment of the present invention is to provide a novel mixed material for an organic semiconductor device that can have improved heat resistance when formed into a thin film. An object of another embodiment of the present invention is to provide an organic semiconductor device with high heat resistance. An object of another embodiment of the present invention is to provide an organic semiconductor device with high resistance to heat in a manufacturing process. An object of another embodiment of the present invention is to provide a light-emitting device, an organic semiconductor device, a light-emitting apparatus, an electronic appliance, a display device, and an electronic device each having low power consumption. An object of another embodiment of the present invention is to provide a light-emitting device, a light-emitting apparatus, an electronic appliance, a display apparatus, and an electronic device each having low power consumption and high reliability.

Note that the description of these objects does not preclude the existence of other objects. One embodiment of the present invention does not necessarily achieve all the objects listed above. Other objects will be apparent from and can be derived from the description of the specification, the drawings, the claims, and the like.

One embodiment of the present invention is a mixed material for a light-emitting device including a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring.

Another embodiment of the present invention is a mixed material for a light-emitting device in which any one of the first heteroaromatic ring and the second heteroaromatic ring is a fused heteroaromatic ring in the above structure.

Another embodiment of the present invention is a mixed material for a light-emitting device in which both the first heteroaromatic ring and the second heteroaromatic ring are fused heteroaromatic rings in the above structure.

Another embodiment of the present invention is a mixed material for a light-emitting device in which at least one of the first heteroaromatic ring and the second heteroaromatic in the above structure is any one of a pyrimidine ring, a pyrazine ring, a pyridazine ring, a triazine ring, a pyridine ring, a phenanthroline ring, a quinoxaline ring, a dibenzoquinoxaline ring, a quinazoline ring, a benzoquinazoline ring, a dibenzoquinazoline ring, a benzimidazole ring, a benzofropyrimidine ring, and a benzofropyrazine ring.

Another embodiment of the present invention is a mixed material for a light-emitting device in which a glass transition temperature of any one of the first heteroaromatic compound and the second heteroaromatic compound is 100° C. or higher in the above structure.

Another embodiment of the present invention is a mixed material for a light-emitting device in which a glass transition temperature of any one of the first heteroaromatic compound and the second heteroaromatic compound is 100° C. or higher, and a difference between the glass transition temperature and a glass transition temperature of the other of the first heteroaromatic compound and the second heteroaromatic compound is 40° C. or higher in the above structure.

Another embodiment of the present invention is a mixed material for a light-emitting device in which glass transition temperatures of both the first heteroaromatic compound and the second heteroaromatic compound are 100° C. or higher in the above structure.

In addition to the aforementioned light-emitting device, the present invention includes a light-emitting device including a layer (e.g., a cap layer) that is in contact with an electrode and contains an organic compound. In addition to the light-emitting devices, a light-emitting apparatus including a transistor, a substrate, and the like is also included in the scope of the present invention. Furthermore, an electronic appliance and a lighting device each including any of these light-emitting devices and any of a sensor unit, an input unit, a communication unit, and the like are also included in the scope of the present invention.

In addition, the scope of one embodiment of the present invention includes a light-emitting apparatus including a light-emitting device, and a lighting device including the light-emitting apparatus. Accordingly, the light-emitting apparatus in this specification refers to an image display device and a light source (including a lighting device). In addition, the light-emitting apparatus includes the following in its category: a module in which a connector such as a flexible printed circuit (FPC) or a tape carrier package (TCP) is attached to a light-emitting apparatus; a module in which a printed wiring board is provided at the end of a TCP; and a module in which an integrated circuit (IC) is directly mounted on a light-emitting device by a chip on glass (COG) method.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state where current, voltage, or a potential can be supplied or transmitted. Accordingly, a state of being connected means not only a state of being directly connected but also a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring serves as an electrode. Connection in this specification also includes such a case where one conductive film has functions of a plurality of components, in its category.

One embodiment of the present invention can provide a novel mixed material for a light-emitting device. Another embodiment of the present invention can provide a novel mixed material for a light-emitting device that has improved heat resistance. Another embodiment of the present invention can provide a novel light-emitting device that is highly convenient, useful, or reliable. Another embodiment of the present invention can provide a novel mixed material for an organic semiconductor device. Another embodiment of the present invention can provide a novel mixed material for an organic semiconductor device that has improved heat resistance. Another embodiment of the present invention can provide a novel organic semiconductor device that is highly convenient, useful, or reliable. Another embodiment of the present invention can provide a novel light-emitting apparatus that is highly convenient, useful, or reliable. Another embodiment of the present invention can provide a novel electronic appliance that is highly convenient, useful, or reliable. Another embodiment of the present invention can provide a novel lighting device that is highly convenient, useful, or reliable.

Another embodiment of the present invention can provide a novel mixed material for a light-emitting device that can have improved heat resistance when formed into a thin film. Another embodiment of the present invention can provide a light-emitting device with high heat resistance. Another embodiment of the present invention can provide a light-emitting device with high resistance to heat in a manufacturing process. Another embodiment of the present invention can provide a novel mixed material for an organic semiconductor device that can have improved heat resistance when formed into a thin film. Another embodiment of the present invention can provide an organic semiconductor device with high heat resistance. Another embodiment of the present invention can provide an organic semiconductor device with high resistance to heat in a manufacturing process. Another embodiment of the present invention can provide a light-emitting device, an organic semiconductor device, a light-emitting apparatus, an electronic appliance, a display device, and an electronic device each having low power consumption. Another embodiment of the present invention can provide a light-emitting device, a light-emitting apparatus, an electronic appliance, a display apparatus, and an electronic device each having low power consumption and high reliability.

Note that the description of these effects does not preclude the existence of other effects. One embodiment of the present invention does not necessarily have all the effects listed above. Other effects will be apparent from and can be derived from the description of the specification, the drawings, the claims, and the like.

DETAILED DESCRIPTION OF THE INVENTION

Figure 1A:
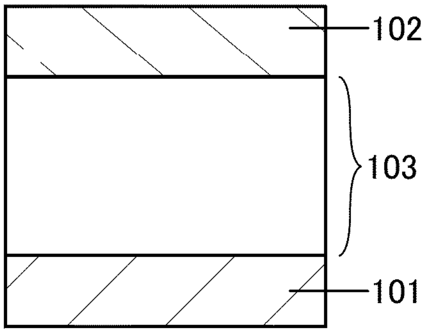
FIGS. 1A to 1E each illustrate a structure of a light-emitting device according to an embodiment.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In this embodiment, a mixed material for a light-emitting device of one embodiment of the present invention is described. A thin film using the mixed material for a light-emitting device can have improved heat resistance. In other words, the mixed material for a light-emitting device of one embodiment of the present invention can effectively reduce a morphological change caused by forming a thin film. Note that the mixed material for a light-emitting device described in this embodiment can be applied to an organic semiconductor device and can also be referred to as a mixed material for an organic semiconductor device.

A mixed material for a light-emitting device of one embodiment of the present invention includes a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring. Note that examples of the above-described diazine ring include a pyrimidine ring, a pyrazine ring, and a pyridazine ring.

The above heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a benzofurodiazine ring (for example, a benzofuropyrimidine ring or a benzofuropyrazine ring), and a benzimidazole ring. Note that a quinoline ring, a benzoquinoline ring, and a phenanthroline ring each include a pyridine ring, for example. In addition, a quinoxaline ring, a dibenzoquinoxaline ring, and a benzofuropyrazine ring each include a pyrazine ring. Furthermore, a quinazoline ring, a benzoquinazoline ring, a dibenzoquinazoline ring, and a benzofuropyrimidine ring each include a pyrimidine ring.

A mixed material for a light-emitting device of another embodiment of the present invention is a mixed material for a light-emitting device, in which either the first heteroaromatic ring or the second heteroaromatic ring is a fused heteroaromatic ring in the above structure.

A mixed material for a light-emitting device of another embodiment of the present invention is a mixed material for a light-emitting device, in which both the first heteroaromatic ring and the second heteroaromatic ring are fused heteroaromatic rings in the above structure.

Note that in the case where the heteroaromatic compound included in the above-described mixed material for a light-emitting device includes a fused heteroaromatic ring as a heteroaromatic ring, the thermophysical properties such as a glass transition temperature (Tg) and a crystallization temperature (Tc) are improved as compared with a mixed material for a light-emitting device including more heteroaromatic compounds not including the fused heteroaromatic ring.

The thermal properties can be improved by including such a fused heteroaromatic ring. However, when a thin film (single film) is formed by only one kind of heteroaromatic compound including a fused heteroaromatic ring, even if a stable glassy state is obtained apparently, the state is sometimes difficult to keep due to a strong interaction of molecules. In other words, in a thin film (single film) formed with only one kind of heteroaromatic compound, the glassy state should be maintained at Tg or lower temperatures; however, when being subjected to the atmosphere or stimulated at Tg or lower temperatures, crystallization might be observed to occur, which could not normally occur. When the glassy state of a thin film (single film) cannot be maintained at Tg or lower temperatures in this manner, in fabrication of a light-emitting device including a step where processing in the atmosphere is needed to form an organic EL layer, the organic EL layer may be crystallized in the middle of processing and thus the properties of the light-emitting device may be adversely affected. However, the mixed material for a light-emitting device of one embodiment of the present invention can suppress the crystallization. As described above, the mixed material for a light-emitting device of one embodiment of the present invention can improve Tg and the film can be inhibited from being crystallized at Tg or lower temperatures. This is also shown by the results described in Example 1 to Example 3.

Note that at least one of the heteroaromatic compounds included in the above mixed material for a light-emitting device includes a fused aromatic ring that is any of a pyrimidine ring, a pyrazine ring, a pyridazine ring, a triazine ring, a pyridine ring, a phenanthroline ring, a quinoxaline ring, a dibenzoquinoxaline ring, a quinazoline ring, a benzoquinazoline ring, a dibenzoquinazoline ring, a benzimidazole ring, a benzofropyrimidine ring, and a benzofropyrazine ring.

The glass transition temperature (Tg) of at least one of heteroaromatic compounds included in the mixed material for a light-emitting device or one of two heteroaromatic compounds included in the mixed material for a light-emitting device is preferably 100° C. or higher. With this structure, the above-described crystallization at Tg or lower is unlikely to occur at lower than 100° C. Therefore, in the case where a step needing processing in the atmosphere is included in fabrication of the organic EL layer of a light-emitting device, heating at up to 100° C. can be conducted in the step and thus the process flexibility can be increased.

When the mixed material for a light-emitting device includes two kinds of heteroaromatic compounds, preferably, the glass transition temperature of one of the heteroaromatic compounds is preferably 100° C. or higher and a difference from the glass transition temperature of the other heteroaromatic compound is 40° C. or higher.

The glass transition temperatures of all the heteroaromatic compounds included in the mixed material for a light-emitting device are preferably 100° C. or higher.

The mixed material for a light-emitting device preferably includes no metal complex. As the metal complex, an alkali metal complex and an alkali earth metal complex, and in particular, an alkali metal quinolinol complex and an alkaline earth metal quinolinol complex can be given. Such a metal complex possibly reacts with moisture in the atmosphere and thus is not suitable for a manufacturing process of an organic EL device including a step needing processing in the atmosphere in fabrication of an organic EL layer of a light-emitting device. However, even when a step needing processing in the atmosphere is included in fabrication of an organic EL layer of a light-emitting device, such a metal complex can be used favorably as long as the organic EL layer is formed only in a step in an inert gas atmosphere or a step under a reduced pressure after the step in the atmosphere.

In addition, one or more kinds of the heteroaromatic compounds represented by Structural Formulae (101) to (118) can be used in combination for the mixed material for a light-emitting device of one embodiment of the present invention.

[Chemical formula 1]
(101)
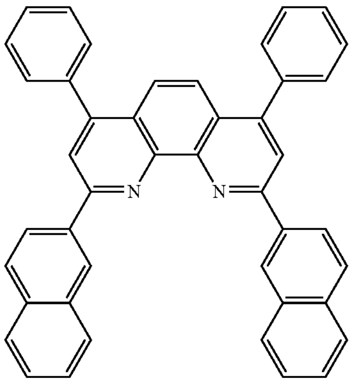
(102)
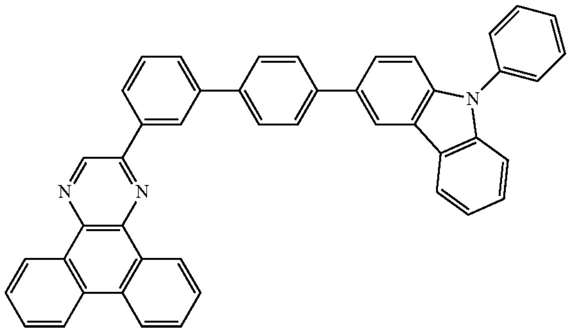
(103)
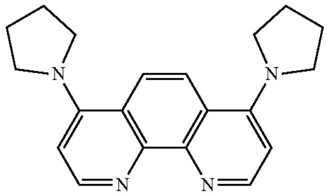
(104)
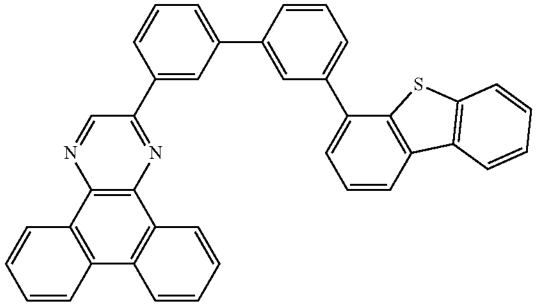
(105)
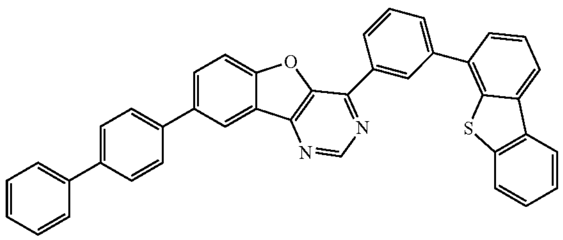
-continued
(106)
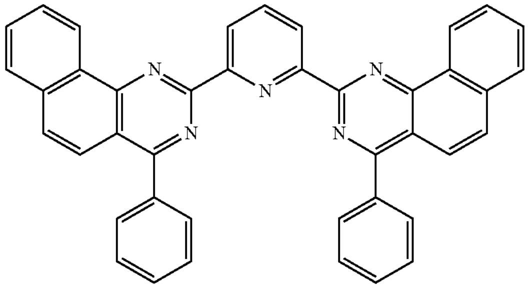
(107)
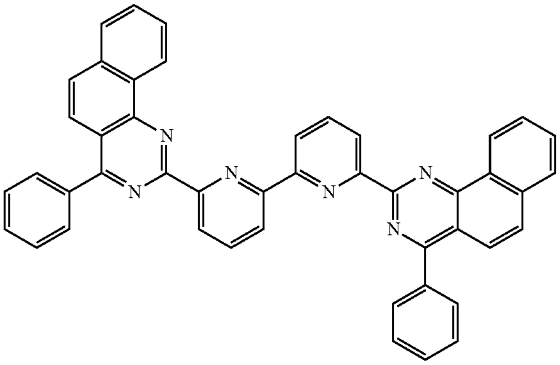
(108)
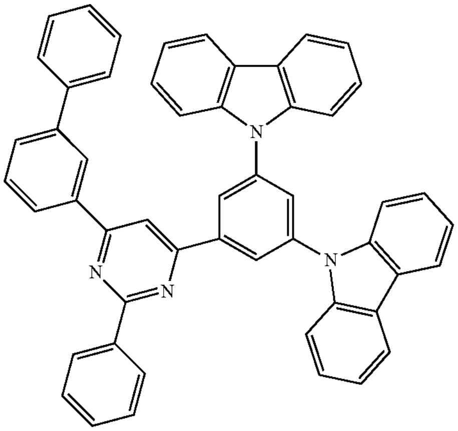
[Chemical formula 2]
(109)
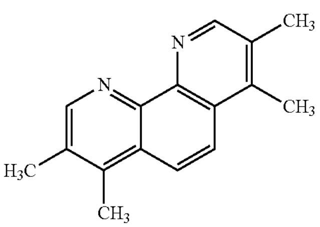

-continued
(110)
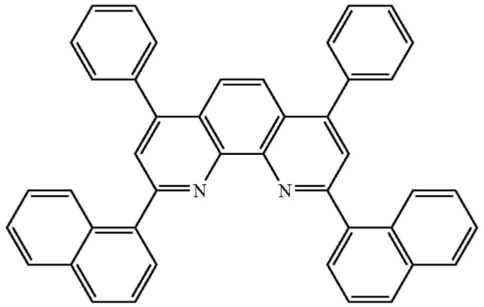
(111)
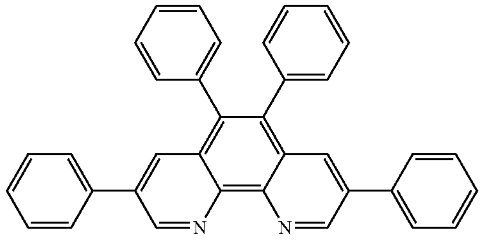
(112)
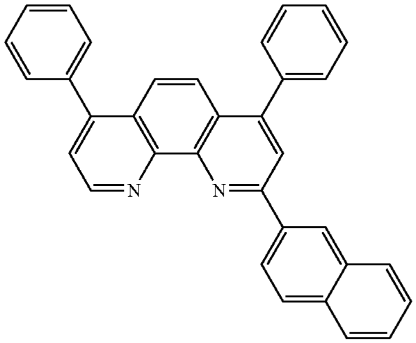
(113)
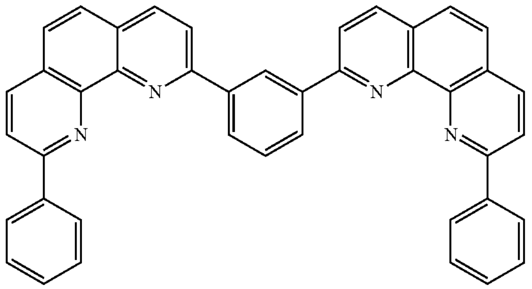
(114)
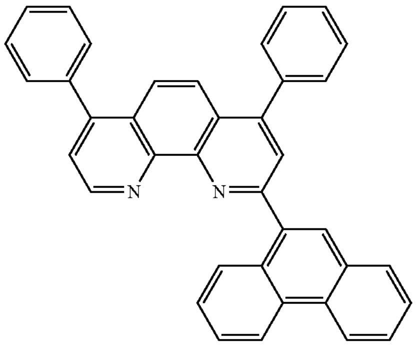
-continued
(115)
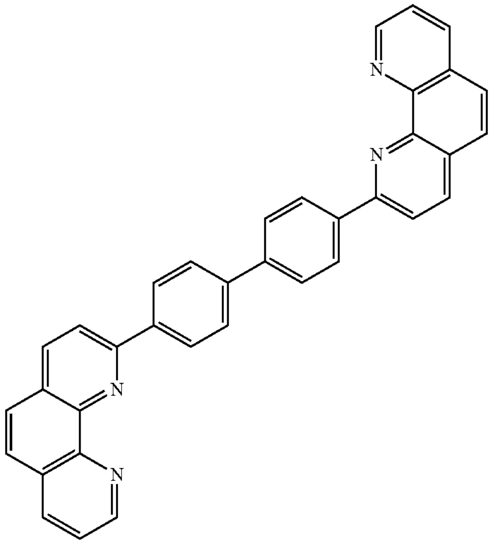
(116)
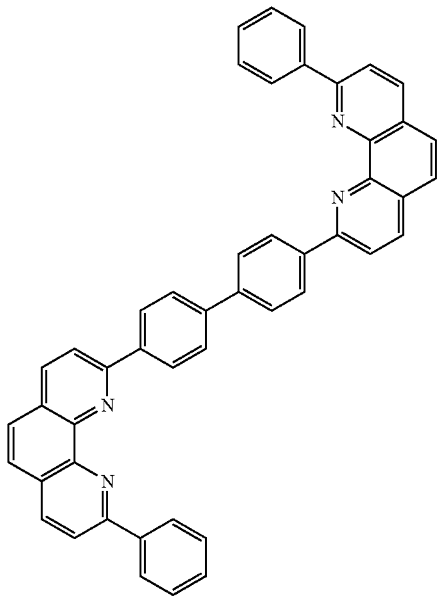
(117)
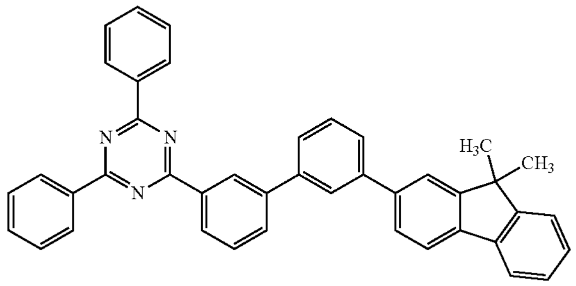

-continued (118)

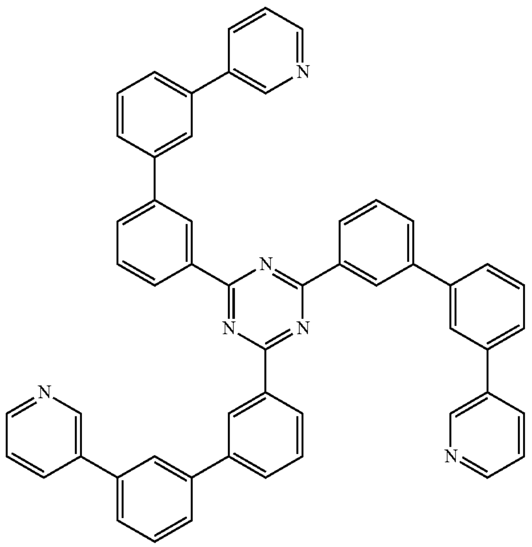

In the case where the mixed material for a light-emitting device includes two kinds of heteroaromatic compounds, the percentage of one heteroaromatic compound with a higher electron-transport property with respect to the other heteroaromatic compound is 10 wt % or higher, preferably 20 wt % or higher, and further preferably 30 wt % or higher to increase the heat resistance.

The heteroaromatic compounds given as specific examples of electron-transport materials in Embodiment 2 can be referred to for the heteroaromatic compounds that can be used for the mixed material for a light-emitting device described in this embodiment and thus this embodiment does not give specific examples.

The structures described in this embodiment can be used in combination with any of the structures described in the other embodiments, as appropriate.

Embodiment 2

In this embodiment, light-emitting devices including any of the mixed materials for a light-emitting device described in Embodiment 1 are described with reference to FIGS. 1A to 1E.

<<Basic Structure of Light-Emitting Device>>

A basic structure of a light-emitting device is described. FIG. 1A illustrates a light-emitting device including, between a pair of electrodes, an EL layer including a light-emitting layer. Specifically, an EL layer 103 is positioned between a first electrode 101 and a second electrode 102.

Figure 1B:
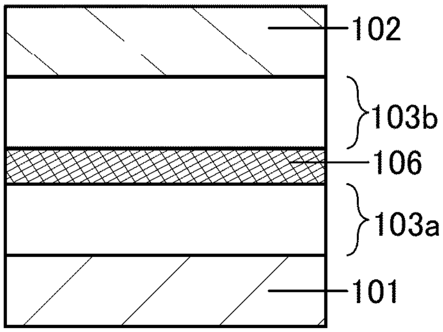

FIG. 1B illustrates a light-emitting device that has a stacked-layer structure (tandem structure) in which a plurality of EL layers (two EL layers 103*a* and 103*b* in FIG. 1B) are provided between a pair of electrodes and a charge-generation layer 106 is provided between the EL layers. A light-emitting device having a tandem structure enables fabrication of a light-emitting apparatus that can be driven at a low voltage and has low power consumption.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when voltage is applied in FIG. 1B such that the potential of the first electrode 101 is higher than that of the second electrode 102, the charge-generation layer 106 injects electrons into the EL layer 103*a* and injects holes into the EL layer 103*b*.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 1C:
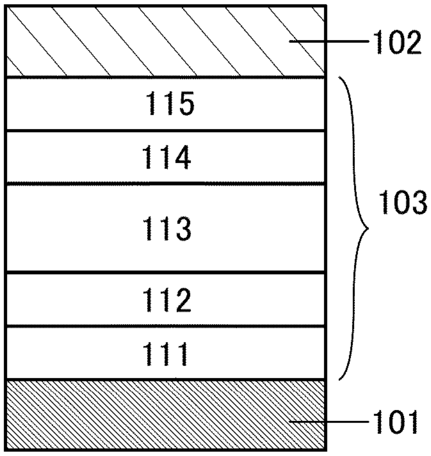

FIG. 1C illustrates a stacked-layer structure of the EL layer 103 in the light-emitting device of one embodiment of the present invention. In this case, the first electrode 101 is regarded as functioning as an anode and the second electrode 102 is regarded as functioning as a cathode. The EL layer 103 has a structure in which a hole-injection layer 111, a hole-transport layer 112, the light-emitting layer 113, an electron-transport layer 114, and an electron-injection layer 115 are stacked in this order over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can achieve higher reliability than a single-layer structure in some cases. In the case where a plurality of EL layers are provided as in the tandem structure illustrated in FIG. 1B, the layers in each EL layer are sequentially stacked from the anode side as described above. When the first electrode 101 is the cathode and the second electrode 102 is the anode, the stacking order of the layers in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a light-emitting substance and a plurality of substances, so that either or both of fluorescent light of a desired color or/and phosphorescent light of a desired color can be obtained. The light-emitting layer 113 may have a stacked-layer structure having different emission colors. In that case, light-emitting substances and other substances are different between the stacked light-emitting layers. Alternatively, the plurality of EL layers (103*a* and 103*b*) in FIG. 1B may exhibit their respective emission colors. Also in that case, the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a transflective electrode in FIG. 1C. Thus, light from the light-emitting layer 113 in the EL layer 103 can be resonated between the electrodes and light obtained through the second electrode 102 can be intensified.

Note that when the first electrode 101 of the light-emitting device is a reflective electrode having a stacked-layer structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is λ, the optical path length between the first electrode 101 and the second electrode 102 (the product of the thickness and the refractive index) is preferably adjusted to be mλ/2 (m is a natural number) or close to mλ/2.

To amplify desired light (wavelength: λ) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be (2m'+1)λ/4 (m' is a natural number) or close to (2m'+1)λ/4. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 1D:
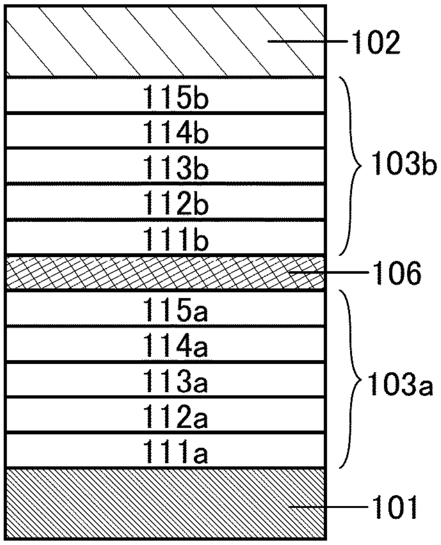

The light-emitting device illustrated in FIG. 1D is a light-emitting device having a tandem structure. Owing to a microcavity structure of the light-emitting device, light (monochromatic light) with different wavelengths from the EL layers (103*a* and 103*b*) can be extracted. Thus, it is unnecessary to separately form EL layers for obtaining a plurality of emission colors (e.g., R, G, and B). Therefore, high definition can be easily achieved. A combination with coloring layers (color filters) is also possible. Furthermore, the emission intensity of light with a specific wavelength in the front direction can be increased, whereby power consumption can be reduced.

Figure 1E:
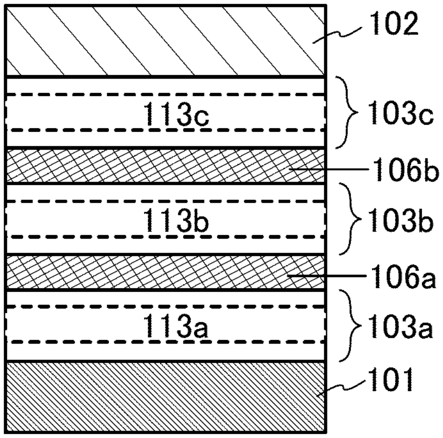

The light-emitting device illustrated in FIG. 1E is an example of the light-emitting device having the tandem structure illustrated in FIG. 1B, and includes three EL layers (103*a*, 103*b*, and 103*c*) stacked with charge-generation layers (106*a* and 106*b*) positioned therebetween, as illustrated in FIG. 1E. The three EL layers (103*a*, 103*b*, and 103*c*) include respective light-emitting layers (113*a*, 113*b*, and 113*c*), and the emission colors of the light-emitting layers can be selected freely. For example, the light-emitting layer 113*a* can emit blue light, the light-emitting layer 113*b* can emit red light, green light, or yellow light, and the light-emitting layer 113*c* can emit blue light, or the light-emitting layer 113*a* can emit red light, the light-emitting layer 113*b* can emit blue light, green light, or yellow light, and the light-emitting layer 113*c* can emit red light In the light-emitting device of one embodiment of the present invention, at least one of the first electrode 101 and the second electrode 102 is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

<<Specific Structure of Light-Emitting Device>>

Next, a specific structure of the light-emitting device of one embodiment of the present invention will be described. Here, the description is made using FIG. 1D illustrating the tandem structure. Note that the structure of the EL layer applies also to the structure of the light-emitting devices having a single structure in FIG. 1A and FIG. 1C. When the light-emitting device in FIG. 1D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the EL layer 103*b*, with the use of a material selected as described above.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 1D, when the first electrode 101 is the anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 are formed, a hole-injection layer 111*b* and a hole-transport layer 112*b* of the EL layer 103*b* are sequentially stacked over the charge-generation layer 106 in a similar manner.

<Hole-Injection Layer>

The hole-injection layers (111, 111*a*, and 111*b*) inject holes from the first electrode 101 serving as the anode and the charge-generation layers (106, 106*a*, and 106*b*) to the EL layers (103, 103*a*, and 103*b*) and contain an organic acceptor material or a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material include 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. Besides, a [3]radialene derivative having an electron-withdrawing group (particularly a cyano group or a halogen group such as a fluoro group), which has a very high electron-accepting property, is preferred; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 in the periodic table (e.g., a transition metal oxide such as molybdenum oxide, vanadium oxide, ruthenium oxide, tungsten oxide, or manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples are phthalocyanine (abbreviation: $H_2Pc$), a phthalocyanine-based compound such as copper phthalocyanine (abbreviation: CuPc), and the like.

Other examples are aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples are high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine] (abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

As the material having a high hole-injection property, a mixed material containing a hole-transport material and the above-described organic acceptor material (electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that other substances can also be used as long as the substances have hole-transport properties higher than electron-transport properties.

As the hole-transport material, materials having a high hole-transport property, such as a compound having a π-electron rich heteroaromatic ring (e.g., a carbazole derivative, a furan derivative, and a thiophene derivative) and an aromatic amine (an organic compound having an aromatic amine skeleton), are preferable.

Examples of the carbazole derivative (an organic compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-

9H,9'H-3,3'-bicarbazole (abbreviation: mBPCCBP), and 9-(2-naphthyl)-9'-phenyl-9H,9'H-3,3'-bicarbazole (abbreviation: PNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (an organic compound having a thiophene ring) include organic compounds having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAββNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis (9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide](abbreviation: PTPDMA), and poly[N,N'-bis(4-butylphenyl)-N,N'-bis (phenyl)benzidine](abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrodes 101 by the hole-injection layers (111, 111*a*, and 111*b*), to the light-emitting layers (113, 113*a*, and 113*b*). Note that the hole-transport layers (112, 112*a*, and 112*b*) each contain a hole-transport material. Thus, the hole-transport layers (112, 112*a*, and 112*b*) can be formed using hole-transport materials that can be used for the hole-injection layers (111, 111*a*, and 111*b*).

Note that in the light-emitting device of one embodiment of the present invention, the organic compound used for the hole-transport layers (112, 112*a*, and 112*b*) can also be used for the light-emitting layers (113, 113*a*, and 113*b*). The use of the same organic compound for the hole-transport layers (112, 112*a*, and 112*b*) and the light-emitting layers (113, 113*a*, and 113*b*) is preferable, in which case holes can be efficiently transported from the hole-transport layers (112, 112*a*, and 112*b*) to the light-emitting layers (113, 113*a*, and 113*b*).

<Light-Emitting Layer>

The light-emitting layers (113, 113*a*, and 113*b*) contain a light-emitting substance. Note that as a light-emitting substance that can be used in the light-emitting layers (113, 113*a*, and 113*b*), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, one light-emitting layer may have a stacked-layer structure including different light-emitting substances.

The light-emitting layers (113, 113*a*, and 113*b*) may each contain one or more kinds of organic compounds (e.g., a host material) in addition to a light-emitting substance (guest material).

In the case where a plurality of host materials are used in the light-emitting layers (113, 113*a*, and 113*b*), a second host material that is additionally used is preferably a substance having a larger energy gap than those of a known guest material and a first host material. Preferably, the lowest singlet excitation energy level (Si level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, low voltage, and a long lifetime can be achieved at the same time.

As an organic compound used as the host material (including the first host material and the second host material), organic compounds such as the hole-transport materials usable for the hole-transport layers (112, 112*a*, and 112*b*) described above and electron-transport materials usable for electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. In an example of a preferred combination of two or more kinds of organic compounds forming an exciplex, one compound of the two or more kinds of organic compounds has a π-electron deficient heteroaromatic ring and the other compound has a π-electron rich heteroaromatic ring. A phosphorescent substance such as an iridium-, rhodium-, or platinum-based organometallic complex or a metal complex may be used as one compound of the combination for forming an exciplex.

There is no particular limitation on the light-emitting substances that can be used for the light-emitting layers (113, 113*a*, and 113*b*), and a light-emitting substance that converts singlet excitation energy into light in the visible light range or a light-emitting substance that converts triplet excitation energy into light in the visible light range can be used.

<<Light-Emitting Substance that Converts Singlet Excitation Energy into Light>>

The following substances that emit fluorescent light (fluorescent substances) can be given as examples of the light-emitting substance that converts singlet excitation energy into light and can be used in the light-emitting layers (113, 113*a*, and 113*b*): a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine](abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N',N'-triphenyl-1,4-phenylenediamine (abbreviation: 2DPAPPA).

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light>>

Examples of the light-emitting substance that converts triplet excitation energy into light and can be used in the light-emitting layer 113 include substances that exhibit phosphorescent light (phosphorescent materials) and thermally activated delayed fluorescent (TADF) materials that exhibit thermally activated delayed fluorescence.

A phosphorescent substance is a compound that emits phosphorescent light but does not emit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole ring, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole ring, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), and bis[2-(4',6'-difluorophenyl)pyridinato-N,$C^{2'}$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength of greater than or equal to 495 nm and less than or equal to 590 nm, the following substances can be given.

Examples of the phosphorescent substance include organometallic iridium complexes having a pyrimidine ring, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato) bis{4,6-dimethyl-2-[6-(2,6-dimethylphenyl)-4-pyrimidinyl-κ$N^3$]phenyl-κC}iridium(III) (abbreviation: $[Ir(dmppm-dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine ring, such as (acetylacetonato)bis(3,5-dimethyl-2-phenylpyrazinato)iridium(III) (abbreviation: $[Ir(mppr-Me)_2(acac)]$) and (acetylacetonato)bis(5-isopropyl-3-methyl-2-phenylpyrazinato)iridium(III) (abbreviation: $[Ir(mppr-iPr)_2(acac)]$); organometallic iridium complexes having a pyridine ring, such as tris(2-phenylpyridinato-N,$C^{2'}$)iridium (III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), bis[2-(2-pyridinyl-κN)phenyl-κC][2-(4-phenyl-2-pyridinyl-κN)phenyl-κC]iridium(III) (abbreviation: $[Ir(ppy)_2(4dppy)]$), bis[2-(2-pyridinyl-κN)phenyl-κC][2-(4-methyl-5-phenyl-2-pyridinyl-κN)phenyl-κC], [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: $Ir(5mppy-d_3)_2(mbfpypy-d_3)$), [2-(methyl-$d_3$)-8-[4-(1-methylethyl-1-d)-2-pyridinyl-κN]benzofuro2,[3-b]pyridin-7-yl-κC]bis[5-(methyl-$d_3$)-2-[5-(methyl-$d_3$)-2-pyridinyl-N]phenyl-κC]iridium(III) (abbreviation: $Ir(5mtpy-d_6)_2(mbfpypy-iPr-d_4)$), [2-$d_3$-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy-d_3)$), and [2-(4-methyl-5-phenyl-2-pyridinyl-κN)phenyl-κC]bis[2-(2-pyridinyl-κN)phenyl-κC]iridium(III) (abbreviation: $Ir(ppy)_2(mdppy)$); organometallic complexes such as bis(2,4-diphenyl-1,3-oxazolato-N,$C^{2'}$)iridium(III) acetylacetonate (abbreviation: $[Ir(dpo)_2(acac)]$), bis{2-[4'-(perfluorophenyl)phenyl]pyridinato-N,$C^{2'}$}iridium(III) acetylacetonate (abbreviation: $[Ir(p-PF-ph)_2(acac)]$), and bis(2-phenylbenzothiazolato-N,$C^{2'}$)iridium(III) acetylacetonate (abbreviation: $[Ir(bt)_2(acac)]$); and a rare earth metal complex such as tris(acetylacetonato) (monophenanthroline)terbium(III) (abbreviation: $[Tb(acac)_3(Phen)]$).

<<Phosphorescent Substance (from 570 nm to 750 nm, Yellow or Red)>>

As examples of a phosphorescent substance which emits yellow or red light and whose emission spectrum has a peak wavelength of greater than or equal to 570 nm and less than or equal to 750 nm, the following substances can be given.

Examples of a phosphorescent substance include organometallic complexes having a pyrimidine ring, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and (dipivaloylmethanato)bis[4,6-di(naphthalen-1-yl)pyrimidinato]iridium(III) (abbreviation: $[Ir(d1npm)_2(dpm)]$); organometallic complexes having a pyrazine ring, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium (III) (abbreviation: $[Ir(tppr)_2(dpm)]$), bis{4,6-dimethyl-2-[3-(3,5-dimethylphenyl)-5-phenyl-2-pyrazinyl-N]phenyl-κC}(2,6-dimethyl-3,5-heptanedionato-κ$^2$O,O')iridium(III) (abbreviation: $[Ir(dmdppr-P)_2(dibm)]$), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: $[Ir(dmdppr-dmCP)_2(dpm)]$), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-κ$^2$O,O')iridium (III) (abbreviation: $[Ir(dmdppr-dmp)_2(dpm)]$), (acetylacetonato)bis[2-methyl-3-phenylquinoxalinato-N,$C^{2'}$]iridium(III) (abbreviation: $[Ir(mpq)_2(acac)]$), (acetylacetonato)bis(2,3-diphenylquinoxalinato-N,$C^{2'}$)iridium(III) (abbreviation: $[Ir(dpq)_2(acac)]$), and (acetylacetonato)bis[2,3-bis(4-fluorophenyl)quinoxalinato]iridium(III) (abbreviation: $[Ir(Fdpq)_2(acac)]$); organometallic complexes having a pyridine ring, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), and bis[4,6-dimethyl-2-(2-quinolinyl-κN)phenyl-κC](2,4-pentanedionato-κ$^2$O,O')iridium(III) (abbreviation: $[Ir(dmpqn)_2(acac)]$); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$).

<<TADF Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently exhibits light (fluorescent light) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescent light by the TADF material refers to light emission having a spectrum similar to that of normal fluorescent light and an extremely long lifetime. The lifetime is longer than or equal to $1\times10^{-6}$ seconds, preferably longer than or equal to $1\times10^{-3}$ seconds.

Examples of the TADF material include fullerene, a derivative thereof, an acridine derivative such as proflavine, and eosin. Other examples thereof include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$ (Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$ (OEP)), an etioporphyrin-tin fluoride complex (abbreviation: $SnF_2$(Etio I)), and an octaethylporphyrin-platinum chloride complex (abbreviation: $PtCl_2OEP$).

[Chemical formula 3]

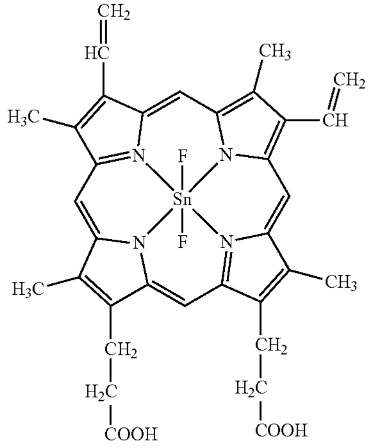

$SnF_2$(Proto IX)

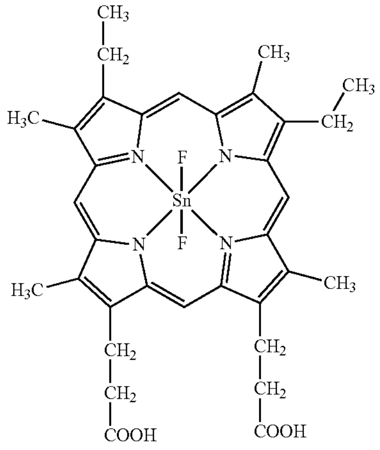

$SnF_2$(Meso IX)

-continued

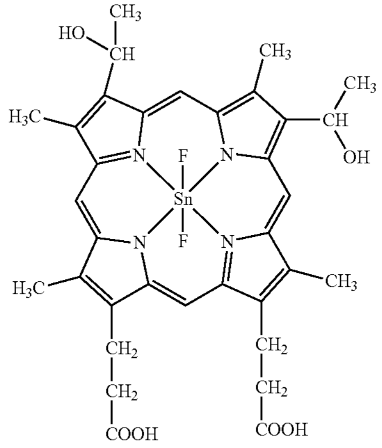

$SnF_2$(Hemato IX)

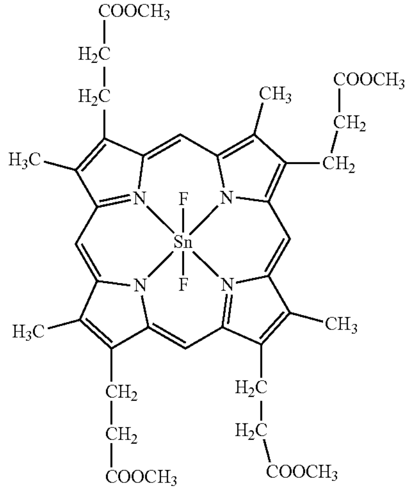

$SnF_2$(Copro III-4Me)

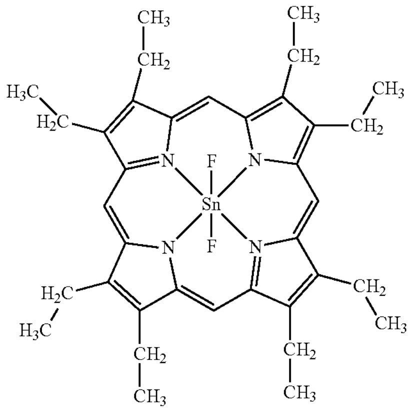

$SnF_2$(OEP)

-continued

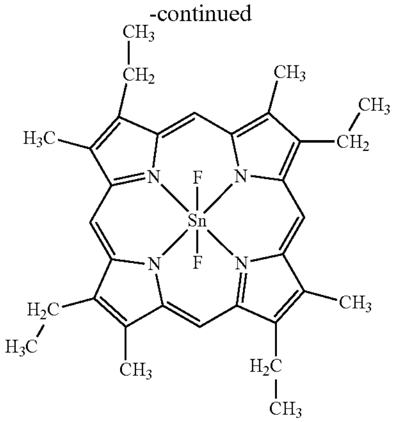

$SnF_2$(Etio I)

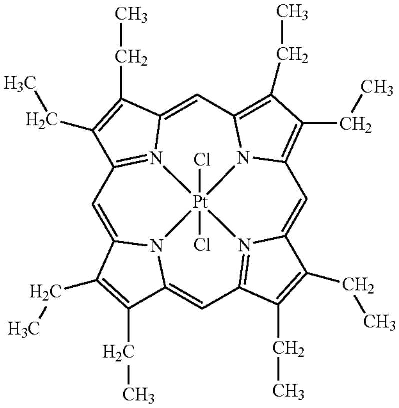

$PtCl_2OEP$

Additionally, a heteroaromatic compound having a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), the efficiency of a light-emitting element in a high-luminance region can be less likely to decrease.

[Chemical formula 4]

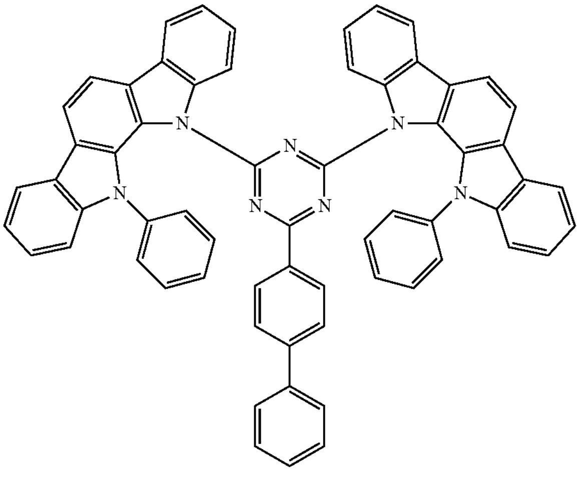

PIC-TRZ

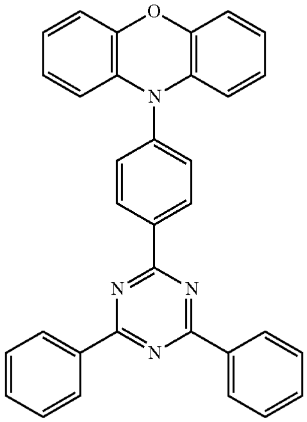

PXZ-TRZ

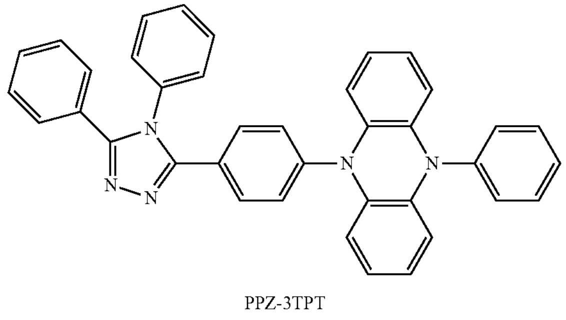

PPZ-3TPT

-continued

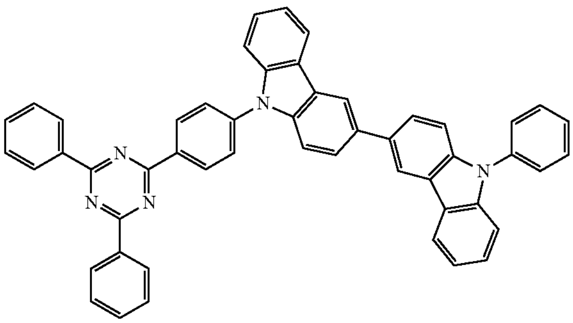

PCCzPTzn

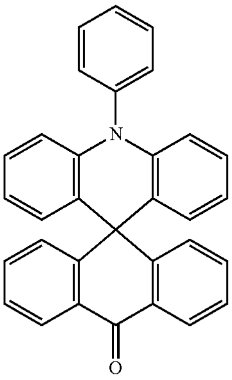

ACRSA

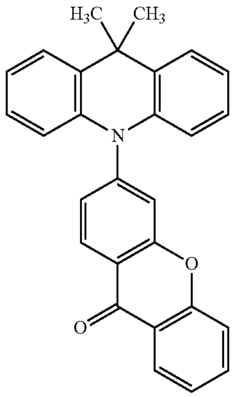

ACRXTN

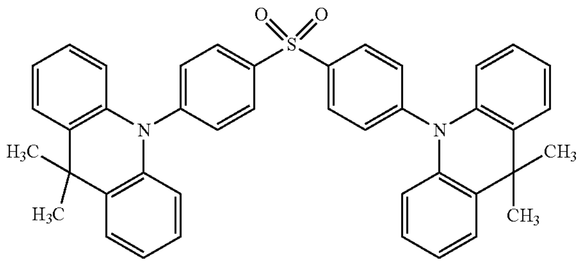

DMAC-DPS

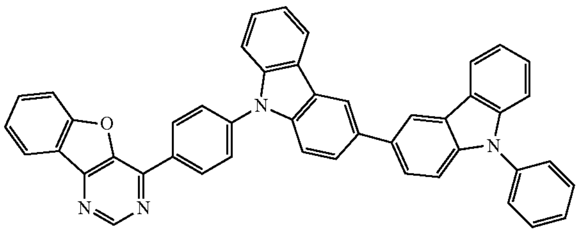

4PCCzPBfpm

-continued

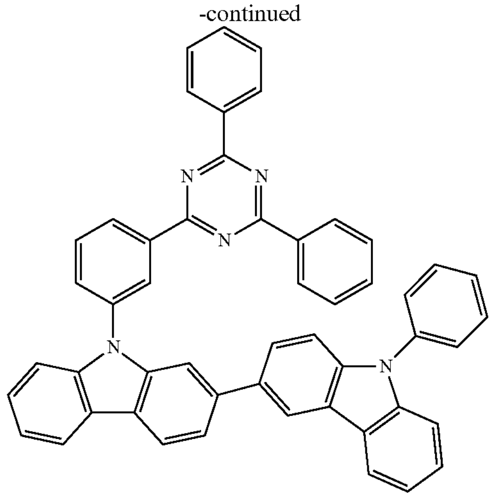

mPCCzPTzn-02

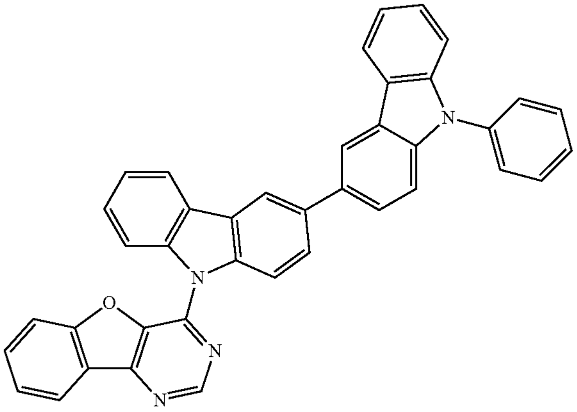

4PCCzBfpm

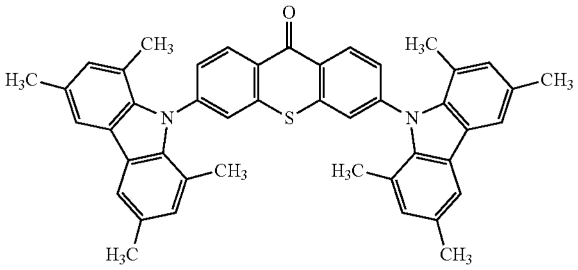

TADF100

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than that of the light-emitting substance (guest material) can be used.

<<Host Material for Fluorescent Light>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state or an organic compound having a high fluorescence quantum yield. Therefore, the hole-transport material (described above) and the electron-transport material (described below) shown in this embodiment, for example, can be used as long as they are organic compounds that satisfy such a condition.

In terms of a preferred combination with the light-emitting substance (fluorescent substance), examples of the organic compound (host material), some of which overlap the above specific examples, include fused polycyclic aromatic compounds such as an anthracene derivative, a tetracene derivative, a phenanthrene derivative, a pyrene derivative, a chrysene derivative, and a dibenzo[g,p] chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N"',N"'-octaphenyldibenzo[g,p] chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d] furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-QNPAnth), 9-(2-naphthyl)-10-[3-(2-naphthyl)phenyl]anthracene (abbreviation: βN-mQNPAnth), 1-[4-(10-[1,1'-biphenyl]-4-yl-9-anthracenyl) phenyl]-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescence>>

In the case where the light-emitting substance used in the light-emitting layers (113, 113*a*, 113*b*, and 113*c*) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferred, and it is particularly preferable to combine a compound that easily accepts holes (hole-transport material) and a compound that easily accepts electrons (electron-transport material).

From the viewpoint of a preferred combination with the light-emitting substance (phosphorescent substance), the examples of the organic compounds (the host material and the assist material), but some of them partly overlapping the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having an triazole ring), a benzimidazole derivative (an organic compound having an benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- or aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Such derivatives are preferable as the host material.

Other examples of preferred host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include: an organic compound including a heteroaromatic ring having a polyazole ring such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOS); an organic compound including a heteroaromatic ring having a pyridine ring such as bathophenanthroline (abbreviation: BPhen), bathocuproine (abbreviation: BCP), 2,9-di(2-naphthyl)-4,7-diphenyl-1,10-phenanthroline (abbreviation: NBphen), 2,2-(1,3-phenylene)di[9-phenyl-1,10-phenanthroline](abbreviation: mPPhen2P), or 2,2'-[biphenyl]-4,4'-diylbis[1,10-phenanthroline](abbreviation: Phen2BP); 2-[3-(dibenzothiophen-4-yl)phenyl]dibenzo[f,h]quinoxaline (abbreviation: 2mDBTPDBq-II); 2-[3'-(dibenzothiophen-4-yl)biphenyl-3-yl]dibenzo[f,h]quinoxaline (abbreviation: 2mDBTBPDBq-II); 2-[3'-(9H-carbazol-9-yl)biphenyl-3-yl]dibenzo[f,h]quinoxaline (abbreviation: 2mCzBPDBq); 2-[4-(3,6-diphenyl-9H-carbazol-9-yl)phenyl]dibenzo[f,h]quinoxaline (abbreviation: 2CzPDBq-III); 7-[3-(dibenzothiophen-4-yl)phenyl]dibenzo[f,h]quinoxaline (abbreviation: 7mDBTPDBq-II); 6-[3-(dibenzothiophen-4-yl)phenyl]dibenzo[f,h]quinoxaline (abbreviation: 6mDBTPDBq-II); 2-{4-[9,10-di(2-naphthyl)-2-anthryl]phenyl}-1-phenyl-1H-benzimidazole (abbreviation: ZADN); and 2-4'-(9-phenyl-9H-carbazol-3-yl)-3,1'-biphenyl-1-yl]dibenzo[f,h]quinoxaline (abbreviation: 2mpPCBPDBq). Such organic compounds are preferable as the host material.

Among the above organic compounds, specific examples of the pyridine derivative, the diazine derivative (e.g., the pyrimidine derivative, the pyrazine derivative, and the pyridazine derivative), the triazine derivative, the furodiazine derivative, which are organic compounds having a high electron-transport property, include organic compounds including a heteroaromatic ring having a diazine ring such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro [3,2-d]pyrimidine (abbreviation: 8BP-4mDBtPBfpm), 9-[3'-(dibenzothiophen-4-yl)biphenyl-3-yl]naphtho[1',2': 4,5]furo[2,3-b]pyrazine (abbreviation: 9mDBtBPNfpr), 9-[(3'-dibenzothiophen-4-yl)biphenyl-4-yl]naphtho[1',2': 4,5]furo[2,3-b]pyrazine (abbreviation: 9pmDBtBPNfpr), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1': 4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl)-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm), and those materials are preferable as the host material.

Among the above organic compounds, specific examples of metal complexes that are organic compounds having a high electron-transport property include zinc- or aluminum-based metal complexes, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Examples of organic compounds having bipolar properties, a high hole-transport property and a high electron-transport property, which can be used as the host material, include the organic compounds having a diazine ring such as 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2yl)phenyl]-7,7-dimethyl-5H,7H-indeno[2,1-b]carbazole (abbreviation: mINc(II)PTzn), 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn), and 7-[4-(9-phenyl-9H-carbazol-2-yl)quinazolin-2-yl]-7H-dibenzo[c,g]carbazole (abbreviation: PC-cgDBCzQz).

<Electron-Transport Layer>

The electron-transport layers (114, 114*a*, and 114*b*) transport the electrons, which are injected from the second electrode 102 or the charge-generation layers (106, 106*a*, and 106*b*) by electron-injection layers (115, 115*a*, and 115*b*) described later, to the light-emitting layers (113, 113*a*, and 113*b*). Note that the electron-transport layers (114, 114*a*, and 114*b*) are layers each containing an electron-transport material, and any of the mixed materials for a light-emitting device described in Embodiment 1 is preferably used as the electron-transport material. The electron-transport material used in the electron-transport layers (114, 114*a*, and 114*b*) is preferably a substance having an electron mobility of $1\times10^{-6}$ $cm^2/Vs$ or higher in the case where the square root of the electric field strength [V/cm] is 600. Note that any other substance can also be used as long as the substance have an electron-transport property higher than a hole-transport property. The electron-transport layers (114, 114*a*, and 114*b*) can function even with a single-layer structure and may have a stacked-layer structure including two or more layers. When a photolithography process is performed over the electron-transport layer including the above-described mixed material, which has heat resistance, an adverse effect of the thermal process on the device characteristics can be reduced.

<<Electron-Transport Material>>

As the electron-transport material that can be used for the electron-transport layers (114, 114*a*, and 114*b*), an organic compound having a high electron-transport property can be used, and for example, a heteroaromatic compound can be used. The term heteroaromatic compound refers to a cyclic compound including at least two different kinds of elements in a ring. Examples of cyclic structures include a three-membered ring, a four-membered ring, a five-membered ring, a six-membered ring, and the like, among which a five-membered ring and a six-membered ring are particularly preferred. The elements included in the heteroaromatic compound are preferably one or more of nitrogen, oxygen, and sulfur, in addition to carbon. In particular, a heteroaromatic compound containing nitrogen (a nitrogen-containing heteroaromatic compound) is preferred, and any of materials having a high electron-transport property (electron-transport materials), such as a nitrogen-containing heteroaromatic compound and a π-electron deficient heteroaromatic compound including the nitrogen-containing heteroaromatic compound, is preferably used.

The heteroaromatic compound is an organic compound including at least one heteroaromatic ring.

The heteroaromatic ring includes any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound including carbon and one or more of nitrogen, oxygen, and sulfur, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, a heteroaromatic compound having a benzimidazole ring, and the like.

Examples of the heteroaromatic compound having a six-membered ring structure, which is a heteroaromatic compound including carbon and one or more of nitrogen, oxygen, and sulfur, include a heteroaromatic compound having a heteroaromatic ring, such as a pyridine ring, a diazine ring (a pyrimidine ring, a pyrazine ring, a pyridazine ring, or the like), a triazine ring, or a polyazole ring. Other examples include a heteroaromatic compound having a bipyridine structure, a heteroaromatic compound having a terpyridine structure, and the like, which are included in examples of a heteroaromatic compound in which pyridine rings are connected.

Examples of the heteroaromatic compound having a fused ring structure including the above six-membered ring structure in a part include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a ring in which an aromatic ring is fused to a furan ring of a furodiazine ring), or a benzimidazole ring.

Specific examples of the above-described heteroaromatic compound having a five-membered ring structure (a polyazole ring (including an imidazole ring, a triazole ring, or an oxadiazole ring), an oxazole ring, a thiazole ring, or a benzimidazole ring) include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOS).

Specific examples of the above-described heteroaromatic compound having a six-membered ring structure (including a heteroaromatic ring having a pyridine ring, a diazine ring, a triazine ring, or the like) include: a heteroaromatic compound including a heteroaromatic ring having a pyridine ring, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); a heteroaromatic compound including a heteroaromatic ring having a triazine ring, such as 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1': 4',1"-terphenyl]-4-yl-1-dibenzofuranyl)-1,3,5-triazine (abbreviation: mBP-TPDBfTzn), 2-{3-[3-(dibenzothiophen-4-yl)phenyl]phenyl}-4,6-diphenyl-1,3,5-triazine (abbreviation: mDBtBPTzn), or mFBPTzn; and a heteroaromatic compound including a heteroaromatic ring having a diazine (pyrimidine) ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 4,6mCzBP2Pm, 6-(1,1'-biphenyl-3-yl)-4-[3,5-bis(9H-carbazol-9-yl)phenyl)-2-phenylpyrimidine (abbreviation: 6mBP-4Cz2PPm), 4-[3,5-bis(9H-carbazol-9-yl)phenyl]-2-phenyl-6-(1,1'-biphenyl-4-yl)pyrimidine (abbreviation: 6BP-4Cz2PPm), 4-[3-(dibenzothiophen-4-yl)phenyl]-8-(naphthalen-2-yl)-[1]benzofuro[3,2-d]pyrimidine (abbreviation: 8βN-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2': 4,5]furo[3,2-d]pyrimidine (abbreviation: 8mDBtBPNfpm), or 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm). Note that the above aromatic compounds including a heteroaromatic ring include a heteroaromatic compound having a fused heteroaromatic ring.

Other examples include heteroaromatic compounds including a heteroaromatic ring having a diazine (pyrimidine) ring, such as 2,2'-(pyridine-2,6-diyl)bis(4-phenylbenzo[h]quinazoline) (abbreviation: 2,6(P-Bqn)2Py), 2,2'-(2,2'-bipyridine-6,6'-diyl)bis(4-phenylbenzo[h]quinazoline) (abbreviation: 6,6'(P-Bqn)2BPy), 2,2'-(pyridine-2,6-diyl)bis{4-[4-(2-naphthyl)phenyl]-6-phenylpyrimidine} (abbreviation: 2,6(NP-PPm)2Py), or 6-(1,1'-biphenyl-3-yl)-4-[3,5-bis(9H-carbazol-9-yl)phenyl]-2-phenylpyrimidine (abbreviation: 6mBP-4Cz2PPm) and a heteroaromatic compound including a heteroaromatic ring having a triazine ring, such as 2,4,6-tris(3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridinyl)-5-(9-phenanthrenyl)phenyl]-4,6-diphenyl-1,3,5-triazine (abbreviation: mPn-mDMePyPTzn).

Specific examples of the above-described heteroaromatic compound having a fused ring structure including the above six-membered ring structure in a part (a heteroaromatic compound having a fused ring structure) include a heteroaromatic compound having a quinoxaline ring, such as bathophenanthroline (abbreviation: BPhen), bathocuproine (abbreviation: BCP), 2,9-di(2-naphthyl)-4,7-diphenyl-1,10-phenanthroline (abbreviation: NBPhen), 2,2-(1,3-phenylene)bis[9-phenyl-1,10-phenanthroline] (abbreviation: mPPhen2P), 2,2'-(pyridin-2,6-diyl)bis(4-phenylbenzo[h]quinazoline) (abbreviation: 2,6(P-Bqn)2Py), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layers (114, 114_a_, and 114_b_), any of the metal complexes given below can be used as well as the heteroaromatic compounds described above. Examples of the metal complexes include a metal complex having a quinoline ring or a benzoquinoline ring, such as tris(8-quinolinolato)aluminum(III) (abbreviation: $Alq_3$), $Almq_3$, 8-quinolinolatolithium(I) (abbreviation: Liq), $BeBq_2$, bis(2-methyl-8-quinolinolato)(4-phenylphenolato)aluminum(III) (abbreviation: BAlq), or bis(8-quinolinolato)zinc(II) (abbreviation: Znq), and a metal complex having an oxazole ring or a thiazole ring, such as bis[2-(2-benzoxazolyl)phenolato]zinc(II) (abbreviation: ZnPBO), or bis[2-(2-benzothiazolyl)phenolato]zinc(II) (abbreviation: ZnBTZ).

High-molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can be used as the electron-transport material.

Each of the electron-transport layers (114, 114_a_, and 114_b_) is not limited to a single layer and may be a stack of two or more layers each containing any of the above substances.

<Electron-Injection Layer>

The electron-injection layers (115, 115_a_, and 115_b_) contain a substance having a high electron-injection property. The electron-injection layers (115, 115_a_, and 115_b_) are layers for increasing the efficiency of electron injection from the second electrode 102 and are preferably formed using a material whose value of the LUMO level has a small difference (0.5 eV or less) from the work function of a material used for the second electrode 102. Thus, the electron-injection layers (115, 115_a_, and 115_b_) can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), or cesium carbonate. A rare earth metal such as ytterbium (Yb) and a compound of a rare earth metal such as erbium fluoride ($ErF_3$) can also be used. For the electron-injection layers (115, 115_a_, and 115_b_), a plurality of kinds of materials given above may be mixed or stacked as films. Electride may also be used for the electron-injection layers (115, 115_a_, and 115_b_). Examples of the electride include a substance in which electrons are added at high concentration to calcium oxide-aluminum oxide. Any of the substances used for the electron-transport layers (114, 114_a_, and 114_b_), which are given above, can also be used.

A mixed material in which an organic compound and an electron donor (donor) are mixed may also be used for the electron-injection layers (115, 115_a_, and 115_b_). Such a mixed material is excellent in an electron-injection property and an electron-transport property because electrons are generated in the organic compound by the electron donor. The organic compound here is preferably a material excellent in transporting the generated electrons; specifically, for example, the above-described electron-transport materials used for the electron-transport layers (114, 114_a_, and 114_b_), such as a metal complex and a heteroaromatic compound, can be used. As the electron donor, a substance showing an electron-donating property with respect to an organic compound is preferably used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used. Alternatively, a stack of two or more of these materials may be used.

A mixed material in which an organic compound and a metal are mixed may also be used for the electron-injection layers (115, 115_a_, and 115_b_). The organic compound used here preferably has a lowest unoccupied molecular orbital (LUMO) level of −3.6 eV or higher and −2.3 eV or lower. Moreover, a material having an unshared electron pair is preferable.

Thus, as the organic compound used in the above mixed material, any of the mixed materials obtained by mixing a metal and the heteroaromatic compound exemplified above as the material that can be used for the electron-transport layer may be used. Preferred examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure including a six-membered ring structure in a part (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal that belongs to Group 5, Group 7, Group 9, or Group 11 or a material that belongs to Group 13 in the periodic table is preferably used, and examples thereof include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength k of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 1D, a structure in which a plurality of EL layers are stacked between the pair of electrodes (the structure is also referred to as a tandem structure) can be obtained.

<Charge-Generation Layer>

The charge-generation layer 106 has a function of injecting electrons into the EL layer 103*a* and injecting holes into the EL layer 103*b* when voltage is applied between the first electrode (anode) 101 and the second electrode (cathode) 102. The charge-generation layer 106 may have either a structure in which an electron acceptor (acceptor) is added to a hole-transport material or a structure in which an electron donor (donor) is added to an electron-transport material. Alternatively, both of these layers may be stacked. Note that forming the charge-generation layer 106 with the use of any of the above materials can inhibit an increase in driving voltage caused by the stack of the EL layers.

In the case where the charge-generation layer 106 has a structure in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

In the case where the charge-generation layer 106 has a structure in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 1D illustrates the structure in which two EL layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide resin, polyimide resin, aramid resin, epoxy resin, an inorganic vapor deposition film, and paper.

For fabrication of the light-emitting device in this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

The structures described in this embodiment can be used in combination with any of the structures described in the other embodiments as appropriate.

Embodiment 3

In this embodiment, specific structure examples and manufacturing methods of a light-emitting apparatus (also referred to as a display panel) of one embodiment of the present invention will be described.

Structure Example 1 of Light-Emitting Apparatus 700

Figure 2A:
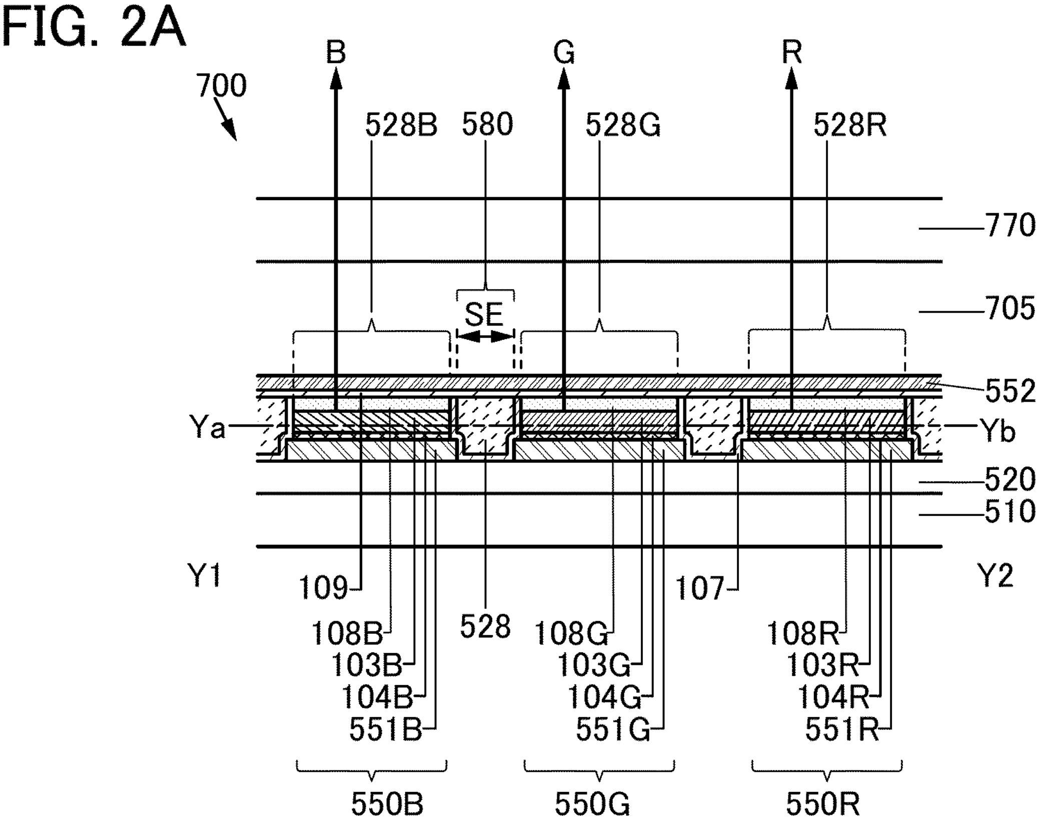
FIGS. 2A to 2C illustrate a light-emitting apparatus according to an embodiment.

A light-emitting apparatus 700 illustrated in FIG. 2A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, and the like that are composed of a plurality of transistors, and wirings for electrical connections between components. Note that these driver circuits are electrically connected to the light-emitting device 550B, the light-emitting device 550G, and the light-emitting device 550R, for example, to drive them. The light-emitting apparatus 700 includes an insulating layer 705 over the functional layer 520 and the light-emitting devices, and the insulating layer 705 has a function of attaching a second substrate 770 and the functional layer 520. The driver circuit GD and the driver circuit SD will be described in Embodiment 4.

The light-emitting device 550B, the light-emitting device 550G, and the light-emitting device 550R each have any of the device structures described in Embodiment 2. Specifically, the case is described in which the EL layer 103 in the structure illustrated in FIG. 1A differs between the light-emitting devices.

In this specification and the like, a structure in which light-emitting layers in light-emitting devices of different colors (for example, blue (B), green (G), and red (R)) are separately formed or separately patterned may be referred to as a side-by-side (SBS) structure.

As illustrated in FIG. 2A, the light-emitting device 550B includes an electrode 551B, the electrode 552, and the EL layer 103B. Note that a specific structure of each layer is as described in Embodiment 2. The EL layer 103B has a stacked-layer structure of layers having different functions including a light-emitting layer. Although in FIG. 2A, only a hole-injection/transport layer 104B, an electron-transport layer 108B, and the electron-injection layer 109 are illustrated as layers of the EL layer 103B including the light-emitting layer, the present invention is not limited to the illustration. Note that the hole-injection/transport layer 104B represents the layer having the functions of the hole-injection layer and the hole-transport layer described in Embodiment 2 and may have a stacked-layer structure. Note that in this specification, a hole-injection/transport layer in any light-emitting device can be interpreted in the above manner.

For the electron-transport layer 108B, any of the mixed materials for a light-emitting device described in Embodiment 1 is preferably used. Any of the mixed materials for a light-emitting device described in Embodiment 1 includes a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring. The electron-transport layer 108B can have a function of blocking holes moving from the anode side to the cathode side through the light-emitting layer. The electron-injection layer 109 may have a stacked-layer structure in which some or all of layers are formed using different materials.

As illustrated in FIG. 2A, an insulating layer 107 may be formed on side surfaces (or end portions) of the hole-injection/transport layer 104B, the light-emitting layer, and the electron-transport layer 108B, which are included in the EL layer 103B including the light-emitting layer. The insulating layer 107 is formed in contact with side surfaces (or end portions) of the EL layer 103B. Accordingly, entry of oxygen, moisture, or a substance containing constituent elements of oxygen or moisture through the side surface of the EL layer 103B into the inside of the EL layer 103B can be inhibited. For the insulating layer 107, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103B (including the light-emitting layer, the hole-injection/transport layer 104B, and the electron-transport layer 108B) and the insulating layer 107. The electron-injection layer 109 may have a stacked-layer structure of two or more layers having different electric resistances.

The electrode 552 is formed over the electron-injection layer 109. Note that the electrode 551B and the electrode 552 have an overlap region. The EL layer 103B is positioned between the electrode 551B and the electrode 552.

The EL layer 103B illustrated in FIG. 2A has a structure similar to that of the EL layer 103 described in Embodiment 2. The EL layer 103B is capable of emitting blue light, for example.

As illustrated in FIG. 2A, the light-emitting device 550G includes an electrode 551G, the electrode 552, and an EL layer 103G. Note that a specific structure of each layer is as described in Embodiment 2. The EL layer 103G has a stacked-layer structure of layers having different functions including a light-emitting layer. Although in FIG. 2A, only a hole-injection/transport layer 104G, an electron-transport layer 108G, and the electron-injection layer 109 are illustrated as layers of the EL layer 103G including the light-emitting layer, the present invention is not limited to the illustration. Note that the hole-injection/transport layer 104G represents the layer having the functions of the hole-injection layer and the hole-transport layer described in Embodiment 2 and may have a stacked-layer structure.

For the electron-transport layer 108G, any of the mixed materials for a light-emitting device described in Embodiment 1 is preferably used. Any of the mixed materials for a light-emitting device described in Embodiment 1 includes a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring. The electron-transport layer 108G can have a function of blocking holes moving from the anode side to the cathode side through the light-emitting layer. The electron-injection layer 109 may have a stacked-layer structure in which some or all of layers are formed using different materials.

As illustrated in FIG. 2A, the insulating layer 107 may be formed on side surfaces (or end portions) of the hole-injection/transport layer 104G, the light-emitting layer, and the electron-transport layer 108G, which are included in the EL layer 103G including the light-emitting layer. The insulating layer 107 is formed in contact with side surfaces (or end portions) of the EL layer 103G. Accordingly, entry of oxygen, moisture, or constituent elements thereof through the side surface of the EL layer 103G into the inside of the EL layer 103G can be inhibited. For the insulating layer 107, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103G (the light-emitting layer, the hole-injection/transport layer 104G, and the electron-transport layer 108G) and the insulating layer 107. The electron-injection layer 109 may have a stacked-layer structure of two or more layers having different electric resistances.

The electrode 552 is formed over the electron-injection layer 109. Note that the electrode 551G and the electrode 552 have an overlap region. The EL layer 103G is positioned between the electrode 551G and the electrode 552.

The EL layer 103G illustrated in FIG. 2A has a structure similar to that of the EL layer 103 described in Embodiment 2. The EL layer 103G is capable of emitting green light, for example.

As illustrated in FIG. 2A, the light-emitting device 550R includes an electrode 551R, the electrode 552, and an EL layer 103R. Note that a specific structure of each layer is as described in Embodiment 2. The EL layer 103R has a stacked-layer structure of layers having different functions including a light-emitting layer. Although in FIG. 2A, only a hole-injection/transport layer 104R, an electron-transport layer 108R, and the electron-injection layer 109 are illustrated as layers of the EL layer 103R including the light-emitting layer, the present invention is not limited to the illustration. Note that the hole-injection/transport layer 104R represents the layer having the functions of the hole-injection layer and the hole-transport layer described in Embodiment 2 and may have a stacked-layer structure.

For the electron-transport layer 108R, any of the mixed materials described in Embodiment 1 is preferably used. Any of the mixed materials for a light-emitting device described in Embodiment 1 includes a first heteroaromatic compound and a second heteroaromatic compound. The first heteroaromatic compound includes a first heteroaromatic ring. The first heteroaromatic ring includes a ring including two or more nitrogen atoms and any one of a benzene ring and a pyridine ring or a ring including a diazine ring or a triazine ring. The second heteroaromatic compound includes a second heteroaromatic ring. The second heteroaromatic ring includes a ring including two or more nitrogen atoms and any one of a benzene ring and a pyridine ring or a ring including a diazine ring or a triazine ring. A structure of the first heteroaromatic ring is different from a structure of the second heteroaromatic ring. The electron-transport layer 108R can have a function of blocking holes moving from the anode side to the cathode side through the light-emitting layer. The electron-injection layer 109 may have a stacked-layer structure in which some or all of layers are formed using different materials.

As illustrated in FIG. 2A, the insulating layer 107 may be formed on side surfaces (or end portions) of the hole-injection/transport layer 104R, the light-emitting layer, and the electron-transport layer 108R, which are included in the EL layer 103R including the light-emitting layer. The insulating layer 107 is formed in contact with side surfaces (or end portions) of the EL layer 103R. Accordingly, entry of oxygen, moisture, or constituent elements thereof through the side surface of the EL layer 103R into the inside of the EL layer 103R can be inhibited. For the insulating layer 107, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103R (the light-emitting layer, the hole-injection/transport layer 104R, and the electron-transport layer 108R) and the insulating layer 107. The electron-injection layer 109 may have a stacked-layer structure of two or more layers having different electric resistances.

The electrode 552 is formed over the electron-injection layer 109. Note that the electrode 551R and the electrode 552 have an overlap region. The EL layer 103R is positioned between the electrode 551R and the electrode 552.

The EL layer 103R illustrated in FIG. 2A has a structure similar to that of the EL layer 103 described in Embodiment 2. The EL layer 103R is capable of emitting red light, for example.

The partition 528 is provided between the EL layer 103B, the EL layer 103G, and the EL layer 103R. As illustrated in FIG. 2A, the side surfaces (or end portions) of each of the EL layers (103B, 103G, and 103R) of the light-emitting devices are in contact with the partition 528 with the insulating layer 107 therebetween.

In each of the EL layers, especially the hole-injection layer, which is included in the hole-transport region placed between the anode and the light-emitting layer, often has high conductivity; thus, a hole-injection layer formed as a layer shared by adjacent light-emitting devices might cause crosstalk. Thus, providing the partition 528 made of an insulating material between the EL layers as shown in this structure example can suppress occurrence of crosstalk between adjacent light-emitting devices.

In the manufacturing method described in this embodiment, a side surface (or an end portion) of the EL layer is exposed in the patterning step. This may promote deterioration of the EL layer by allowing the entry of oxygen, water, or the like through the side surface (or the end portion). Hence, providing the partition 528 can inhibit the deterioration of the EL layer in the manufacturing process.

Furthermore, a projecting portion generated between adjacent light-emitting devices can be flattened by provision of the partition 528. When the projecting portion is flattened, disconnection of the electrode 552 formed over the EL layers can be inhibited. Examples of an insulating material used to form the partition 528 include organic materials such as an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Other examples include organic materials such as polyvinyl alcohol (PVA), polyvinyl butyral, polyvinyl pyrrolidone, polyethylene glycol, polyglycerin, pullulan, water-soluble cellulose, and alcohol-soluble polyamide resin. A photosensitive resin such as a photoresist can also be used. Examples of the photosensitive resin include positive-type materials and negative-type materials.

For example, the difference between the level of the top surface of the partition 528 and the level of the top surface of any of the EL layer 103B, the EL layer 103G, and the EL layer 103R is 0.5 times or less, and further 0.3 times or less the thickness of the partition 528. An insulating layer may be provided such that the level of the top surface of any of the EL layer 103B, the EL layer 103G, and the EL layer 103R is higher than the level of the top surface of the partition 528, for example. The partition 528 may be provided such that the level of the top surface of the partition 528 is higher than the level of the top surface of the light-emitting layer in any of the EL layer 103B, the EL layer 103G, and the EL layer 103R, for example.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the partition 528 in a high-resolution display panel with more than 1000 ppi, preferably more than 2000 ppi, or further preferably in an ultrahigh-resolution display panel with more than 5000 ppi allows the display panel to express vivid colors.

Figure 2B:
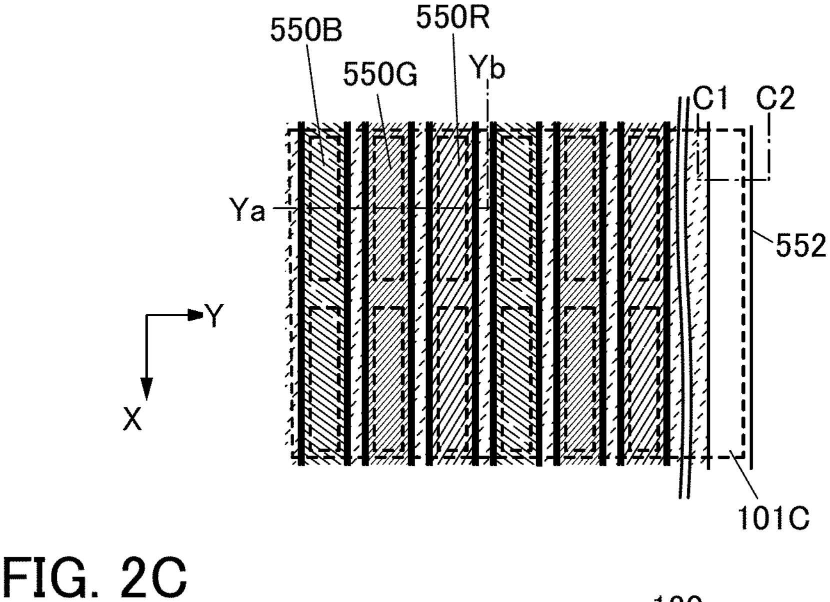

FIG. 2B is a schematic top view of the light-emitting apparatus 700 taken along the dash-dot line Ya-Yb in the cross-sectional view of FIG. 2A. Specifically, the light-emitting devices 550B, the light-emitting devices 550G, and the light-emitting devices 550R are arranged in a matrix. Note that FIG. 2B illustrates what is called a stripe arrangement, in which the light-emitting devices of the same color are arranged in the X-direction. In the Y direction perpendicular to the X direction, light-emitting devices of different colors are arranged. Note that the arrangement method of the light-emitting devices is not limited thereto; another method such as a delta, zigzag, PenTile, or diamond arrangement may also be used.

The EL layers (103B, 103G, and 103R) are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane). In this case, the width (SE) of a space 580 between the EL layers is preferably 5 μm or less, further preferably 1 μm or less.

In the EL layer, especially the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can suppress occurrence of crosstalk between adjacent light-emitting devices.

Figure 2C:
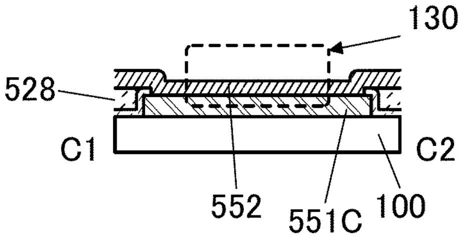

FIG. 2C is a schematic cross-sectional view taken along the dash-dot line C1-C2 in FIG. 2B. FIG. 2C illustrates a connection portion 130 where a connection electrode 551C and an electrode 552 are electrically connected to each other. In the connection portion 130, the electrode 552 is provided over and in contact with the connection electrode 551C. The partition 528 is provided so as to cover an end portion of the connection electrode 551C.

Example 1 of Method of Manufacturing Light-Emitting Apparatus

Figure 3A:
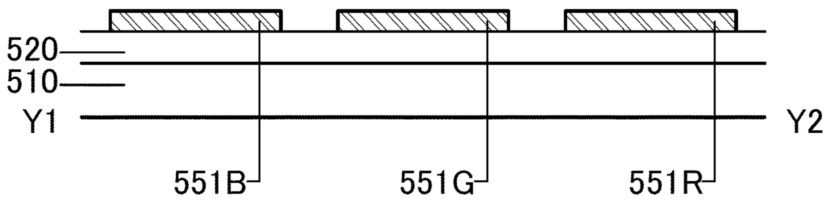
FIGS. 3A to 3C illustrate a method of manufacturing the light-emitting apparatus according to the embodiment.

The electrode 551B, the electrode 551G, and the electrode 551R are formed as illustrated in FIG. 3A. For example, a conductive film is formed over the functional layer 520 over the first substrate 510 and processed into predetermined shapes by a photolithography method.

The conductive film can be formed by any of a sputtering method, a chemical vapor deposition (CVD) method, a molecular beam epitaxy (MBE) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

The conductive film may be processed into a thin film by a nanoimprinting method, a sandblasting method, a lift-off method, or the like as well as a photolithography method described above. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for the formation of an EL layer (a film made of an organic compound or a film partly including an organic compound).

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of a thin film using a resist mask, a dry etching method, a wet etching method, a sandblast method, or the like can be used.

Figure 3B:
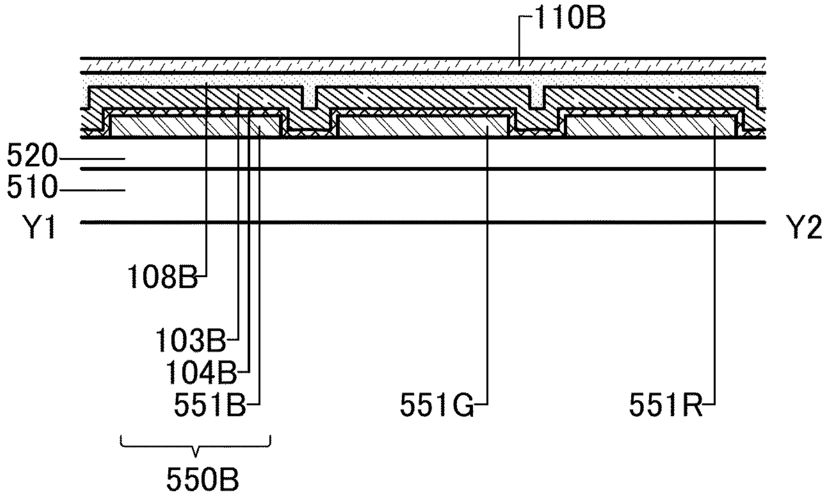

Then, as illustrated in FIG. 3B, the EL layer 103B is formed over the electrode 551B, the electrode 551G, and the electrode 551R. Note that in the EL layer 103B in FIG. 3B, the hole-injection/transport layer 104B, the light-emitting layer, and the electron-transport layer 108B are formed. For example, the EL layer 103B is formed by a vacuum evaporation method over the electrode 551B, the electrode 551G, and the electrode 551R so as to cover them. Furthermore, a sacrifice layer 110B is formed over the EL layer 103B.

For the sacrifice layer 110B, a film highly resistant to etching treatment performed on the EL layer 103B, i.e., a film having high etching selectivity with respect to the EL layer 103B, can be used. The sacrifice layer 110B preferably has a stacked-layer structure of a first sacrifice layer and a second sacrifice layer which have different etching selectivities to the EL layer 103B. For the sacrifice layer 110B, it is possible to use a film that can be removed by a wet etching method, which causes less damage to the EL layer 103B. In wet etching, oxalic acid or the like can be used as an etching material.

For the sacrifice layer 110B, an inorganic film such as a metal film, an alloy film, a metal oxide film, a semiconductor film, or an inorganic insulating film can be used, for example. The sacrifice layer 110B can be formed by any of a variety of film formation methods such as a sputtering method, an evaporation method, a CVD method, and an ALD method.

For the sacrifice layer 110B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is preferable to use a low-melting-point material such as aluminum or silver, in particular.

A metal oxide such as indium gallium zinc oxide (also referred to as In—Ga—Zn oxide or IGZO) can be used for the sacrifice layer 110B. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be used instead of gallium. In particular, M is preferably one or more of gallium, aluminum, and yttrium.

For the sacrifice layer 110B, an inorganic insulating material such as aluminum oxide, hafnium oxide, or silicon oxide can be used.

The sacrifice layer 110B is preferably formed using a material that can be dissolved in a solvent chemically stable with respect to at least the uppermost film (the electron-transport layer 108B) of the EL layer 103B. Specifically, a material that will be dissolved in water or alcohol can be suitably used for the sacrifice layer 110B. In formation of the sacrifice layer 110B, it is preferable that a solution in which such a material is dissolved in a solvent such as water or alcohol be applied by a wet process and followed by heat treatment for evaporating the solvent. At this time, the heat treatment is preferably performed under a reduced-pressure atmosphere, in which case the solvent can be removed at a low temperature in a short time and thermal damage to the EL layer 103B can be accordingly minimized.

In the case where the sacrifice layer 110B having a stacked-layer structure is formed, the stacked-layer structure can include the first sacrifice layer formed using any of the above-described materials and the second sacrifice layer thereover.

The second sacrifice layer in that case is a film used as a hard mask for etching of the first sacrifice layer. In processing the second sacrifice layer, the first sacrifice layer is exposed. Thus, a combination of films having greatly different etching rates is selected for the first sacrifice layer and the second sacrifice layer. Thus, a film that can be used for the second sacrifice layer can be selected in accordance with the etching conditions of the first sacrifice layer and those of the second sacrifice layer.

For example, in the case where the second sacrifice layer is etched by dry etching with use of a fluorine-containing gas (also referred to as fluorine-based gas), the second sacrifice layer can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (that is, enabling low etching rate) in dry etching using the fluorine-based gas, and such a film can be used as the first sacrifice layer.

Note that the material for the second sacrifice layer is not limited to the above and can be selected from a variety of materials in view of the etching conditions of the first sacrifice layer and those of the second sacrifice layer. For example, any of the films that can be used for the first sacrifice layer can be used for the second sacrifice layer.

For the second sacrifice layer, for example, a nitride film can be used. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used for the second sacrifice layer. Typically, it is possible to use a film of an oxide or an oxynitride such as silicon oxide, silicon oxynitride, aluminum oxide, aluminum oxynitride, hafnium oxide, or hafnium oxynitride.

Figure 3C:
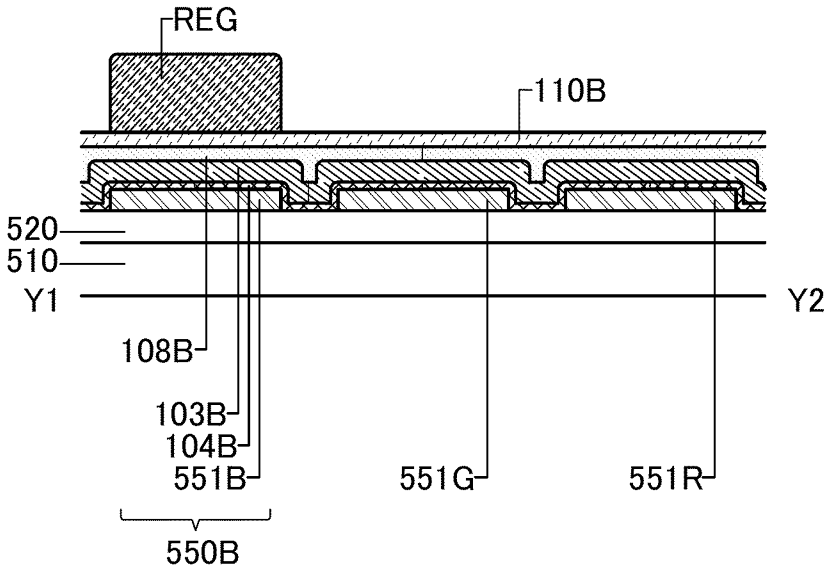

Next, as illustrated in FIG. 3C, a resist is applied onto the sacrifice layer 110B, and the resist having a desired shape (a resist mask REG) is formed by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures. In the light-emitting device of one embodiment of the present invention, the layer with high heat resistance including any of the mixed materials for a light-emitting device described in Embodiment 1, in specific terms, is used and subjected to the photolithography step. This enables a light-emitting apparatus including the highly reliable light-emitting device which is less affected by the heat treatment.

Figure 4A:
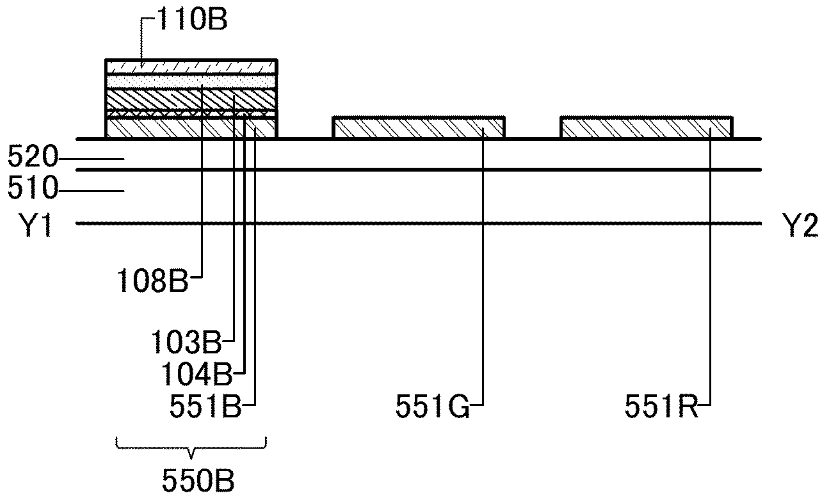
FIGS. 4A to 4C illustrate a method of manufacturing the light-emitting apparatus according to the embodiment.

Next, with the use of the obtained resist mask REG, part of the sacrifice layer 110B not covered with the resist mask REG is removed by etching; the resist mask REG is removed; and part of the EL layer 103B not covered with the sacrifice layer 110B is then removed by etching, i.e., the EL layer 103B over the electrode 551G and the EL layer 103B over the electrode 551R are removed by etching, so that the EL layer 103B is processed to have side surfaces (or have their side surfaces exposed) or have a belt-like shape that extends in the direction perpendicular to the plane of the paper sheet. Specifically, dry etching is performed using the sacrifice layer 110B formed in a pattern over the EL layer 103B overlapping the electrode 551B. Note that in the case where the sacrifice layer 110B has the aforementioned stacked-layer structure of the first sacrifice layer and the second sacrifice layer, the EL layer 103B may be processed into a predetermined shape in the following manner: part of the second sacrifice layer is etched with the use of the resist mask REG, the resist mask REG is then removed, and part of the first sacrifice layer is etched with the use of the second sacrifice layer as a mask. The structure illustrated in FIG. 4A is obtained through these etching steps.

Figure 4B:
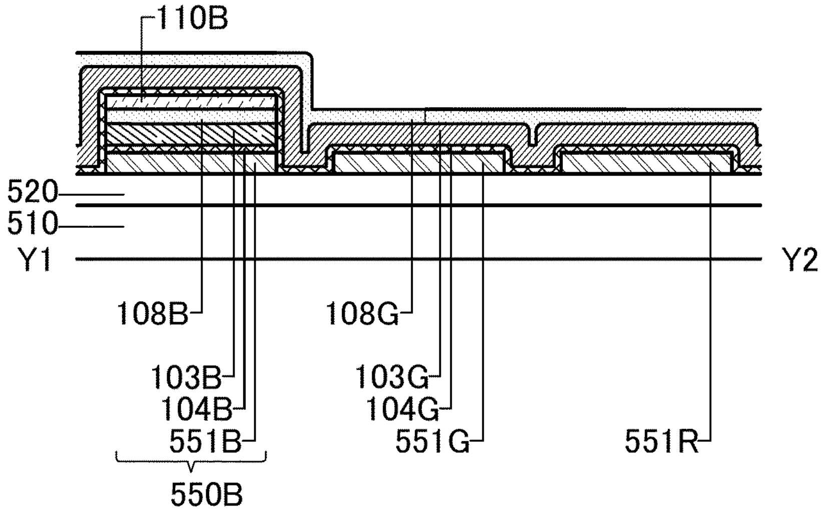

Then, as illustrated in FIG. 4B, the EL layer 103G is formed over the sacrifice layer 110B, the electrode 551G, and the electrode 551R. Note that in the EL layer 103G in FIG. 4B, the hole-injection/transport layer 104G, the light-emitting layer, and the electron-transport layer 108G are formed. For example, the EL layer 103G is formed by a vacuum evaporation method over the sacrifice layer 110B, the electrode 551G, and the electrode 551R so as to cover them.

Figure 4C:
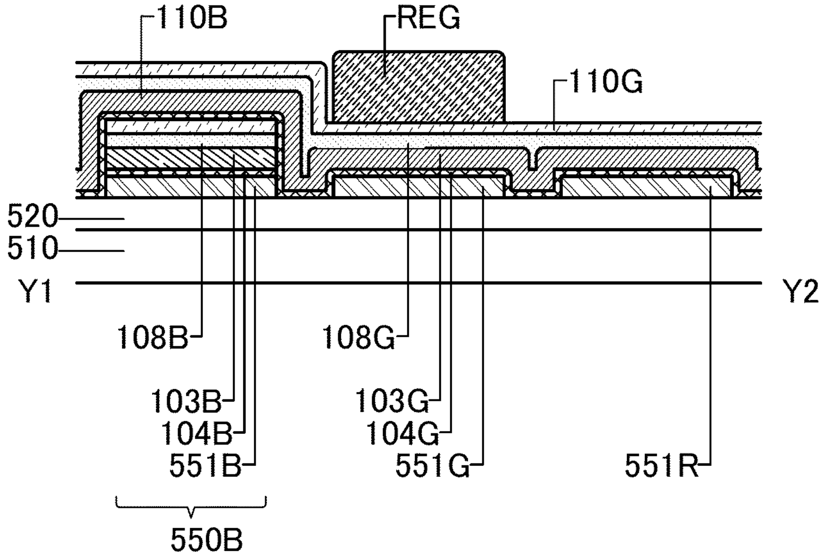
Figure 5A:
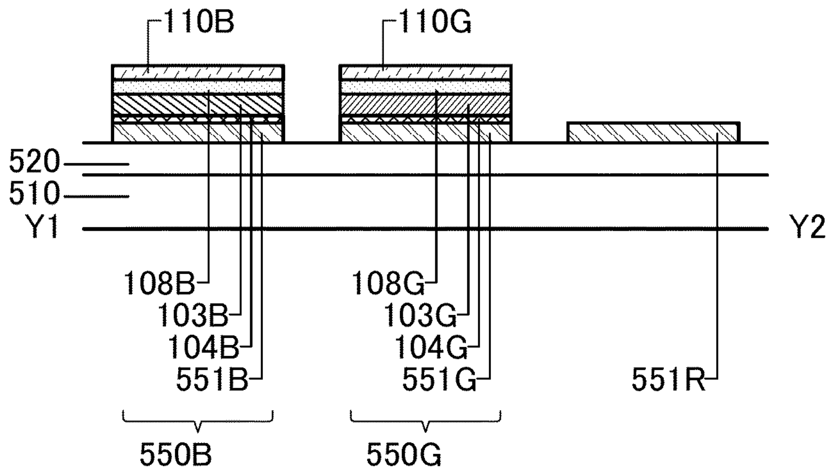
FIGS. 5A to 5C illustrate a method of manufacturing the light-emitting apparatus according to the embodiment.

Then, as illustrated in FIG. 4C, a sacrifice layer 110G is formed over the EL layer 103G, and a resist is applied onto the sacrifice layer 110G, the resist having a desired shape (resist mask REG) is formed by a photolithography method. Part of the sacrifice layer 110G not covered with the resist mask is removed by etching, the resist mask is removed, and part of the EL layer 103G not covered with the sacrifice layer 110G is then removed by etching. Thus, the EL layer 103G over the electrode 551B and the EL layer 103G over the electrode 551R are removed by etching, so that the EL layer 103G is processed to have side surfaces (or have their side surfaces exposed) or have a belt-like shape that extends in the direction perpendicular to the plane of the paper sheet as illustrated in FIG. 5A. Note that in the case where the sacrifice layer 110G has the aforementioned stacked-layer structure of the first sacrifice layer and the second sacrifice layer, the EL layer 103G may be processed into a predetermined shape in the following manner: part of the second sacrifice layer is etched with the use of the resist mask, the resist mask is then removed, and part of the first sacrifice layer is etched with the use of the second sacrifice layer as a mask.

Figure 5B:
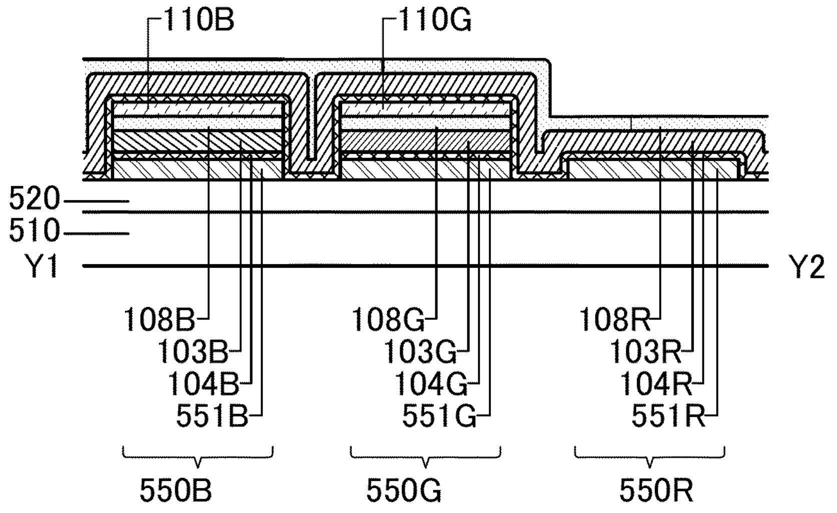

Next, as illustrated in FIG. 5B, the EL layer 103R is formed over the sacrifice layer 110B, the sacrifice layer 110G, and the electrode 551R. Note that in the EL layer 103R in FIG. 5B, the hole-injection/transport layer 104R, the light-emitting layer, and the electron-transport layer 108R are formed. For example, the EL layer 103R is formed by a vacuum evaporation method over the sacrifice layer 110B, the sacrifice layer 110G, and the electrode 551R so as to cover them.

Figure 5C:
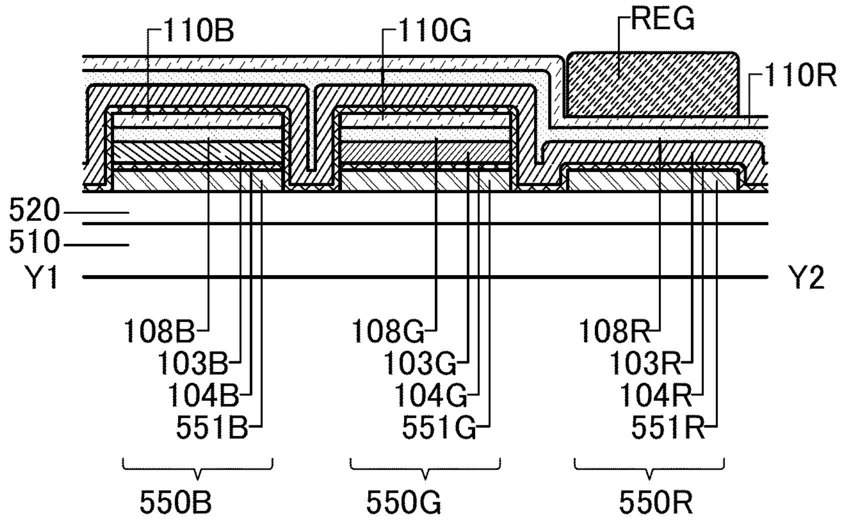
Figure 6A:
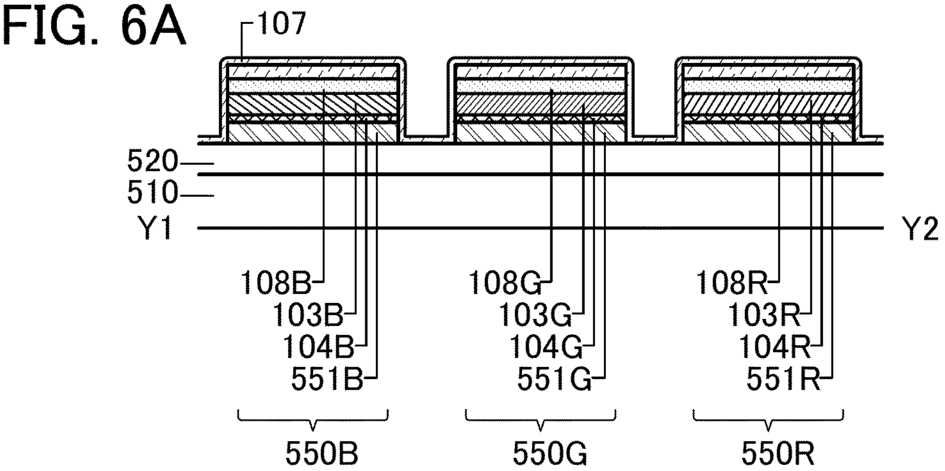
FIGS. 6A to 6C illustrate a method of manufacturing the light-emitting apparatus according to the embodiment.

Then, as illustrated in FIG. 5C, a sacrifice layer 110R is formed over the EL layer 103R, and a resist is applied onto the sacrifice layer 110R, the resist having a desired shape (resist mask REG) is formed by a photolithography method. Part of the sacrifice layer 110R not covered with the resist mask is removed by etching, the resist mask is removed, and part of the EL layer 103R not covered with the sacrifice layer 110R is then removed by etching. Thus, the EL layer 103R over the electrode 551B and the EL layer 103R over the electrode 551G are removed by etching, so that the EL layer 103R is processed to have side surfaces (or have their side surfaces exposed) or have a belt-like shape that extends in the direction perpendicular to the plane of the paper sheet. Note that in the case where the sacrifice layer 110G has the aforementioned stacked-layer structure of the first sacrifice layer and the second sacrifice layer, the EL layer 103G may be processed into a predetermined shape in the following manner: part of the second sacrifice layer is etched with the use of the resist mask, the resist mask is then removed, and part of the first sacrifice layer is etched with the use of the second sacrifice layer as a mask. Then, the insulating layer 107 is formed over the sacrifice layers (110B, 110G, and 110R) with the sacrifice layers (110B, 110G, and 110R) remaining over the EL layers (103B, 103G, and 103R), so that the structure illustrated in FIG. 6A is obtained Note that the insulating layer 107 can be formed by an ALD method, for example. In this case, the insulating layer 107 is formed in contact with the side surfaces of the EL layers (103B, 103G, and 103R) as illustrated in FIG. 6A. This can inhibit entry of oxygen, moisture, or constituent elements thereof into the inside through the side surfaces of the EL layers (103B, 103G, and 103R). Examples of the material used for the insulating layer 107 include aluminum oxide, magnesium oxide, hafnium oxide, gallium oxide, indium gallium zinc oxide, silicon nitride, and silicon nitride oxide.

Figure 6B:
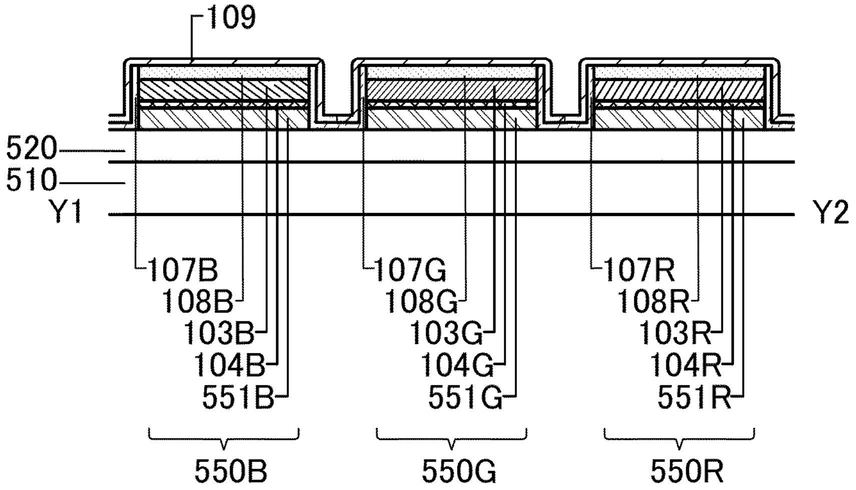

Then, as illustrated in FIG. 6B, after the sacrifice layers (110B, 110G, and 110R) are removed, the electron-injection layer 109 is formed over the insulating layers (107B, 107G, and 107R) and the EL layers (103B, 103G, and 103R). The electron-injection layer 109 is formed by a vacuum evaporation method, for example. Note that the electron-injection layer 109 is formed over the electron-transport layers (108B, 108G, and 108R). The electron-injection layer 109 is in contact with the side surfaces (end portions) of the EL layers (103B, 103G, and 103R) with the insulating layers (107B, 107G, and 107R) therebetween. The EL layers (103B, 103G, and 103R) illustrated in FIG. 6B includes the hole-injection/transport layers (104R, 104G, and 104B), the light-emitting layers, and the electron-transport layers (108B, 108G, and 108R).

Figure 6C:
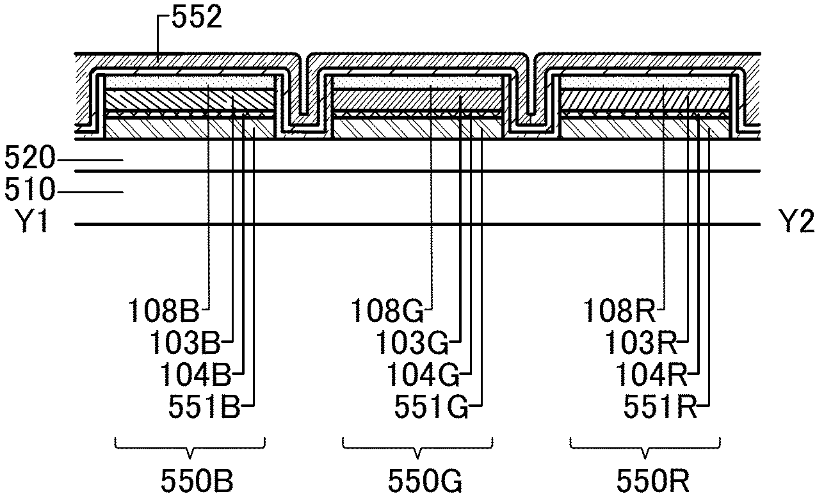

Next, as illustrated in FIG. 6C, the electrode 552 is formed. The electrode 552 is formed by a vacuum evaporation method, for example. The electrode 552 is formed over the electron-injection layer 109. The electrode 552 is in contact with the side surfaces (or end portions) of the EL layers (103B, 103G, and 103R) with the electron-injection layer 109 and the insulating layers (107B, 107G, and 107R) therebetween. The EL layers (103B, 103G, 103R) illustrated in FIG. 6C include the hole-injection/transport layers (104R, 104G, and 104B), the light-emitting layers, and the electron-transport layers (108B, 108G, and 108R). Thus, the EL layers (103B, 103G, and 103R) and the electrode 552, specifically the hole-injection/transport layers (104B, 104G, and 104R) in the EL layers (103B, 103G, and 103R) and the electrode 552 can be prevented from being electrically short-circuited.

Through the above steps, the EL layer 103B, the EL layer 103G, and the EL layer 103R in the light-emitting device 550B, the light-emitting device 550G, and the light-emitting device 550R can be processed to be separated from each other.

The EL layers (EL layers 103B, 103G, and 103R) are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane).

In the EL layer, especially the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can suppress occurrence of crosstalk between adjacent light-emitting devices.

Structure Example 2 of Light-Emitting Apparatus 700

Figure 7:
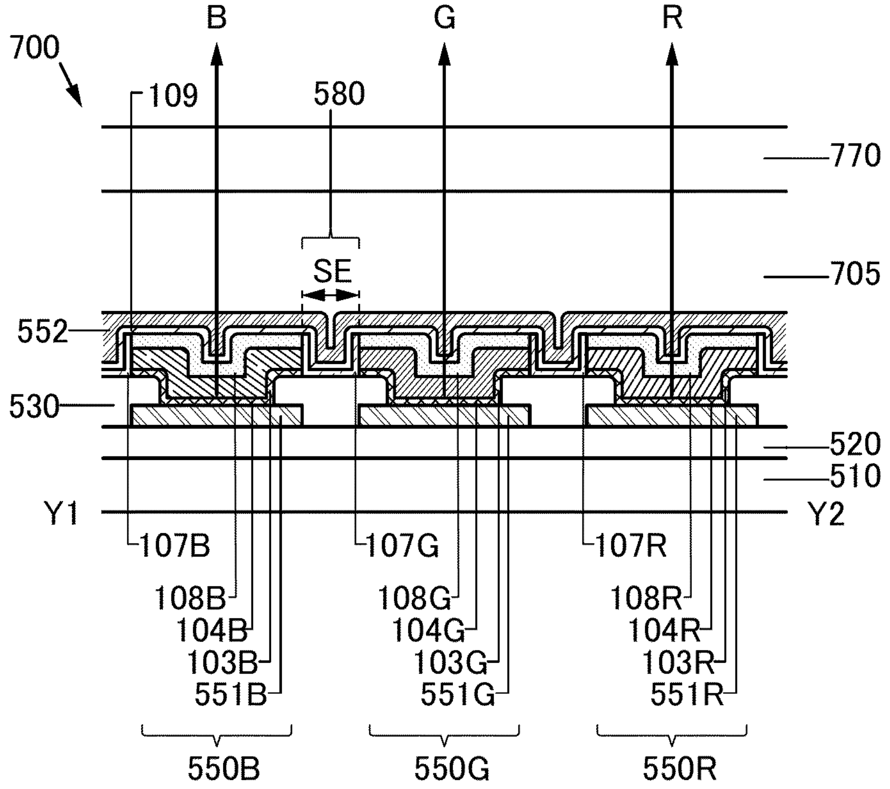
FIG. 7 illustrates the light-emitting apparatus according to the embodiment.

The light-emitting apparatus 700 illustrated in FIG. 7 includes the light-emitting device 550B, the light-emitting device 550G, the light-emitting device 550R, and the partition 530. The light-emitting device 550B, the light-emitting device 550G, the light-emitting device 550R, and the partition 530 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The driver circuit GD and the driver circuit SD will be described in Embodiment 4.

The light-emitting device 550B, the light-emitting device 550G, and the light-emitting device 550R each have the device structure described in Embodiment 2. Specifically, the case is described in which the EL layer 103 in the structure illustrated in FIG. 1A differs between the light-emitting devices.

Note that specific structures of the light-emitting devices illustrated in FIG. 7 are the same as the structures of the light-emitting devices 550B, 550G, and 550R described with reference to FIGS. 2A and 2B.

As illustrated in FIG. 7, the EL layers (103B, 103G, and 103R) of the light-emitting devices (550B, 550G, and 550R) each include the hole-injection/transport layer (104B, 104G, or 104R), the electron-transport layer (108B, 108G, or 108R), and the electron-injection layer 109.

The EL layers (103B, 103G, and 103R) in this structure are processed to be separated by patterning using a photolithography method; hence, end portions (side surfaces) of the processed EL layers have substantially one surface (or are positioned on substantially the same plane).

The space 580 is provided between the adjacent light-emitting devices, each of which includes the EL layer (103B, 103G, or 103R). When the space 580 is denoted by a distance SE between the EL layers in adjacent light-emitting devices, decreasing the distance SE increases the aperture ratio and the resolution. By contrast, as the distance SE is increased, the effect of the difference in the fabrication process between the adjacent light-emitting devices becomes permissible, which leads to an increase in manufacturing yield. Since the light-emitting device fabricated according to this specification is suitable for a miniaturization process, the distance SE between the EL layers in the adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

In the EL layer, especially the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can suppress occurrence of crosstalk between adjacent light-emitting devices.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

The structures described in this embodiment can be used in appropriate combination with any of the structures described in the other embodiments.

Embodiment 4

In this embodiment, a light-emitting apparatus of one embodiment of the present invention will be described with reference to FIGS. 8A and 8B, FIGS. 9A and 9B, and FIGS. 10A and 10B. The light-emitting apparatus 700 illustrated in FIGS. 8A and 8B, FIGS. 9A and 9B, and FIGS. 10A and 10B includes the light-emitting device described in Embodiment 2. The light-emitting apparatus 700 described in this embodiment can be referred to as a display panel because it can be used in a display unit of an electronic appliance and the like.

Figure 8A:
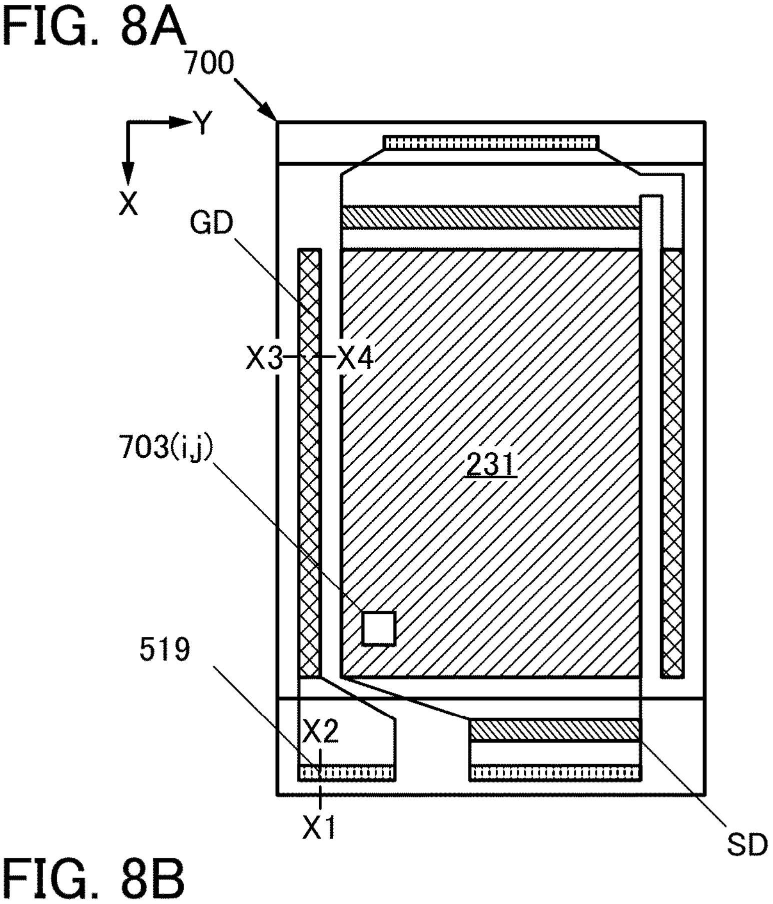
FIGS. 8A and 8B illustrate a light-emitting apparatus according to an embodiment.
Figure 8B:
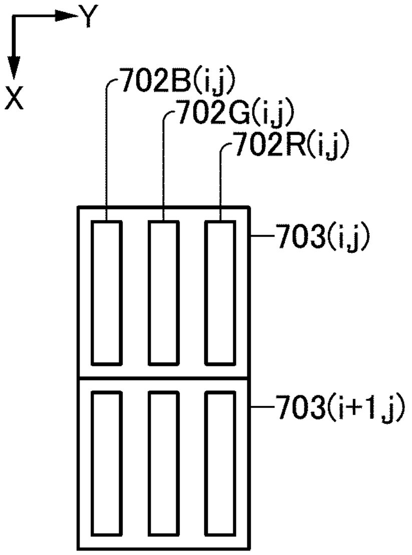

As illustrated in FIG. 8A, the light-emitting apparatus 700 described in this embodiment includes a display region 231, and the display region 231 includes a pixel set 703(*i,j*). A pixel set 703(*i*+1,j) adjacent to the pixel set 703(*i,j*) is provided as illustrated in FIG. 8B.

Note that a plurality of pixels can be used in the pixel 703(*i,j*). For example, a plurality of pixels that show colors of different hues can be used. Note that a plurality of pixels can be referred to as subpixels. In addition, a set of subpixels can be referred to as a pixel.

Such a structure enables additive mixture or subtractive mixture of colors shown by the plurality of pixels. Alternatively, it is possible to express a color of a hue that a single pixel cannot show.

Specifically, a pixel 702B(i,j) for showing blue, the pixel 702G(i,j) for showing green, and a pixel 702R(i,j) for showing red can be used in the pixel 703(*i,j*). The pixel 702B(i,j), the pixel 702G(i,j), and the pixel 702R(i,j) can each be referred to as a subpixel. A pixel for showing white or the like in addition to the above set may be used in the pixel 703(*i,j*). Moreover, a pixel for showing cyan, a pixel for showing magenta, and a pixel for showing yellow may be used as subpixels in the pixel 703(*i,j*).

A pixel that emits infrared light in addition to the above set may be used in the pixel 703(*i,j*). Specifically, a pixel that emits light including light with a wavelength of from 650 nm to 1000 nm, inclusive, can be used in the pixel 703(*i,j*).

The light-emitting apparatus 700 includes the driver circuit GD and the driver circuit SD around the display region 231 in FIG. 8A. The light-emitting apparatus 700 also includes a terminal 519 electrically connected to the driver circuit GD, the driver circuit SD, and the like. The terminal 519 can be electrically connected to a flexible printed circuit FPC1, for example.

The driver circuit GD has a function of supplying a first selection signal and a second selection signal. For example, the driver circuit GD is electrically connected to an after-mentioned conductive film G1(*i*) to supply the first selection signal, and is electrically connected to an after-mentioned conductive film G2(*i*) to supply the second selection signal. The driver circuit SD has a function of supplying an image signal and a control signal, and the control signal includes a first level and a second level. For example, the driver circuit SD is electrically connected to an after-mentioned conductive film S1*g*(j) to supply the image signal, and is electrically connected to an after-mentioned conductive film S2*g*(j) to supply the control signal.

Figure 10A:
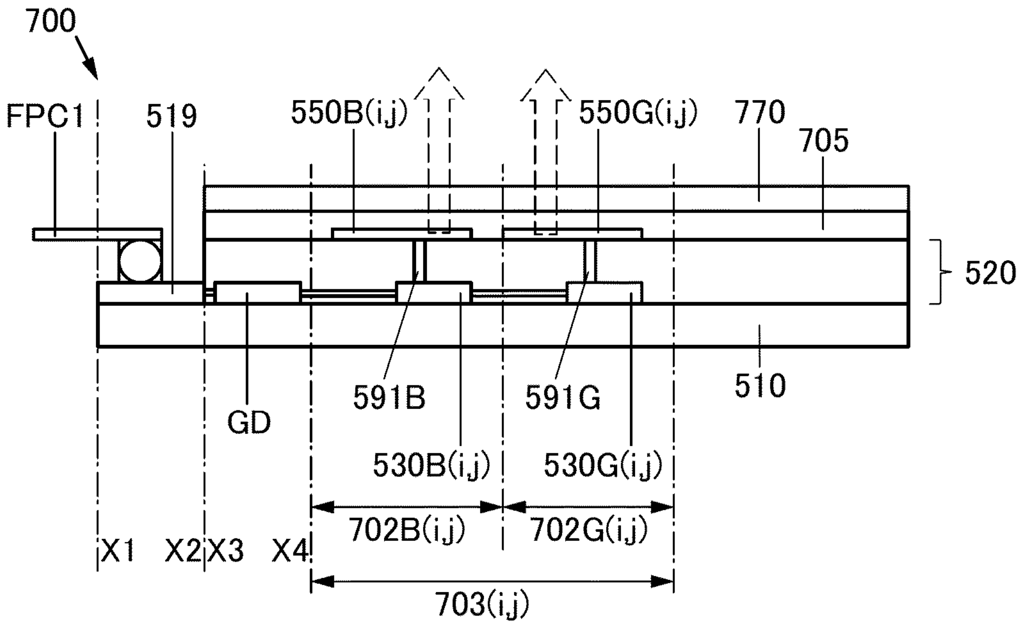
FIGS. 10A and 10B each illustrate the light-emitting apparatus according to the embodiment.

FIG. 10A illustrates a cross-sectional view of the light-emitting apparatus taken along each of the dashed-dotted line X1-X2 and the dashed-dotted line X3-X4 in FIG. 8A. As illustrated in FIG. 10A, the light-emitting apparatus 700 includes the functional layer 520 between the first substrate 510 and the second substrate 770. The functional layer 520 includes, for example, the driver circuit GD, the driver circuit SD, and the like that are described above and wirings that electrically connect the components. Although FIG. 10A illustrates the functional layer 520 including a pixel circuit 530B(i,j), a pixel circuit 530G(i,j), and the driver circuit GD, the functional layer 520 is not limited thereto.

Each pixel circuit (e.g., the pixel circuit 530B(i,j) and the pixel circuit 530G(i,j) in FIG. 10A) included in the functional layer 520 is electrically connected to a light-emitting device (e.g., a light-emitting device 550B(i,j) and a light-emitting device 550G(i,j) in FIG. 10A) formed over the functional layer 520. Specifically, the light-emitting device 550B(i,j) is electrically connected to the pixel circuit 530B (i,j) through an opening 591B, and the light-emitting device 550G(i,j) is electrically connected to the pixel circuit 530G (i,j) through an opening 591G. The insulating layer 705 is provided over the functional layer 520 and the light-emitting devices, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting apparatus of one embodiment of the present invention can be used as a touch panel.

Figure 9A:
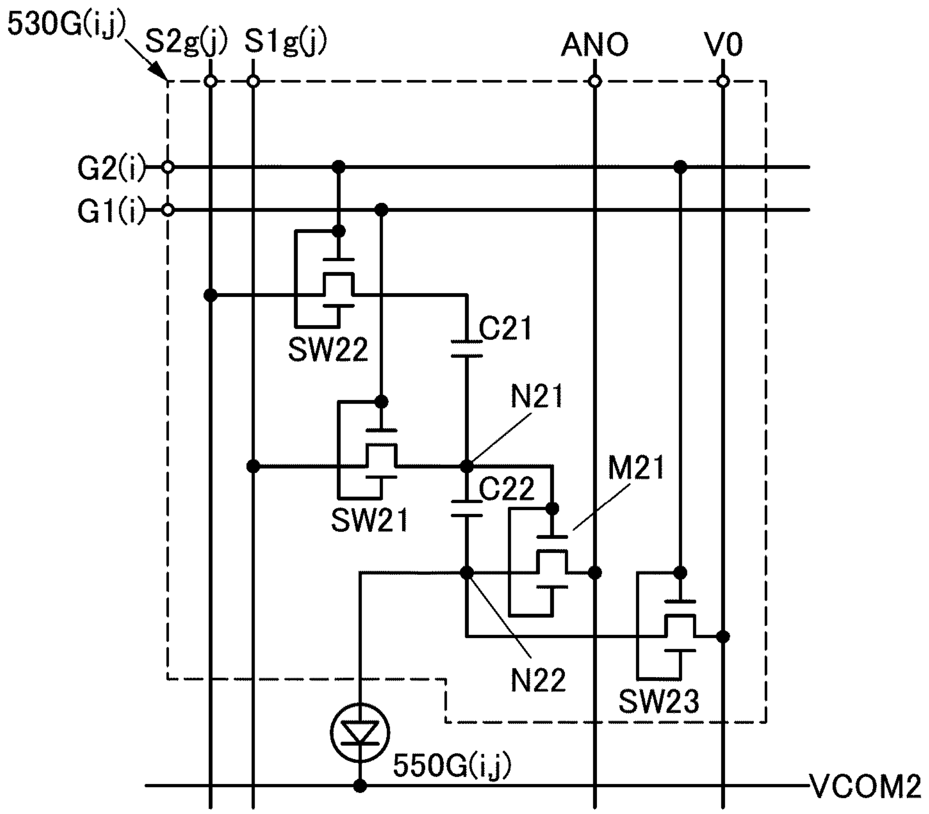
FIGS. 9A and 9B illustrate the light-emitting apparatus according to the embodiment.

FIG. 9A illustrates a specific configuration of the pixel circuit 530G(i,j).

As illustrated in FIG. 9A, the pixel circuit 530G(i,j) includes a switch SW21, a switch SW22, a transistor M21, a capacitor C21, and a node N21. The pixel circuit 530G(i,j) also includes a node N22, a capacitor C22, and a switch SW23.

The transistor M21 includes a gate electrode electrically connected to the node N21, a first electrode electrically connected to the light-emitting device 550G(i,j), and a second electrode electrically connected to a conductive film ANO.

The switch SW21 includes a first terminal electrically connected to the node N21 and a second terminal electrically connected to the conductive film S1*g*(j). The switch SW21 has a function of controlling its on/off state on the basis of the potential of the conductive film G1(*i*).

The switch SW22 includes a first terminal electrically connected to the conductive film S2*g*(j), and has a function of controlling its on/off state on the basis of the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550G(i,j) can be controlled with the potential of the node N21.

Figure 9B:
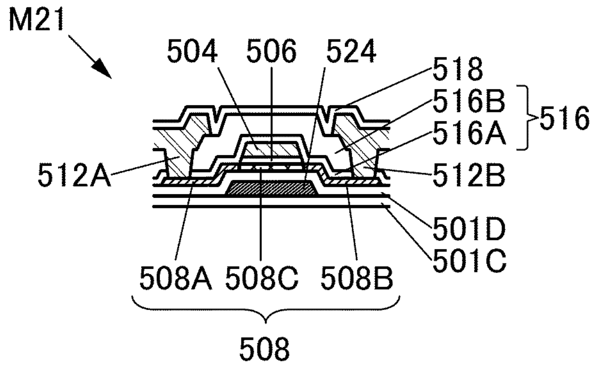

FIG. 9B illustrates an example of a specific structure of the transistor M21 described in FIG. 9A. As the transistor M21, a bottom-gate transistor, a top-gate transistor, or the like can be used as appropriate.

The transistor illustrated in FIG. 9B includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping the region 508C and has a function of a gate electrode.

The insulating film 506 includes a region positioned between the semiconductor film 508 and the conductive film 504. The insulating film 506 has a function of a first gate insulating film.

The conductive film 512A has one function of a source electrode and a drain electrode, and the conductive film 512B has the other function thereof.

A conductive film 524 can be used in the transistor. The conductive film 524 includes a region where the semiconductor film 508 is placed between the conductive film 504 and the conductive film 524. The conductive film 524 has a function of a second gate electrode. An insulating film 501D is positioned between the semiconductor film 508 and the conductive film 524 and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516, for example.

For the insulating film 518, a material that has a function of inhibiting diffusion of oxygen, hydrogen, water, an alkali metal, an alkaline earth metal, and the like is preferably used. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that in a step of forming the semiconductor film used in the transistor of the pixel circuit, the semiconductor film used in the transistor of the driver circuit can be formed. A semiconductor film having the same composition as the semiconductor film used in the transistor of the pixel circuit can be used in the driver circuit, for example.

For the semiconductor film 508, a semiconductor containing an element of Group 14 can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide a light-emitting apparatus having less display unevenness than a light-emitting apparatus (or a display panel) using polysilicon for the semiconductor film 508, for example. Moreover, it is easy to increase the size of the light-emitting apparatus.

Polysilicon can be used for the semiconductor film 508. In this case, for example, the field-effect mobility of the transistor can be higher than that of a transistor using hydrogenated amorphous silicon for the semiconductor film 508. As another example, the driving capability can be higher than that of the transistor using hydrogenated amorphous silicon for the semiconductor film 508. As another example, the aperture ratio of the pixel can be higher than that in the case of employing the transistor using hydrogenated amorphous silicon for the semiconductor film 508.

As another example, the reliability of the transistor can be higher than that of the transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic appliance can be reduced.

Single crystal silicon can be used for the semiconductor film 508. In this case, for example, the resolution can be higher than that of a light-emitting apparatus (or a display panel) using amorphous silicon for the semiconductor film 508. As another example, it is possible to provide a light-emitting apparatus having less display unevenness than a light-emitting apparatus using polysilicon for the semiconductor film 508. As another example, smart glasses or a head-mounted display can be provided.

A metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of an electronic appliance can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having a lower leakage current in the off state than a transistor using amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining the potential of a floating node for a longer time than a circuit in which a transistor using amorphous silicon for the semiconductor film is used as a switch.

Figure 10B:
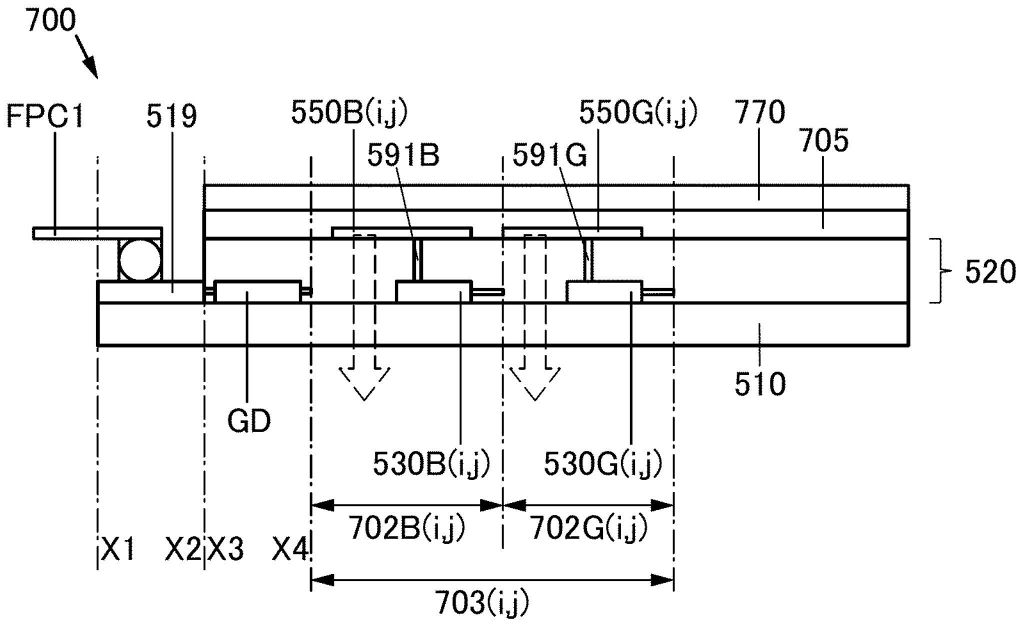

Although the light-emitting apparatus in FIG. 10A has a structure in which light is extracted from the second substrate 770 side (top emission structure), a light-emitting apparatus may have a structure in which light is extracted from the first substrate 510 side (bottom emission structure) as illustrated in FIG. 10B. In a bottom-emission light-emitting apparatus, the first electrode 101 is formed as a transflective electrode and the second electrode 102 is formed as a reflective electrode.

Figure 11A:
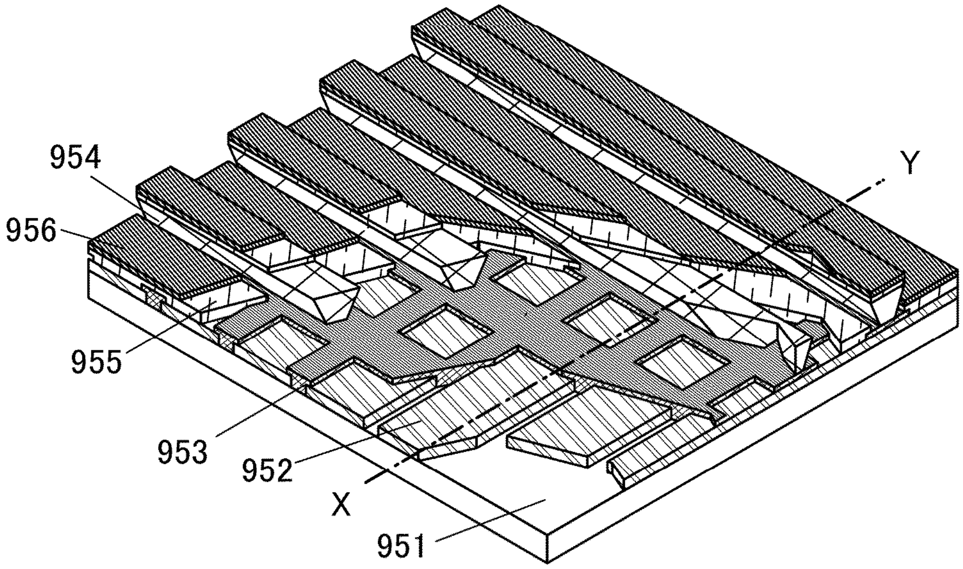
FIGS. 11A and 11B illustrate a light-emitting apparatus according to the embodiment.
Figure 11B:
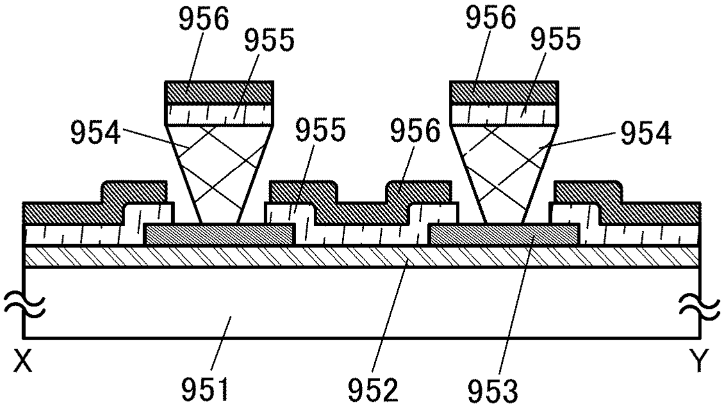

Although FIGS. 10A and 10B illustrate active-matrix light-emitting apparatuses, the structure of the light-emitting device described in Embodiment 2 may be applied to a passive-matrix light-emitting apparatus illustrated in FIGS. 11A and 11B.

FIG. 11A is a perspective view illustrating the passive-matrix light-emitting apparatus, and FIG. 11B shows a cross section along the line X-Y in FIG. 11A. In FIGS. 11A and 11B, an electrode 952 and an electrode 956 are provided over a substrate 951, and an EL layer 955 is provided between the electrode 952 and the electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting device due to static electricity or the like.

The structures described in this embodiment can be used in appropriate combination with any of the structures described in the other embodiments.

Embodiment 5

In this embodiment, structures of electronic appliances of embodiments of the present invention will be described with reference to FIGS. 12A to 12E, FIGS. 13A to 13E, and FIGS. 14A and 14B.

Figure 12A:
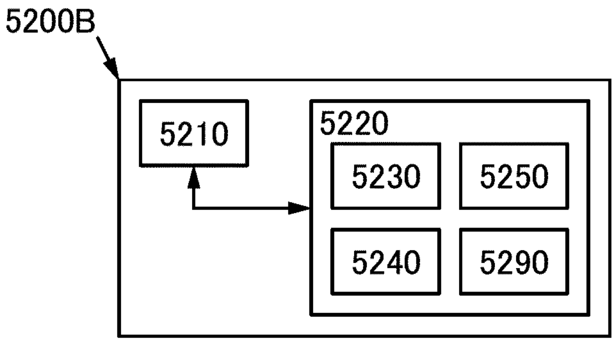
FIGS. 12A to 12E illustrate electronic appliances according to an embodiment.
Figure 12B:
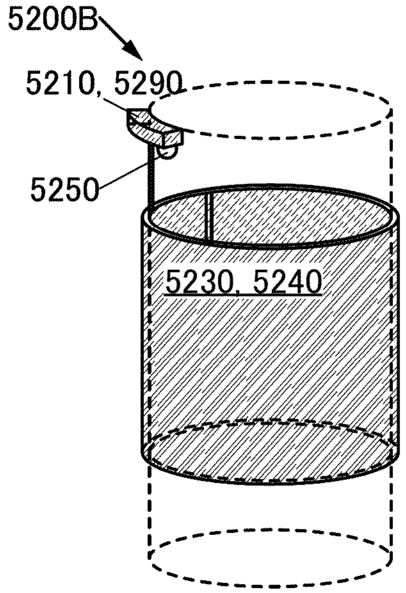
Figure 12C:
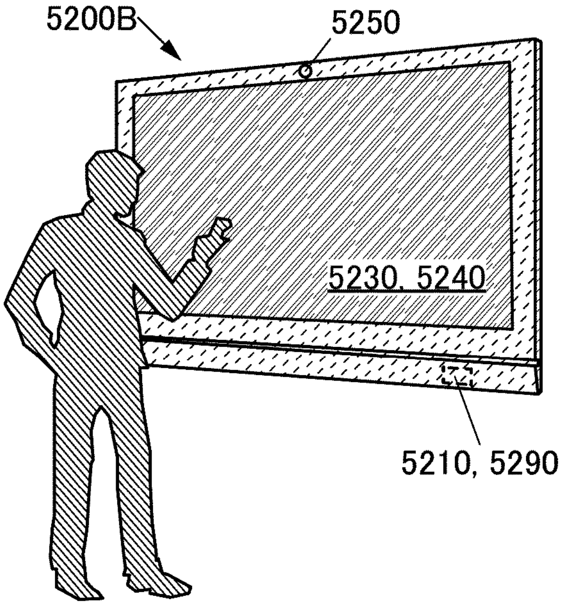
Figure 12D:
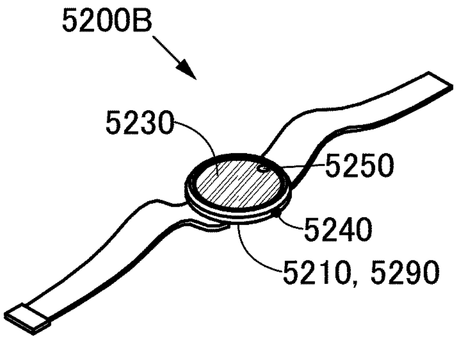
Figure 12E:
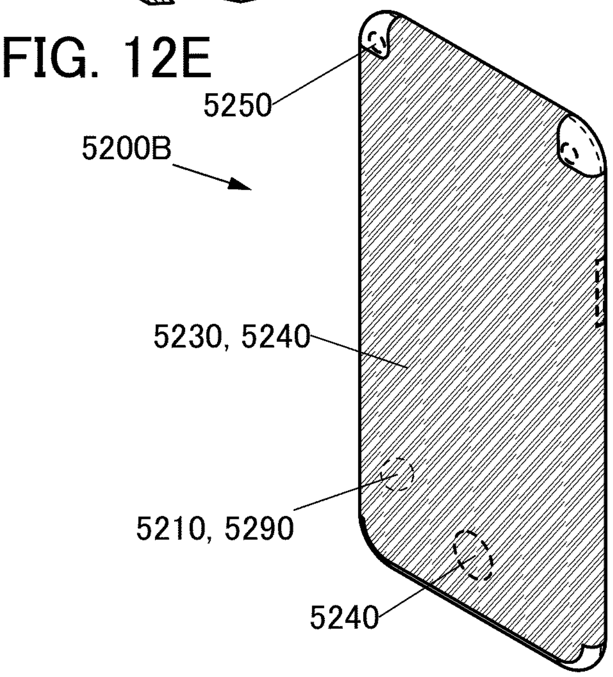
Figure 13A:
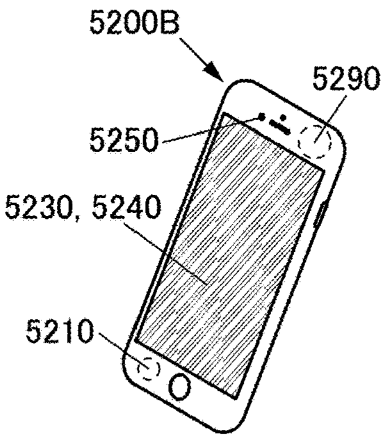
FIGS. 13A to 13E illustrate electronic appliances according to the embodiment.
Figure 13B:
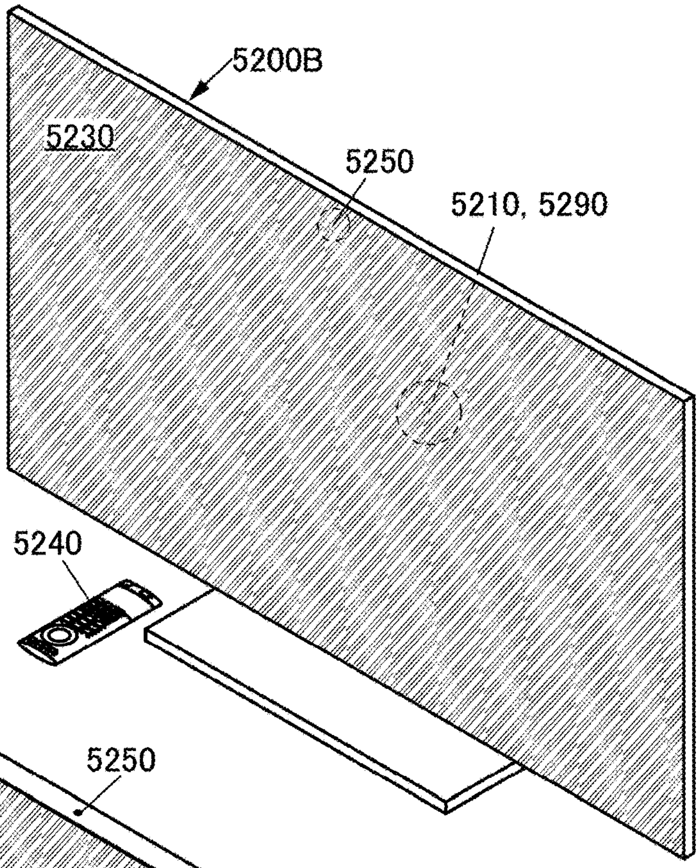
Figure 13C:
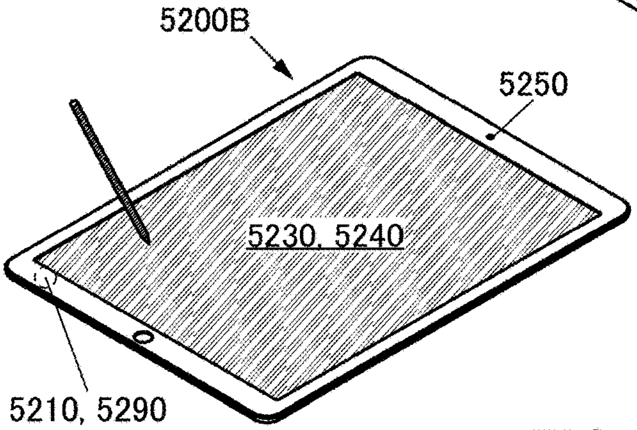
Figure 13D:
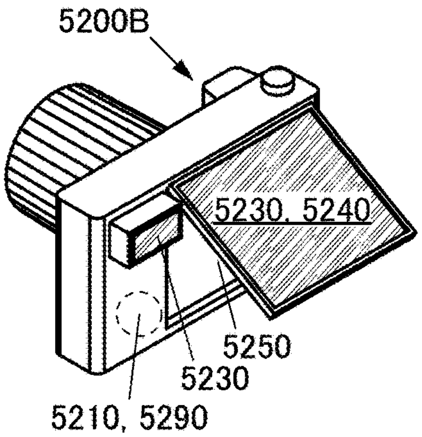
Figure 13E:
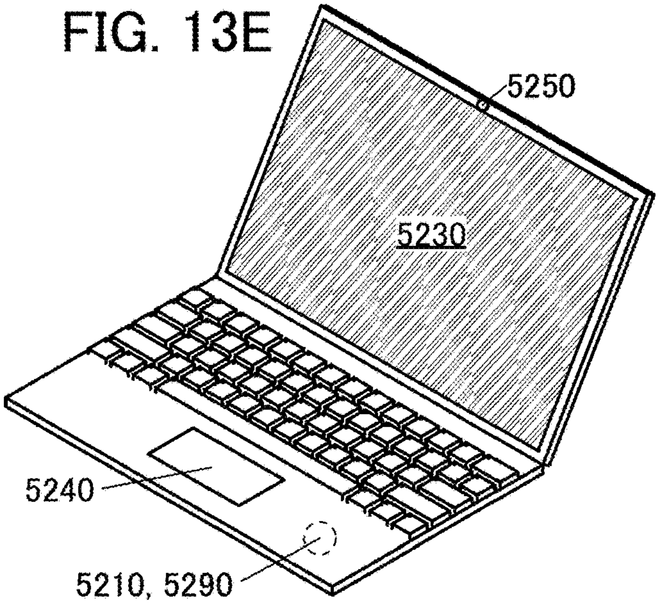
Figure 14A:
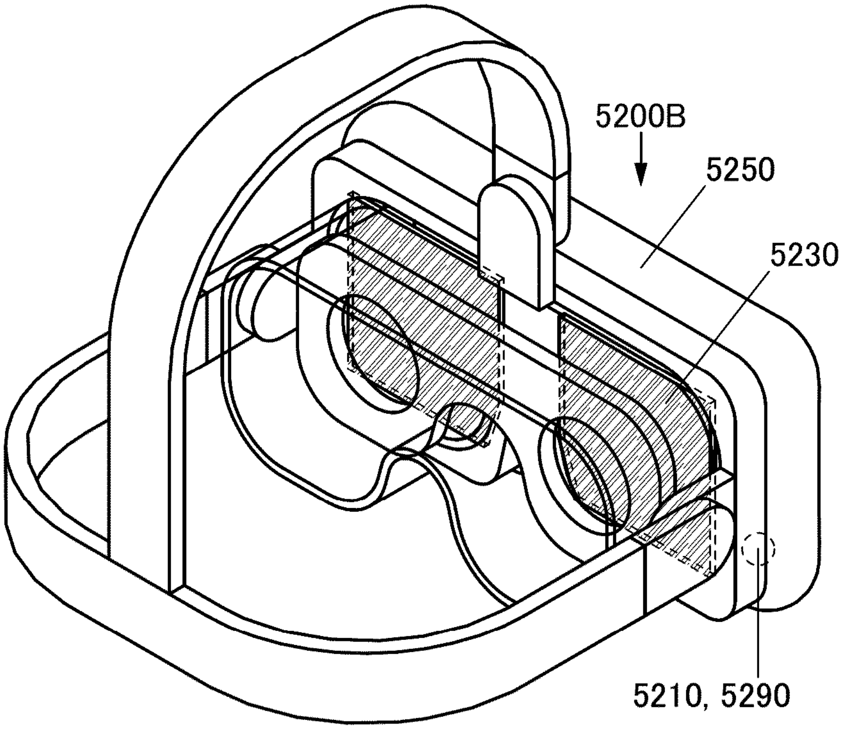
FIGS. 14A and 14B illustrate an electronic appliance according to the embodiment.
Figure 14B:
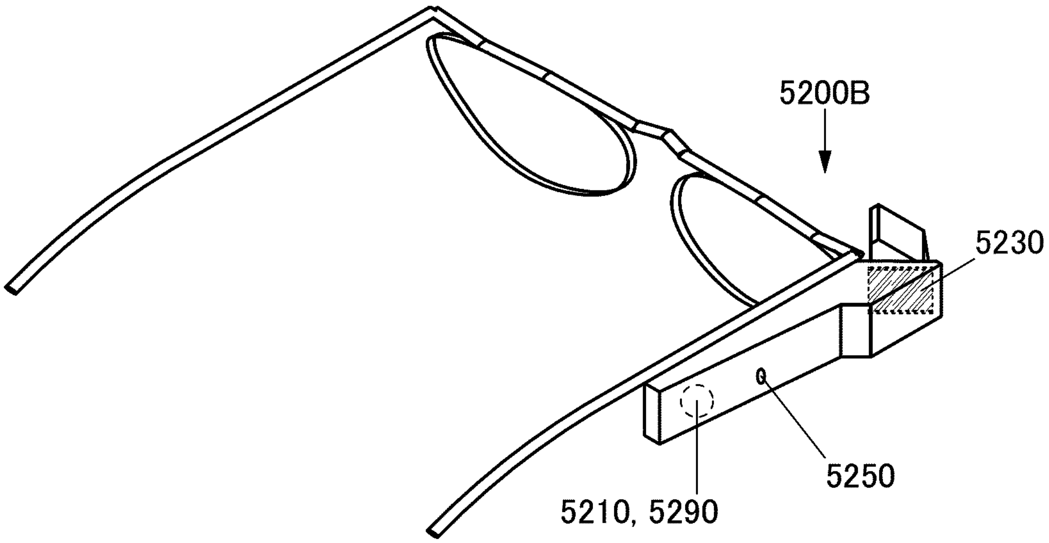

FIGS. 12A to 12E, FIGS. 13A to 13E, and FIGS. 14A and 14B each illustrate a structure of an electronic appliance of one embodiment of the present invention. FIG. 12A is a block diagram of an electronic appliance and FIGS. 12B to 12E are perspective views illustrating structures of electronic appliances. FIGS. 13A to 13E are perspective views illustrating structures of electronic appliances. FIGS. 14A and 14B are perspective views illustrating structures of electronic appliances.

An electronic appliance 5200B described in this embodiment includes an arithmetic device 5210 and an input/output device 5220 (see FIG. 12A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the electronic appliance 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 2 can be used for the display unit 5230.

The sensor unit 5250 has a function of supplying sensing data. For example, the sensor unit 5250 has a function of sensing a surrounding environment where the electronic appliance is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic appliance or a communication network by wireless communication or wired communication. Specifically, the communication unit 5290 has a function of wireless local area network communication, telephone communication, near field communication, or the like.

FIG. 12B illustrates an electronic appliance having an outer shape along a cylindrical column or the like. An example of such an electronic appliance is digital signage. The display panel of one embodiment of the present invention can be used for the display unit 5230. The electronic appliance may have a function of changing its display method in accordance with the illuminance of a usage environment. The electronic appliance has a function of changing the displayed content when sensing the existence of a person. Thus, for example, the electronic appliance can be provided on a column of a building. The electronic appliance can display advertising, guidance, or the like.

FIG. 12C illustrates an electronic appliance having a function of generating image data on the basis of the path of a pointer used by the user. Examples of such an electronic appliance include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 12D illustrates an electronic appliance that is capable of receiving data from another device and displaying the data on the display unit 5230. An example of such an electronic appliance is a wearable electronic appliance. Specifically, the electronic appliance can display several options, and the user can choose some from the options and send a reply to the data transmitter. As another example, the electronic appliance has a function of changing its display method in accordance with the illuminance of a usage environment. Thus, for example, power consumption of the wearable electronic appliance can be reduced. As another example, the wearable electronic appliance can display an image so as to be suitably used even in an environment under strong external light, e.g., outdoors in fine weather.

FIG. 12E illustrates an electronic appliance including the display unit 5230 having a surface gently curved along a side surface of a housing. An example of such an electronic appliance is a mobile phone. The display unit 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 13A illustrates an electronic appliance that is capable of receiving data via the Internet and displaying the data on the display unit 5230. An example of such an electronic appliance is a smartphone. For example, the user can check a created message on the display unit 5230 and send the created message to another device. As another example, the electronic appliance has a function of changing its display method in accordance with the illuminance of a usage environment. Thus, power consumption of the smartphone can be reduced. As another example, it is possible to obtain a smartphone which can display an image such that the smartphone can be suitably used in an environment under strong external light, e.g., outdoors in fine weather.

FIG. 13B illustrates an electronic appliance that can use a remote controller as the input unit 5240. An example of such an electronic appliance is a television system. For example, data received from a broadcast station or via the Internet can be displayed on the display unit 5230. The electronic appliance can take an image of the user with the sensor unit 5250 and transmit the image of the user. The electronic appliance can acquire a viewing history of the user and provide it to a cloud service. The electronic appliance can acquire recommendation data from a cloud service and display the data on the display unit 5230. A program or a moving image can be displayed on the basis of the recommendation data. As another example, the electronic appliance has a function of changing its display method in accordance with the illuminance of a usage environment. Accordingly, for example, it is possible to obtain a television system which can display an image such that the television system can be suitably used even under strong external light entering the room from the outside in fine weather.

FIG. 13C illustrates an electronic appliance that is capable of receiving an educational material via the Internet and displaying it on the display unit 5230. An example of such an electronic appliance is a tablet computer. The user can input an assignment with the input unit 5240 and send it via the Internet. The user can obtain a corrected assignment or the evaluation from a cloud service and have it displayed on the display unit 5230. The user can select a suitable educational material on the basis of the evaluation and have it displayed.

For example, an image signal can be received from another electronic appliance and displayed on the display unit 5230. When the electronic appliance is placed on a stand or the like, the display unit 5230 can be used as a sub-display. Thus, for example, it is possible to obtain a tablet computer which can display an image such that the tablet computer is favorably used even in an environment under strong external light, e.g., outdoors in fine weather.

FIG. 13D illustrates an electronic appliance including a plurality of display units 5230. An example of such an electronic appliance is a digital camera. For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The electronic appliance has a function of changing shooting conditions in accordance with the illuminance of a usage environment. Accordingly, for example, it is possible to obtain a digital camera that can display a subject such that an image is favorably viewed even in an environment under strong external light, e.g., outdoors in fine weather.

FIG. 13E illustrates an electronic appliance in which the electronic appliance of this embodiment is used as a master to control another electronic appliance used as a slave. An example of such an electronic appliance is a portable personal computer. For example, part of image data can be displayed on the display unit 5230 and another part of the image data can be displayed on a display unit of another electronic appliance. Image signals can be supplied. Data written from an input unit of another electronic appliance can be obtained with the communication unit 5290. Thus, a large display region can be utilized in the case of using a portable personal computer, for example.

FIG. 14A illustrates an electronic appliance including the sensing unit 5250 that senses an acceleration or a direction. An example of such an electronic appliance is a goggles-type electronic appliance. The sensor unit 5250 can supply data on the position of the user or the direction in which the user faces. The electronic appliance can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on the goggles-type electronic appliance, for example.

FIG. 14B illustrates an electronic appliance including an imaging device and the sensing unit 5250 that senses an acceleration or a direction. An example of such an electronic appliance is a glasses-type electronic appliance. The sensor unit 5250 can supply data on the position of the user or the direction in which the user faces. The electronic appliance can generate image data in accordance with the position of the user or the direction in which the user faces. Accordingly, the data can be shown together with a real-world scene, for example. Alternatively, an augmented reality image can be displayed on the glasses-type electronic appliance.

Note that this embodiment can be combined with any of the other embodiments in this specification as appropriate.

Embodiment 6

Figure 15A:
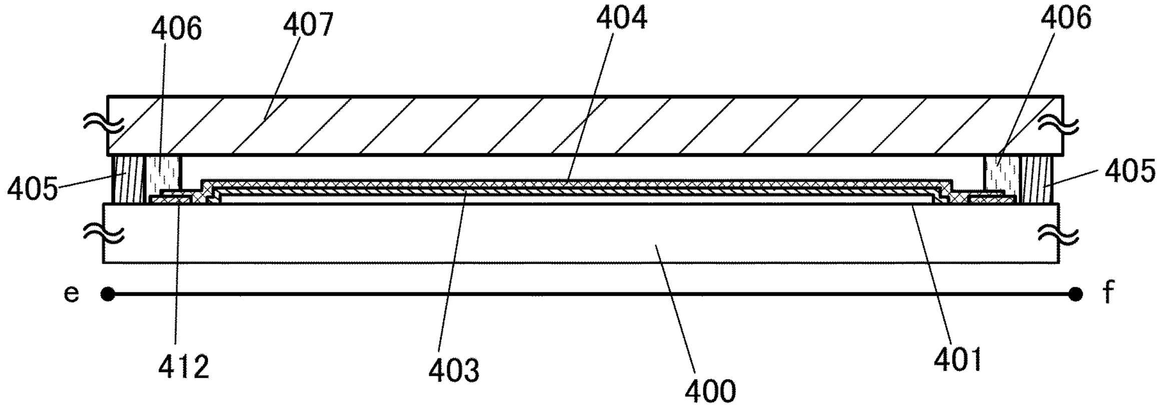
FIGS. 15A and 15B illustrate an electronic appliance according to an embodiment.
Figure 15B:
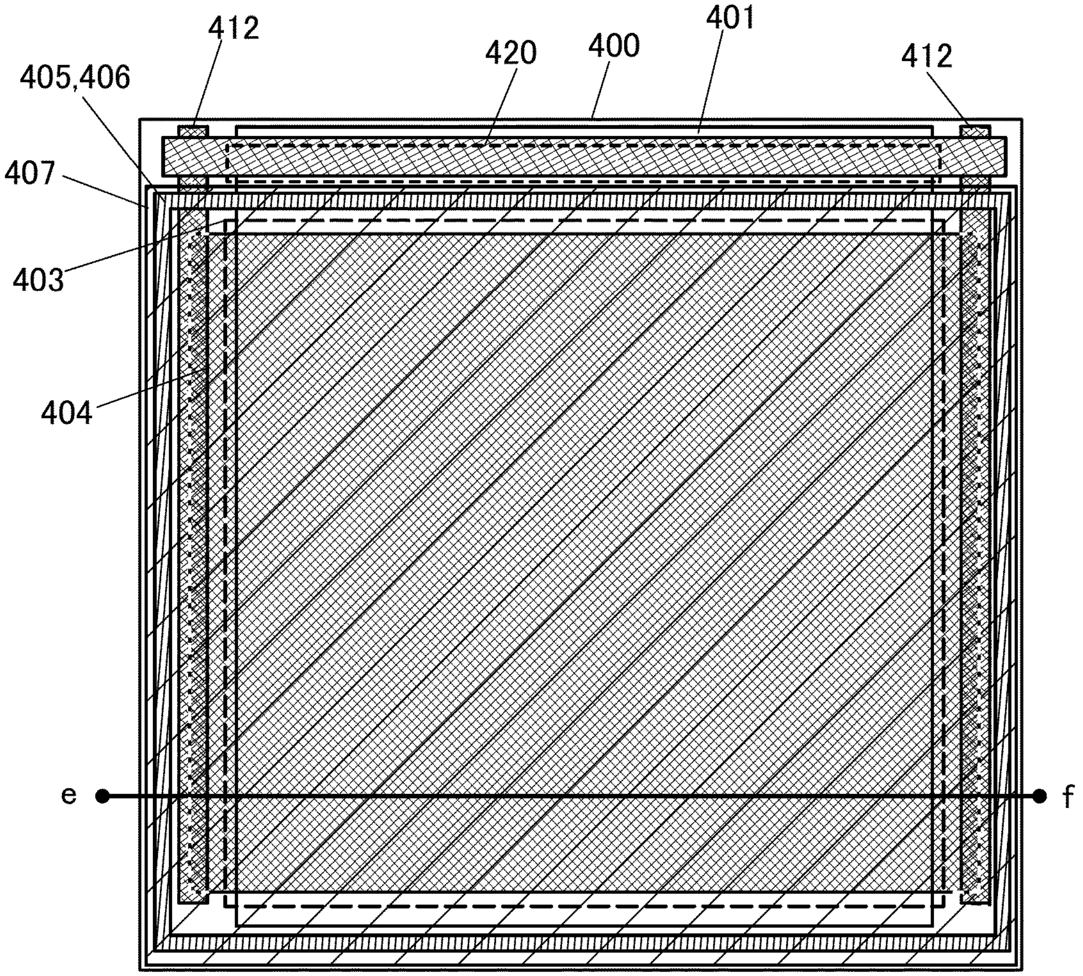

In this embodiment, a structure in which the light-emitting device described in Embodiment 2 is used in a lighting device will be described with reference to FIGS. 15A and 15B. FIG. 15A shows a cross section taken along the line e-f in a top view of the lighting device in FIG. 15B.

In the lighting device in this embodiment, a first electrode 401 is formed over a substrate 400 that is a support and has a light-transmitting property. The first electrode 401 corresponds to the first electrode 101 in Embodiment 2. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 2. Refer to the corresponding description for these structures.

The second electrode 404 is formed to cover the EL layer 403. The second electrode 404 corresponds to the second electrode 102 in Embodiment 2. The second electrode 404 is formed using a material having high reflectance when light is extracted from the first electrode 401 side. The second electrode 404 is connected to the pad 412 so that voltage is applied to the second electrode 404.

As described above, the lighting device described in this embodiment includes a light-emitting device including the first electrode 401, the EL layer 403, and the second electrode 404. Since the light-emitting device has high emission efficiency, the lighting device in this embodiment can have low power consumption.

The substrate 400 provided with the light-emitting device having the above structure and a sealing substrate 407 are fixed and sealed with sealing materials 405 and 406, whereby the lighting device is completed. It is possible to use only either the sealing material 405 or the sealing material 406. In addition, the inner sealing material 406 (not illustrated in FIG. 15B) can be mixed with a desiccant that enables moisture to be adsorbed, increasing the reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

Embodiment 7

Figure 16:
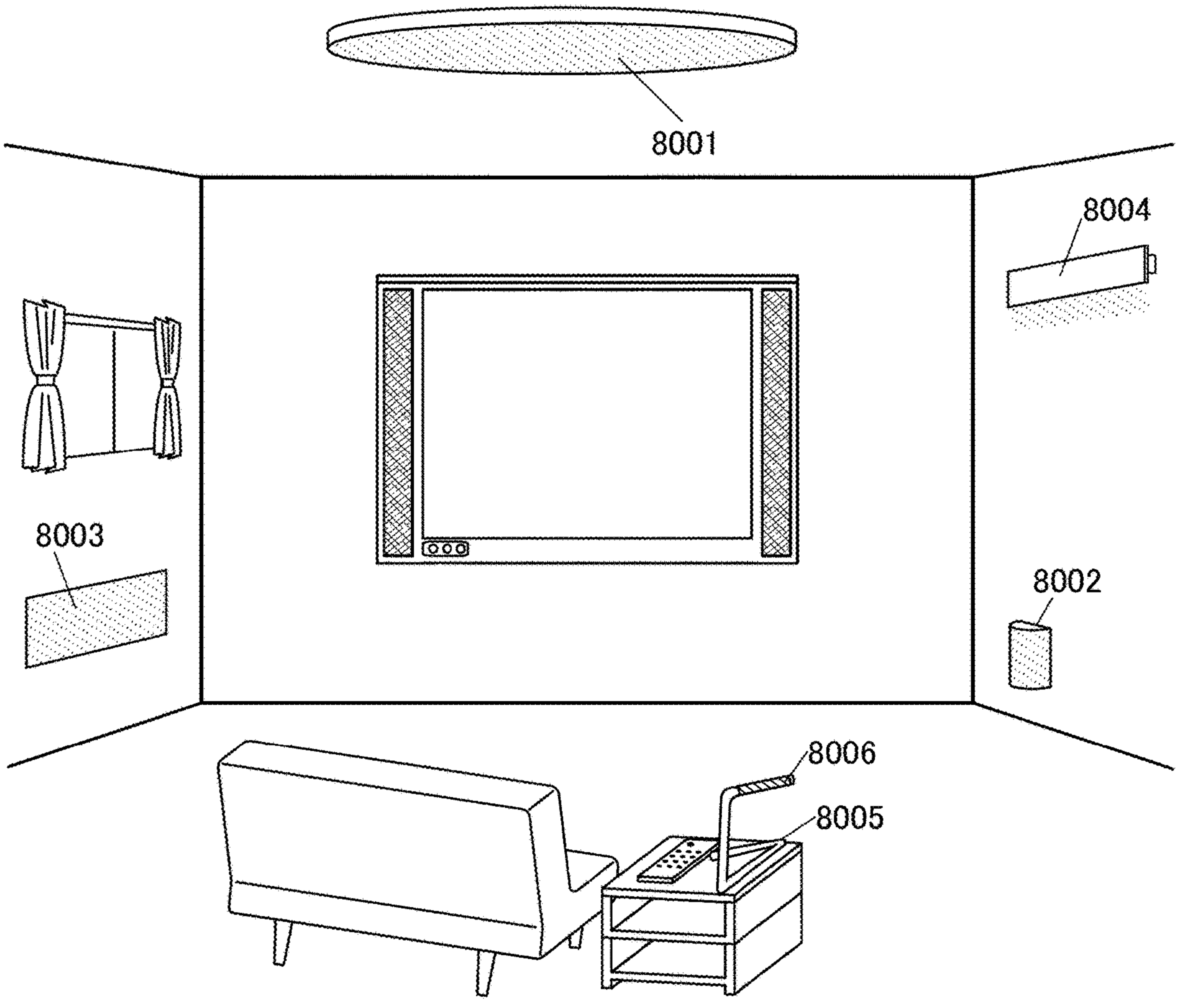
FIG. 16 illustrates electronic appliances according to an embodiment.
Figure 17A:
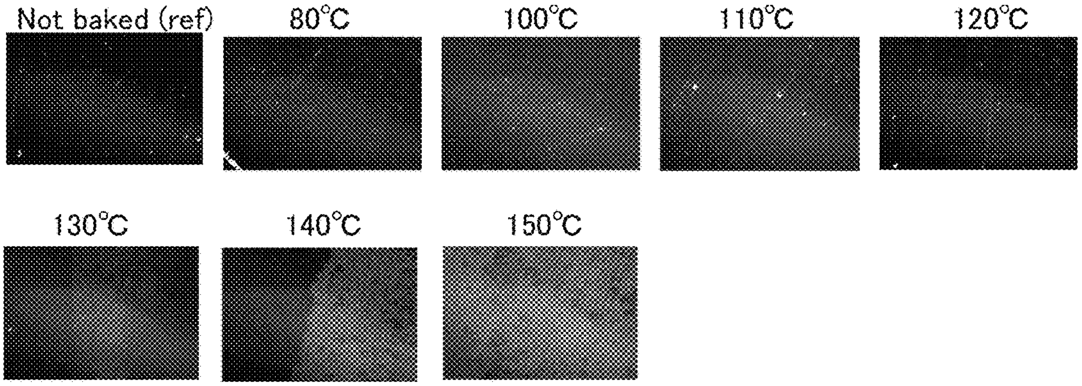
FIGS. 17A to 17D show photographs according to an example.
Figure 17B:
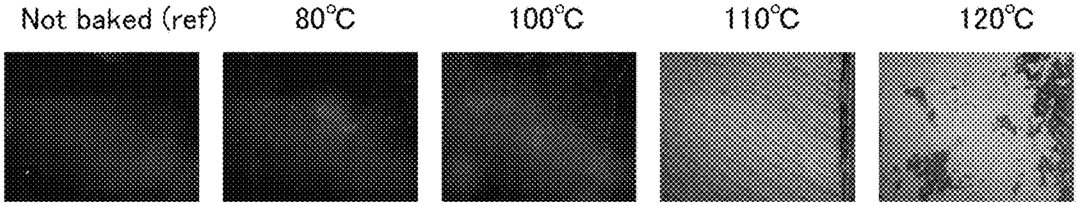
Figure 17C:
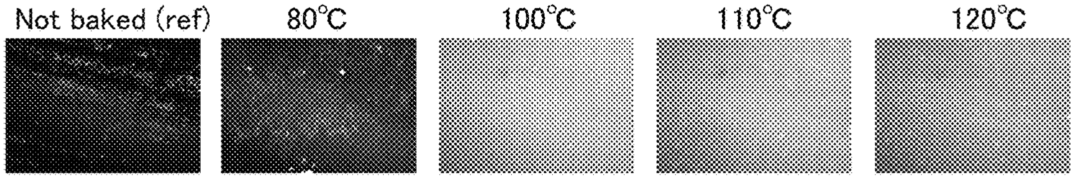
Figure 17D:
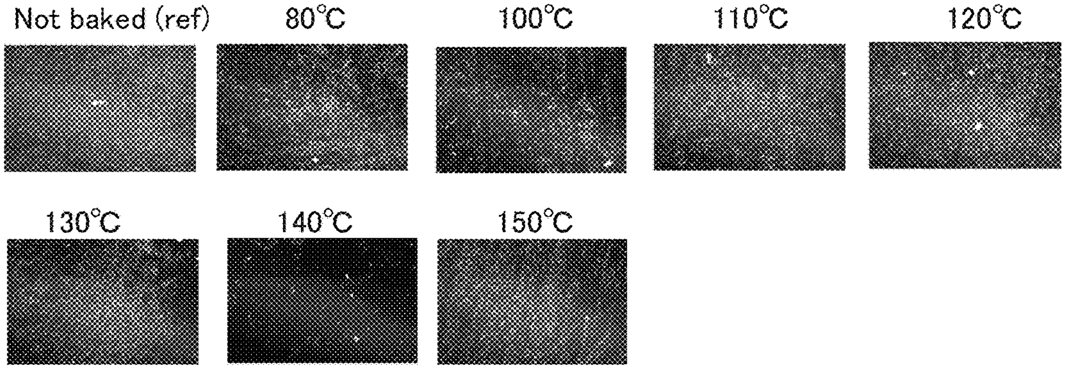

In this embodiment, application examples of lighting devices fabricated using the light-emitting apparatus of one embodiment of the present invention or the light-emitting device, which is part of the light-emitting apparatus, will be described with reference to FIG. 16.

A ceiling light 8001 can be used as an indoor lighting device. Examples of the ceiling light 8001 include a direct-mount light and an embedded light. Such lighting devices are fabricated using the light-emitting apparatus and a housing or a cover in combination. Application to a cord pendant light (light that is suspended from a ceiling by a cord) is also possible.

A foot light 8002 lights a floor so that safety on the floor can be improved. For example, it can be effectively used in a bedroom, on a staircase, and on a passage. In such cases, the size and shape of the foot light can be changed in accordance with the dimensions and structure of a room. The foot light can be a stationary lighting device using the light-emitting apparatus and a support in combination.

A sheet-like lighting 8003 is a thin sheet-like lighting device. The sheet-like lighting, which is attached to a wall when used, is space-saving and thus can be used for a wide variety of uses. Furthermore, the area of the sheet-like lighting can be easily increased. The sheet-like lighting can also be used on a wall or a housing that has a curved surface.

A lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device, which is part of the light-emitting apparatus, is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in appropriate combination with any of the structures described in the other embodiments.

Embodiment 8

In this embodiment, a light-emitting device and a light-receiving device that can be used in a display device of one embodiment of the present invention are described with reference to FIGS. 28A to 28C.

Figure 28A:
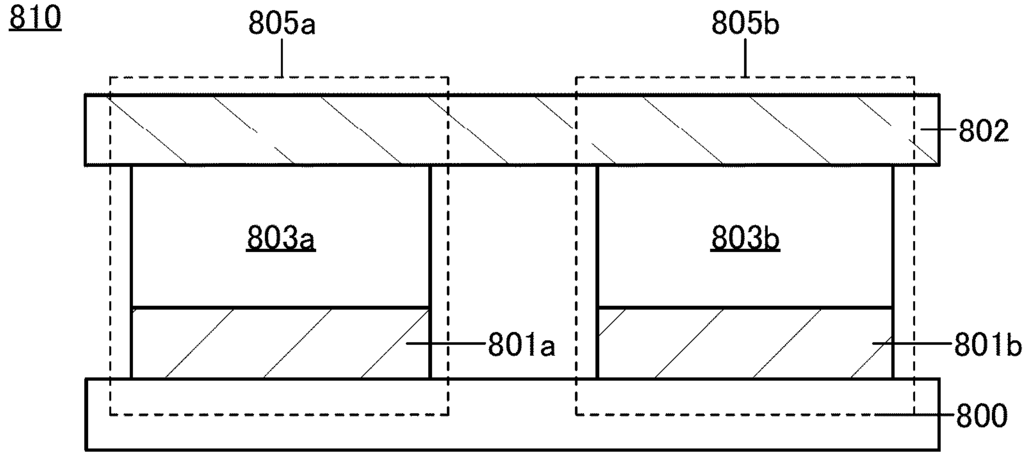
FIGS. 28A to 28C illustrate a display device according to an embodiment.

FIG. 28A is a schematic cross-sectional view of a light-emitting device 805*a* and a light-receiving device 805*b* included in a display device 810 of one embodiment of the present invention.

The light-emitting device 805*a* has a function of emitting light (hereinafter, also referred to as a light-emitting function). The light-emitting device 805*a* includes an electrode 801*a*, an EL layer 803*a*, and an electrode 802. The light-emitting device 805*a* is preferably a light-emitting device utilizing organic EL (an organic EL device) described in Embodiment 2. Thus, the EL layer 803*a* interposed between the electrode 801*a* and the electrode 802 at least includes a light-emitting layer. The light-emitting layer includes a light-emitting substance. The EL layer 803*a* emits light when voltage is applied between the electrode 801*a* and the electrode 802. The EL layer 803*a* may include any of a variety of layers such as a hole-injection layer, a hole-transport layer, an electron-transport layer, an electron-injection layer, a carrier-blocking (hole-blocking or electron-blocking) layer, and a charge generation layer, in addition to the light-emitting layer. Note that any of the mixed materials for a light-emitting device of one embodiment of the present invention can be used for the EL layer 803*a* in the light-emitting device 805*a*.

The light-receiving device 805*b* has a function of sensing light (hereinafter, also referred to as a light-receiving function). As the light-receiving device 805*b*, a PN photodiode or a PIN photodiode can be used, for example. The light-emitting device 805*b* includes an electrode 801*b*, a light-receiving layer 803*b*, and the electrode 802. Thus, the light-receiving layer 803*b* interposed between the electrode 801*b* and the electrode 802 at least includes an active layer. The light-receiving device 805*b* functions as a photoelectric conversion device. When light is incident on the light-receiving layer 803*b*, electric charge can be generated and extracted as a current. At this time, voltage may be applied between the electrode 801*b* and the electrode 802. The amount of generated electric charge depends on the amount of the light incident on the light-receiving layer 803*b*.

The light-receiving device 805*b* has a function of sensing visible light. The light-receiving device 805*b* has sensitivity to visible light. The light-receiving device 805*b* further preferably has a function of sensing visible light and infrared light. The light-receiving device 805*b* preferably has sensitivity to visible light and infrared light.

In this specification and the like, a blue (B) wavelength region ranges from 400 nm to less than 490 nm, and blue (B) light has at least one emission spectrum peak in the wavelength region. A green (G) wavelength region ranges from 490 nm to less than 580 nm, and green (G) light has at least one emission spectrum peak in the wavelength region. A red (R) wavelength region ranges from 580 nm to less than 700 nm, and red (R) light has at least one emission spectrum peak in the wavelength region. In this specification and the like, a visible wavelength region ranges from 400 nm to less than 700 nm, and visible light has at least one emission spectrum peak in the wavelength region. An infrared (IR) wavelength region ranges from 700 nm to less than 900 nm, and infrared (IR) light has at least one emission spectrum peak in the wavelength region.

The active layer in the light-receiving device 805*b* includes a semiconductor. Examples of the semiconductor are inorganic semiconductors such as silicon, organic semiconductors such as organic compounds, and the like. As the light-receiving device 805*b*, an organic semiconductor device (or an organic photodiode) including an organic semiconductor in the active layer is preferably used. An organic photodiode, which is easily made thin, lightweight, and large in area and has a high degree of freedom for shape and design, can be used in a variety of display devices. An organic semiconductor is preferably used, in which case the EL layer 803*a* included in the light-emitting device 805*a* and the active layer included in the light-receiving device 805*b* can be formed by the same method (e.g., a vacuum evaporation method) with the same manufacturing apparatus. Note that any of the mixed materials for an organic semiconductor device of one embodiment of the present invention can be used for the active layer in the light-receiving device 805*b*.

In the display device of one embodiment of the present invention, an organic EL device and an organic photodiode can be suitably used as the light-emitting device 805*a* and the light-receiving device 805*b*, respectively. The organic EL device and the organic photodiode can be formed over one substrate. Thus, the organic photodiode can be incorporated into the display device including the organic EL device. A display device of one embodiment of the present invention has one or both of an image capturing function and a sensing function in addition to a function of displaying an image.

The electrode 801*a* and the electrode 801*b* are provided on the same plane. In FIG. 28A, the electrodes 801*a* and 801*b* are provided over a substrate 800. The electrodes 801*a* and 801*b* can be formed by processing a conductive film formed over the substrate 800 into island shapes, for example. In other words, the electrodes 801*a* and 801*b* can be formed through the same process.

As the substrate 800, a substrate having heat resistance high enough to withstand the formation of the light-emitting device 805*a* and the light-receiving device 805*b* can be used. When an insulating substrate is used, a glass substrate, a quartz substrate, a sapphire substrate, a ceramic substrate, an organic resin substrate or the like can be used as the substrate 800. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 800, it is preferable to use the insulating substrate or the semiconductor substrate over which a semiconductor circuit including a semiconductor element such as a transistor is formed, in particular. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The electrode 802 is formed of a layer shared by the light-emitting device 805*a* and the light-receiving device 805*b*. As the electrode through which light enters or exits, a conductive film that transmits visible light and infrared light is used. As the electrode through which light neither enters nor exits, a conductive film that reflects visible light and infrared light is preferably used.

The electrode 802 in the display device of one embodiment of the present invention functions as one of the electrodes in each of the light-emitting device 805*a* and the light-receiving device 805*b*.

Figure 28B:
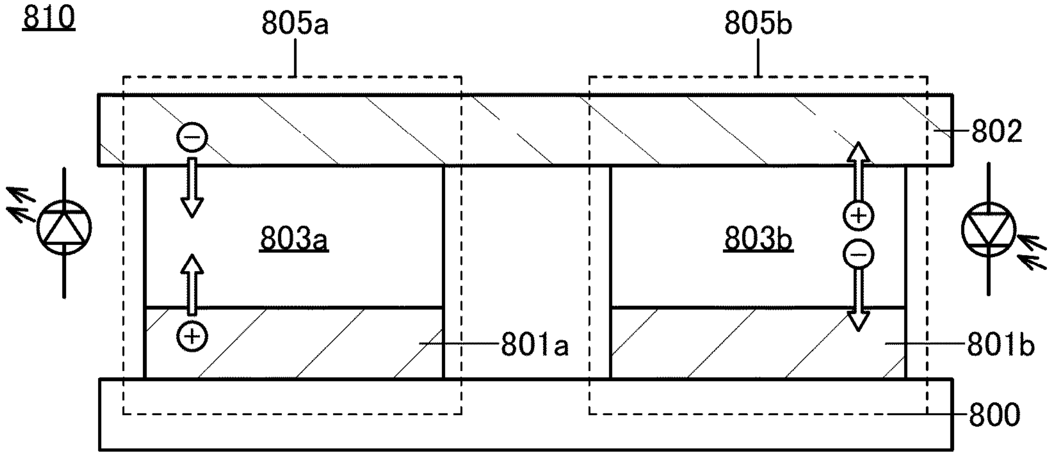

In FIG. 28B, the electrode 801*a* of the light-emitting device 805*a* has a potential higher than the electrode 802. In this case, the electrode 801*a* and the electrode 802 function as an anode and a cathode, respectively, in the light-emitting device 805*a*. The electrode 801*b* of the light-receiving device 805*b* has a potential lower than the electrode 802. For easy understanding of the direction of current flow, FIG. 28B illustrates a circuit symbol of a light-emitting diode on the left in the light-emitting device 805*a* and a circuit symbol of a photodiode on the right in the light-receiving device 805*b*. The flow directions of carriers (electrons and holes) in each device are also schematically indicated by arrows.

In the structure illustrated in FIG. 28B, when a first potential is supplied to the electrode 801*a* through a first wiring, a second potential is supplied to the electrode 802 through a second wiring, and a third potential is supplied to the electrode 801*a* through a third wiring in the light-emitting device 805*a*, the following relationship is satisfied: the first potential>the second potential>the third potential.

Figure 28C:
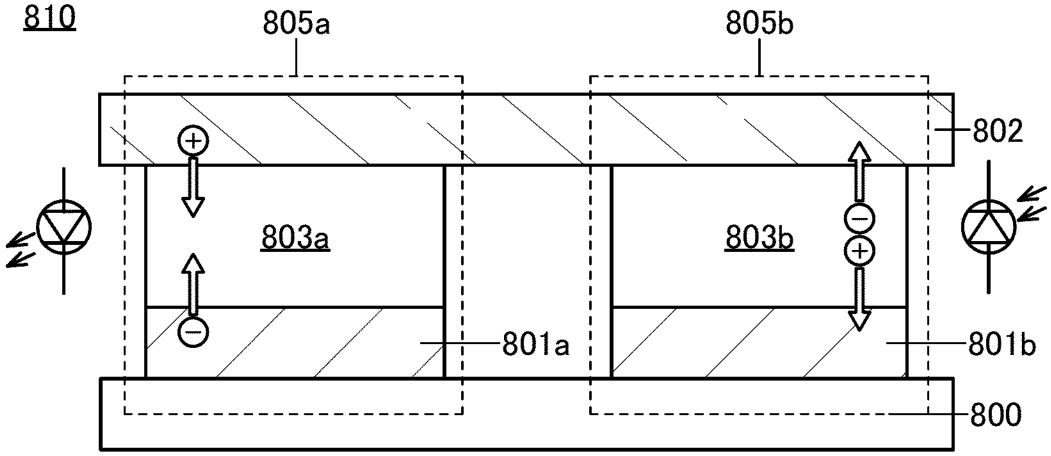

In FIG. 28C, the electrode 801*a* of the light-emitting device 805*a* has a potential lower than the electrode 802. In this case, the electrode 801*a* and the electrode 802 function as a cathode and an anode, respectively, in the light-emitting device 805*a*. The electrode 801*b* of the light-receiving device 805*b* has a potential lower than the electrode 802 and a potential higher than the potential of the electrode 801*a*. For easy understanding of the direction of current flow, FIG. 28C illustrates a circuit symbol of a light-emitting diode on the left in the light-emitting device 805*a* and a circuit symbol of a photodiode on the right in the light-receiving device 805*b*. The flow directions of carriers (electrons and holes) in each device are also schematically indicated by arrows.

In the structure illustrated in FIG. 28C, when a first potential is supplied to the electrode 801*a* through a first wiring, a second potential is supplied to the electrode 802 through a second wiring, and a third potential is supplied to the electrode 801*a* through a third wiring in the light-emitting device 805*a*, the following relationship is satisfied: the second potential>the third potential>the first potential.

The resolution of the light-receiving device 805*b* described in this embodiment can be 100 ppi or higher, preferably 200 ppi or higher, further preferably 300 ppi or higher, still further preferably 400 ppi or higher, and still further preferably 500 ppi or higher, and 2000 ppi or lower, 1000 ppi or lower, or 600 ppi or lower, for example. In particular, when the resolution of the light-receiving device 805*b* is 200 ppi or higher and 600 ppi or lower, preferably 300 ppi or higher and 600 ppi or lower, the display device of one embodiment of the present invention can be suitably applied to image capturing of fingerprints. In fingerprint authentication with the display device of one embodiment of the present invention, the increased resolution of the light-receiving device 805*b* enables, for example, high accuracy extraction of the minutiae of fingerprints; thus, the accuracy of the fingerprint authentication can be increased. The resolution is preferably 500 ppi or higher, in which case the authentication conforms to the standard by the National Institute of Standards and Technology (NIST) or the like. On the assumption that the resolution of the light-receiving device is 500 ppi, the size of each pixel is 50.8 μm, which is adequate for image capturing of a fingerprint ridge distance (typically, from 300 μm to 500 μm, inclusive).

Example 1

In this example, two kinds of materials were used and one or two of the materials was/were deposited over a glass substrate, whereby samples with different film structures (e.g., a single-layer film, a stacked-layer film, and a mixed film) were formed. The samples were subjected to heat resistance test. Thermophysical properties of the materials used in this example are listed in Table 1, and the chemical formulae thereof are shown below.

TABLE 1

| Material | Tg (° C.) | Tc (° C.) | Tm (° C.) |
|---|---|---|---|
| NBPhen | 165 | 323 (in decreasing temperature) | 354 |
| 2mpPCBPDBq | 125 | — | — |

*Tg: glass transition temperature (° C.),
Tc: crystallization temperature (° C.),
Tm: melting point (° C.)

[Chemical formula 5]

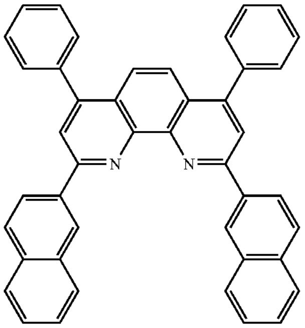

NBPhen

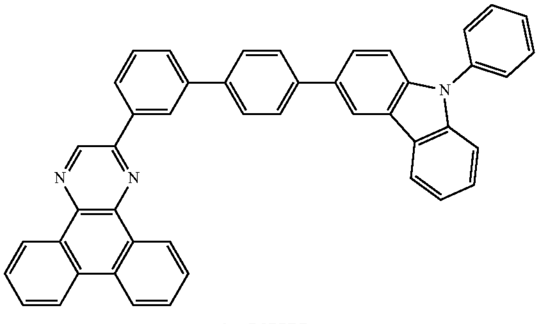

2mpPCBPDBq

The samples (Samples 1 to 4) were formed as described below.

First, a sample layer was formed over a glass substrate with a vacuum oven, and cut into square shapes of 2 cm×2 cm to form the samples. Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 150° C. After one hour passed, the substrate was cooled down to 40° C. and placed in the air, and then the samples were taken out with tweezers.

The sample layer of Sample 1 was a single-layer film of one kind of heteroaromatic compound, which was formed by evaporation of 2,9-di(2-naphthyl)-4,7-diphenyl-1,10-phenanthroline (abbreviation: NBPhen) to a thickness of 10 nm over the glass substrate.

The sample layer of Sample 2 was a single-layer film of one kind of heteroaromatic compound, which was formed by evaporation of 2-[4'-(9-phenyl-9H-carbazol-3-yl)-3,1'-biphenyl-1-yl]dibenzo[f,h]quinoxaline (abbreviation: 2mpPCBPDBq) to a thickness of 10 nm over the glass substrate.

The sample layer of Sample 3 was a stacked-layer film of a plurality of heteroaromatic compounds, which was formed by evaporation of 2mpPCBPDBq to a thickness of 10 nm and then evaporation of NBPhen to a thickness of 10 nm over the glass substrate.

The sample layer of Sample 4 was a single-layer film obtained by a plurality of heteroaromatic compounds, which was formed to a thickness of 20 nm by co-evaporation of 2mpPCBPDBq and NBPhen over the glass substrate such that the weight ratio of 2mpPCBPDBq to NBPhen was 0.5:0.5.

Samples formed by such a method were observed visually and with an optical microscope (MX61L semiconductor/FPD inspection microscope, Olympus Corporation).

FIGS. 17A to 17D show photographs of the samples formed in this example (dark field observation at a magnification of 100 times).

The structures of the samples and the results based on FIGS. 17A to 17D are shown in Table 2. In Table 2, the circle mark represents no crystal generation (not crystallized), the triangle mark represents slight crystal generation (slightly crystallized), and the cross mark represents crystal generation (crystallized).

crystallized at a low temperature. Thus, it is found that the mixed material containing a plurality of heteroaromatic compounds, which is one embodiment of the present invention, can have improved heat-resistance, even when the mixed material includes a material having a low crystallization temperature in a single-layer film.

According to Table 2 showing the results of the sample 1 (NBPhen) and the sample 2 (2mpPCBPDBq) each formed as a single-layer film, both NBPhen and 2mpPCBPDBq used in this example, are crystallized at temperatures lower than their glass transition temperatures (Tg) shown in Table 1. In other words, the crystallization phenomenon that rarely occurs at a temperature lower than the glass transition temperature is found to be caused by the formation of the material into a film thin enough to fabricate a light-emitting device or an organic semiconductor device (a film with a thickness of 1 μm or less, such as an organic thin film with a thickness of 1 nm to 100 nm). Furthermore, the sample 3 of 2mpPCBPDBq\NBPhen which is a stacked-layer film is found to be crystallized at a further lower temperature (100° C.). These indicate that crystallization at a temperature lower than Tg was promoted by the interaction between molecules of 2mpPCBPDBq and NBPhen. In contrast, it is found that in the single-layer film obtained by mixing the two kinds of heteroaromatic compounds (Sample 4, 2mpPCBPDBq:NBPhen), the single-layer film was not crystallized without being affected by 2mpPCBPDBq even when heat-resistance test was conducted at a high temperature (150° C.).

Therefore, in the mixed material including a plurality of heteroaromatic compounds, which is one embodiment of the present invention, a crystallization phenomenon at a temperature lower than Tg of the heteroaromatic compounds included in the mixed material is inhibited and a stable

TABLE 2

| Sample NO. | Structure | rt | 80° C. | 100° C. | 110° C. | 120° C. | 130° C. | 140° C. | 150° C. |
|---|---|---|---|---|---|---|---|---|---|
| 1 | NBPhen (10 nm) | ○ | ○ | ○ | ○ | ○ | ○ | Δ | Δ |
| 2 | 2mpPCBPDBq (10 nm) | ○ | ○ | ○ | Δ or X | Δ or X | — | — | — |
| 3 | 2mpPCBPDBq (10 nm)\NBPhen (10 nm) | ○ | ○ | X | X | X | — | — | — |
| 4 | 2mpPCBPDBq:NBPhen (0.5:0.5) (20 nm) | ○ | ○ | ○ | ○ | ○ | ○ | ○ | ○ |

*rt: room temperature

○: not crystallized, Δ: slightly crystallized, X: crystallized (turbid)

As shown with the above results, it is found that the single film of one kind of heteroaromatic compound (Sample 1, NBPhen) can be formed as a thin film that is not crystallized up to high temperature (crystallized at around 140° C.) and has relatively high heat resistance, while the stacked-layer film (Sample 3, 2mpPCBPDBq\NBPhen) is crystallized at low temperature (100° C.). In contrast, the single film obtained by mixing two kinds of heteroaromatic compounds (Sample 4, 2mpPCBPDBq:NBPhen) is found not to be crystallized up to the higher temperature (150° C.), compared with the stacked-layer film (Sample 3, 2mpPCBPDBq\NBPhen) and the single film of one kind of heteroaromatic compound (Sample 1, NBPhen).

This means that the single-layer film of a mixed material obtained by mixing a plurality of heteroaromatic compounds, which is one embodiment of the present invention, can have a higher crystallization temperature as a result of mixing the plurality of materials to form the single-layer film, even if a single-layer film of each of the materials is glassy state film can be maintained in formation of a thin film. Thus, the mixed material of one embodiment of the present invention can be said to be a high heat-resistance material. With the use of the thin film having high heat resistance, a light-emitting device or an organic semiconductor device having high heat resistance can be provided.

Example 2

In this example, two kinds of materials were used and one or two of them was/were deposited over a glass substrate, whereby samples with different film structures (e.g., a single-layer film and a mixed film) were formed. The samples were subjected to heat resistance tests. Thermophysical properties of the materials used in this example are listed in Table 3, and the chemical formulae thereof are shown below.

TABLE 3

| Material | Tg (° C.) | Tc (° C.) | Tm (° C.) |
|---|---|---|---|
| ZADN | 169 | 270 | 349 |
| mFBPTzn | 95 | — | — |

*Tg: glass transition temperature (° C.),
Tc: crystallization temperature (° C.),
Tm: melting point (° C.)

[Chemical formula 6]

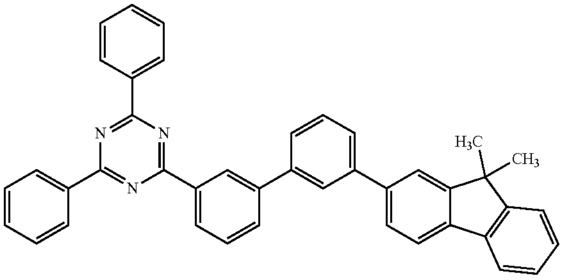

mFBPTzn

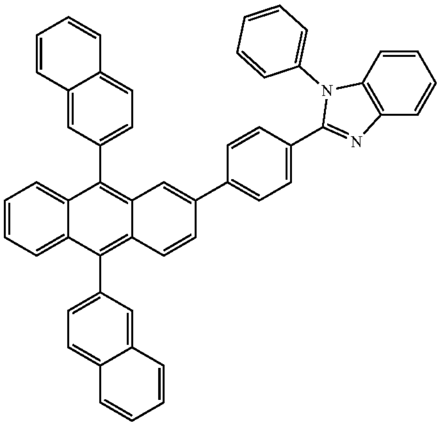

ZADN

The samples (samples 5 to 7) were formed as described below.

First, a sample layer was formed over a glass substrate with a vacuum oven, and cut into square shapes of 2 cm×2 cm to form the samples. Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 150° C. After one hour passed, the substrate was cooled down to 40° C. and placed in the air, then the samples were taken out with tweezers.

The sample layer of Sample 5 was a single-layer film of one kind of heteroaromatic compound, which was formed by evaporation of 2-{4-[9,10-di(2-naphthyl)-2-anthryl]phenyl}-1-phenyl-1H-benzimidazole (abbreviation: ZADN) to a thickness of 25 nm over the glass substrate.

The sample layer of Sample 6 was a single-layer film of one kind of heteroaromatic compound, which was formed by evaporation of 2-[3'-(9,9-dimethyl-9H-fluoren-2-yl)biphenyl-3-yl]-4,6-diphenyl-1,3,5-triazine (abbreviation: mFBPTzn) to a thickness of 5 nm over the glass substrate.

The sample layer of Sample 7 was a single-layer film obtained by mixing a plurality of heteroaromatic compounds, which was formed to a thickness of 5 nm by co-evaporation of mFBPTzn and ZADN over the glass substrate such that the weight ratio of mFBPTzn to ZADN was 0.5:0.5.

The samples formed by such a method were observed visually and with an optical microscope (MX61L semiconductor/FPD inspection microscope, Olympus Corporation).

Figure 18A:
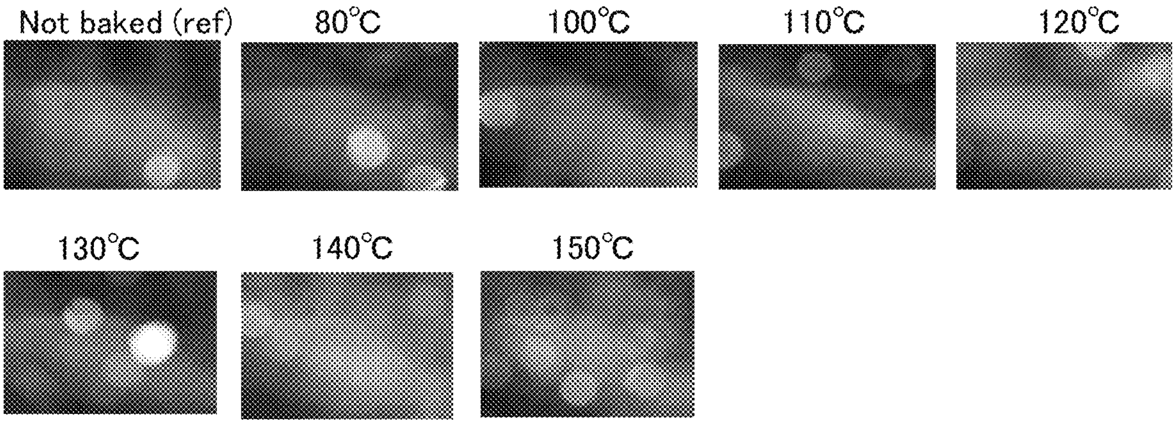
FIGS. 18A to 18C show photographs according to an example.
Figure 18B:
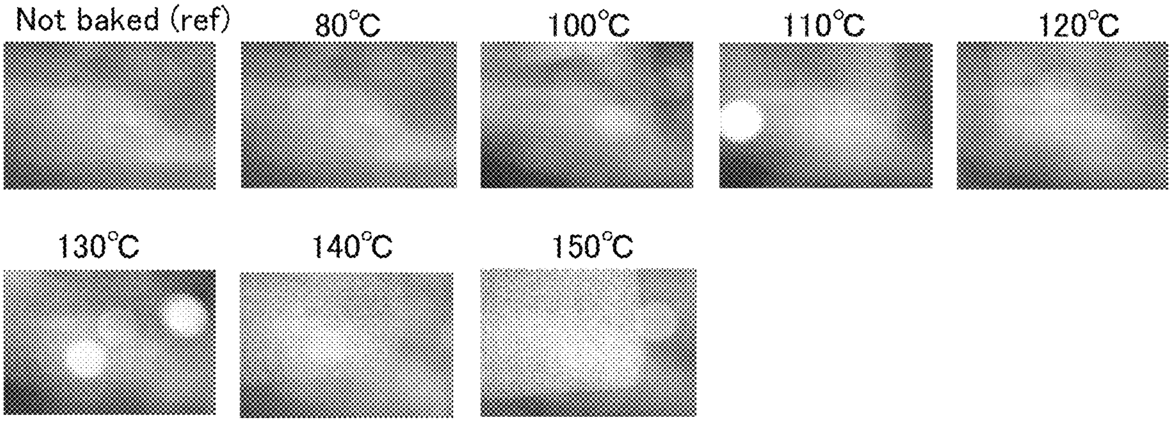
Figure 18C:
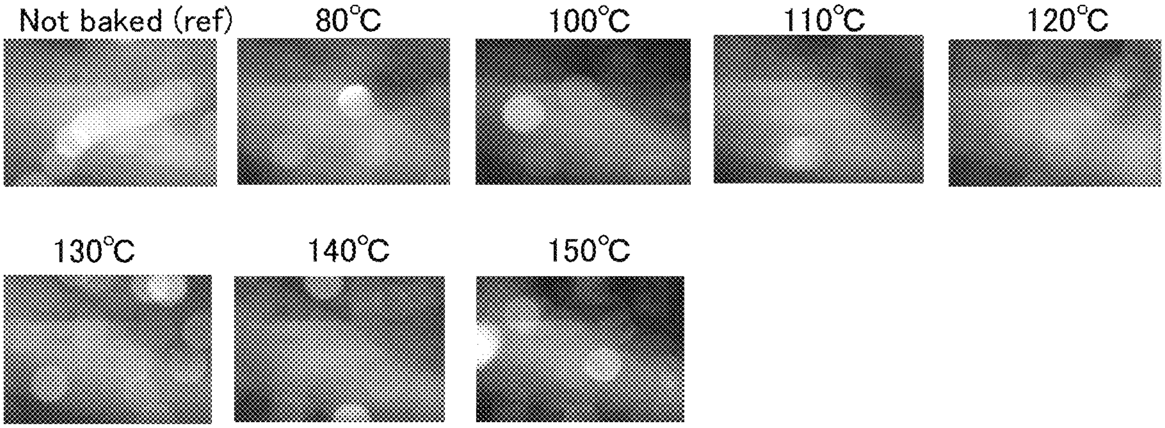

FIGS. 18A to 18C show photographs of the samples formed in this example (dark field observation at a magnification of 100 times).

The structures of the samples and the results based on FIGS. 18A to 18C are shown in Table 4. In Table 4, circles represent no crystal generation (not crystallized), triangles represent slight crystal generation (slightly crystallized), and x represents crystal generation (crystallized).

TABLE 4

| Sample NO. | Structure | rt | 80° C. | 100° C. | 110° C. | 120° C. | 130° C. | 140° C. | 150° C. |
|---|---|---|---|---|---|---|---|---|---|
| 5 | ZADN (25 nm) | ○ | ○ | ○ | ○ | ○ | ○ | ○ | ○ |
| 6 | mFBPTzn (5 nm) | ○ | ○ | X | X | X | X | X | X |
| 7 | mFBPTzn:ZADN (1:1) (5 nm) | ○ | ○ | ○ | ○ | ○ | ○ | ○ | ○ |

*rt: room temperature

○: not crystallized, X: crystallized (turbid)

The above result shows that the single-layer film formed of a heteroaromatic compound (Sample 5, ZADN) was a relatively high heat-resistance thin film without being crystallized even at a high temperature (150° C.); on the other hand, the single film formed of a heteroaromatic compound (Sample 6, mFBPTzn) was entirely crystallized at a low temperature (100° C.). In contrast, the single-layer film obtained by mixing the two heteroaromatic compounds (Sample 7, mFBPTzn:ZADN) was not affected by mFBPTzn and was not crystallized even when the film was subjected to heat-resistance test at a high temperature (150° C.).

This means that the single-layer film of a mixed material obtained by mixing a plurality of heteroaromatic compounds, which is one embodiment of the present invention, can have a higher crystallization temperature as a result of mixing the plurality of materials to form the single-layer film, even if a single-layer film of each of the materials is crystallized at a low temperature. Thus, it is found that the mixed material containing a plurality of heteroaromatic compounds, which is one embodiment of the present invention, can have improved heat-resistance, even when the mixed material includes a material having a low crystallization temperature in a single-layer film.

Therefore, in the mixed material including a plurality of heteroaromatic compounds, which is one embodiment of the present invention, a crystallization phenomenon at a temperature lower than Tg of the heteroaromatic compounds included in the mixed material is inhibited and a stable glassy state film can be maintained in formation of a thin film. Thus, the mixed material of one embodiment of the present invention can be said to be a high heat-resistance material. With the use of the thin film having high heat resistance, a light-emitting device or an organic semiconductor device having high heat resistance can be provided.

Example 3

In this example, two kinds of materials were used and one or two of them were deposited over a glass substrate, whereby samples with different film structures (e.g., a single-layer film and a mixed film) were formed. The samples were subjected to heat resistance tests. Thermophysical properties of the materials used in this example are listed in Table 5, and the chemical formulae thereof are shown below.

TABLE 5

| Material | Tg (° C.) | Tc (° C.) | Tm (° C.) |
|---|---|---|---|
| NBPhen | 165 | 323 (in decreasing temperature) | 354 |
| TmPPPyTz | 83 | — | 241 |

*Tg: glass transition temperature (° C.),

Tc: crystallization temperature (° C.),

Tm: melting point (° C.)

[Chemical formula 7]

TABLE 5-continued

| Material | Tg (° C.) | Tc (° C.) | Tm (° C.) |
|---|---|---|---|
| 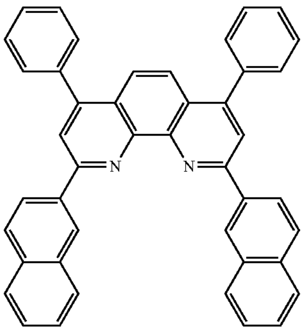 NBPhen | | | |
| 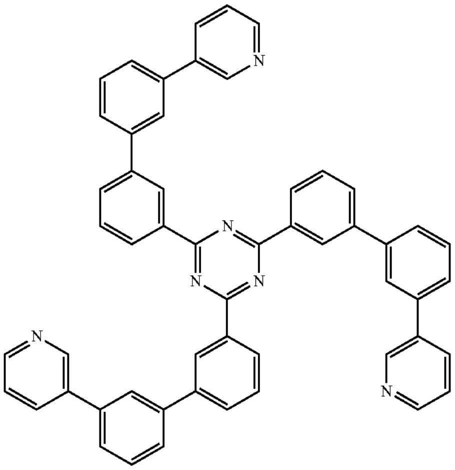 TmPPPyTz | | | |

The samples (samples 8 to 10) were formed as described below.

First, a sample layer was formed over a glass substrate with a vacuum oven, and cut into square shapes of 2 cm×2 cm to form the samples. Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 150° C. After one hour passed, the substrate was cooled down to 40° C. and placed in the air, then the samples were taken out with tweezers.

The sample layer of Sample 8 was a single-layer film of one kind of heteroaromatic compound, which was formed by evaporation of NBPhen to a thickness of 10 nm over the glass substrate.

The sample layer of Sample 9 was a single-layer film of one kind of heteroaromatic compound, which was formed by evaporation of 2,4,6-tris(3'-(pyridine-3-yl)biphenyl-3-yl)-1,3,5-triazine (abbreviation: TmPPPyTz) to a thickness of 35 nm over the glass substrate.

The sample layer of Sample 10 was a single-layer film obtained by mixing a plurality of heteroaromatic compounds, which was formed to a thickness of 35 nm by co-evaporation of TmPPPyTz and NBPhen over the glass substrate such that the weight ratio of TmPPPyTz to NBPhen was 1:1.

The samples formed by such a method were observed visually and with an optical microscope (MX61L semiconductor/FPD inspection microscope, Olympus Corporation).

Figure 19A:
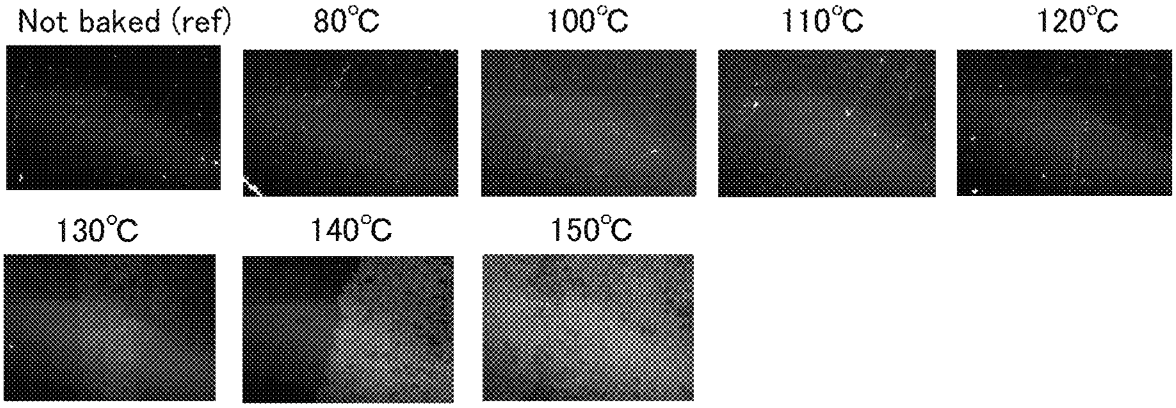
FIGS. 19A to 19C show photographs according to an example.
Figure 19B:
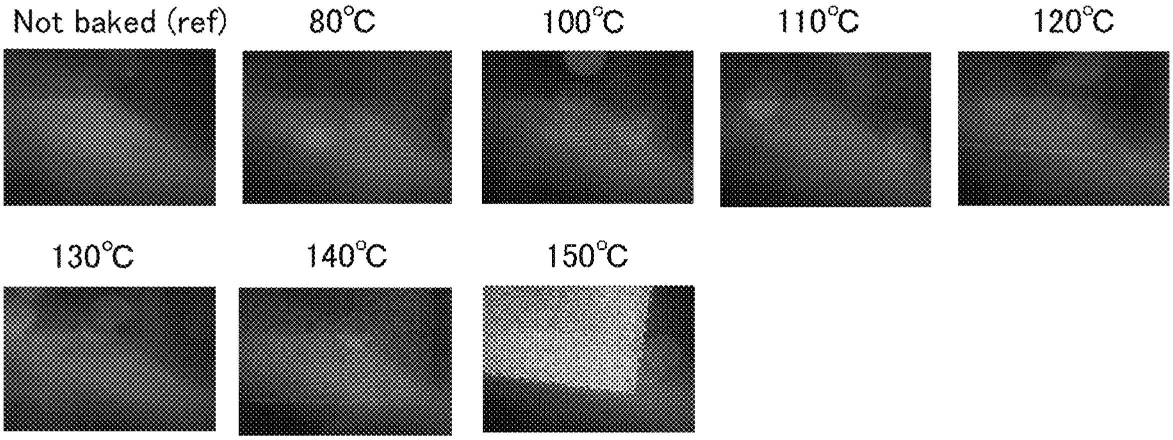
Figure 19C:
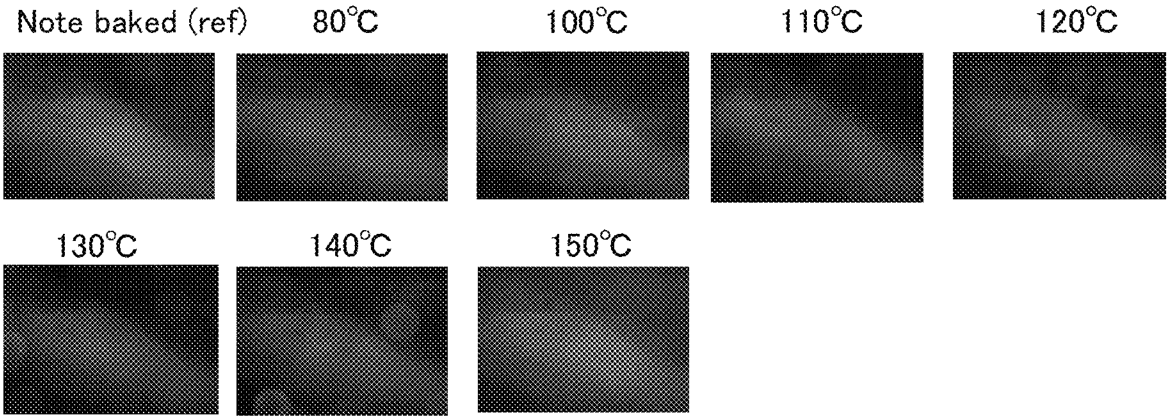

FIGS. 19A to 19C show photographs of the samples formed in this example (dark field observation at a magnification of 100 times).

The structures of the samples and the results based on FIGS. 19A to 19C are shown in Table 6. In Table 6, circles represent no crystal generation (not crystallized), white triangles represent slight crystal generation (slightly crystallized), x represents crystal generation (crystallized), and black triangles represent crystallization of only an edge (crystallized at edge only).

TABLE 6

| Sample NO. | Structure | rt | 80° C. | 100° C. | 110° C. | 120° C. | 130° C. | 140° C. | 150° C. |
|---|---|---|---|---|---|---|---|---|---|
| 8 | NBPhen (10 nm) | ○ | ○ | ○ | ○ | ○ | ○ | Δ | Δ |
| 9 | TmPPPyTz (35 nm) | ○ | ○ | ▲ | ▲ | ▲ | X | X | X |
| 10 | TmPPPyTz:NBPhen (1:1) (35 nm) | ○ | ○ | ○ | ○ | ○ | ○ | ○ | ○ |

*rt: room temperature
○: not crystallized, Δ: slightly crystallized, X: crystallized (turbid), ▲: crystallized at edge only The above result shows that the single-layer film formed of a heteroaromatic compound (Sample 8, NBPhen) was a relatively high heat-resistance thin film without being crystallized even at a high temperature (130° C.); on the other hand, an edge (end portion) of the single-layer film formed of a heteroaromatic compound (Sample 9, TmPPPyTz) was crystallized at a low temperature (100° C.) or higher. In contrast, the single-layer film obtained by mixing the two heteroaromatic compounds (Sample 10, TmPPPyTz:NBPhen) was not affected by TmPPPyTz and was not crystallized even when the film was subjected to heat-resistance test at a high temperature (150° C.).

This means that the single-layer film of a mixed material obtained by mixing a plurality of heteroaromatic compounds, which is one embodiment of the present invention, can have a higher crystallization temperature as a result of mixing the plurality of materials to form the single-layer film, even if a single-layer film of each of the materials is crystallized at a low temperature. Thus, it is found that the mixed material containing a plurality of heteroaromatic compounds, which is one embodiment of the present invention, can have improved heat-resistance, even when the mixed material includes a material having a low crystallization temperature in a single-layer film.

In addition, the single-layer film of the heteroaromatic compound (Sample 8, NBPhen) was crystallized at a temperature lower than the glass transition temperature (Tg) in Table 5, in the result shown in Table 6. In other words, the crystallization phenomenon that rarely occurs at a temperature lower than the glass transition temperature is found to be caused by the formation of the material into a film thin enough to fabricate a light-emitting device or an organic semiconductor device (a film with a thickness of 1 μm or less, such as an organic thin film with a thickness of 1 nm to 100 nm). In contrast, the film obtained by mixing the two heteroaromatic compounds (Sample 10, TmPPPyTz:NBPhen) was not affected by TmPPPyTz and was not crystallized even when the film was subjected to heat-resistance test at a high temperature (150° C.). The temperature is significantly higher than the glass transition temperature (Tg) of TmPPPyTz.

Therefore, in the mixed material including a plurality of heteroaromatic compounds, which is one embodiment of the present invention, a crystallization phenomenon at a temperature lower than Tg of the heteroaromatic compounds included in the mixed material is inhibited and a stable glassy state film can be maintained in formation of a thin film. Thus, the mixed material of one embodiment of the present invention can be said to be a high heat-resistance material. With the use of the thin film having high heat resistance, a light-emitting device or an organic semiconductor device having high heat resistance can be provided.

Example 4

The result of Example 3 shows that a single-layer film of the mixed material for a light-emitting device, which is one embodiment of the present invention, can have improved heat resistance as compared with a single-layer film formed of a single material included in the mixed material for a light-emitting device. Accordingly, the following light-emitting devices were fabricated and the characteristics of the light-emitting devices were compared: a light-emitting device 1 including an electron-transport layer formed using the mixed material for a light-emitting device of one embodiment of the present invention and comparative light-emitting devices 2 and 3 each including an electron-transport layer formed using a single material included in the mixed material for a light-emitting device. The device structures and their characteristics are described below. Table 7 shows specific structures of the light-emitting device 1 and the comparative light-emitting devices 2 and 3 used in this example. The chemical formulae of materials used in this example are shown below.

TABLE 7

| | First electrode | Hole-injection layer | Hole-transport layer | | Light-emitting layer | Electron-transport layer | | Electron-injection layer | Second electrode |
|---|---|---|---|---|---|---|---|---|---|
| Light-emitting device 1 | ITSO (70 nm) | PCBBiF: OCHD-003 (1:0.03 10 nm) | PCBBiF (40 nm) | PCBBi1BP (10 nm) | * | 8BP-4mDBtPBfpm (10 nm) | TmPPPyTz: NBPhen (1:1 20 nm) | LiF (1 nm) | Al (200 nm) |
| Comparative light-emitting device 2 | | | | | | | NBphen (20 nm) | | |

TABLE 7-continued
| | First electrode | Hole-injection layer | Hole-transport layer | Light-emitting layer | Electron-transport layer | Electron-injection layer | Second electrode |
|---|---|---|---|---|---|---|---|
| Comparative light-emitting device 3 | | | | | TmPPPyTz (20 nm) | | |
* 8BP-4mDBtPBfpm:βNCCP:[Ir(ppy)$_2$(4dppy)] (0.4:0.6:0.05 50 nm)
[Chemical formula 8]
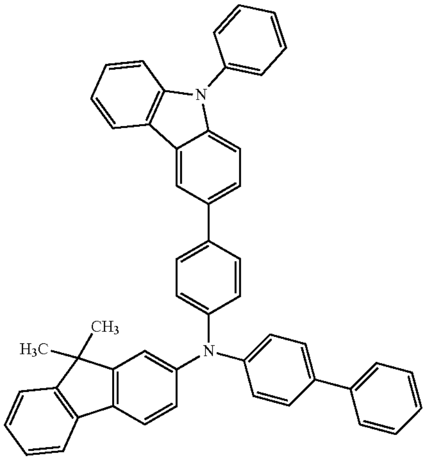
PCBBiF
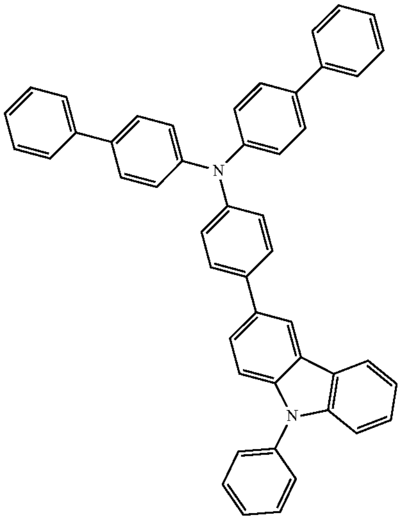
PCBBi1BP
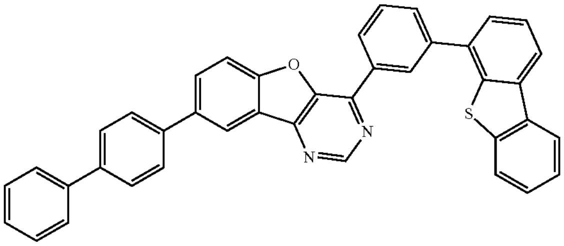
8BP-4mDByPBfpm TABLE 7-continued

| | First electrode | Hole-injection layer | Hole-transport layer | Light-emitting layer | Electron-transport layer | Electron-injection layer | Second electrode |
|---|---|---|---|---|---|---|---|

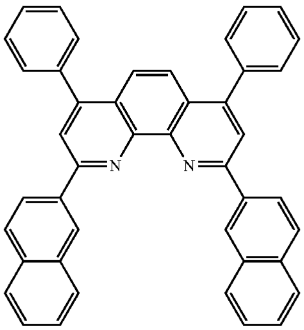

NBPhen

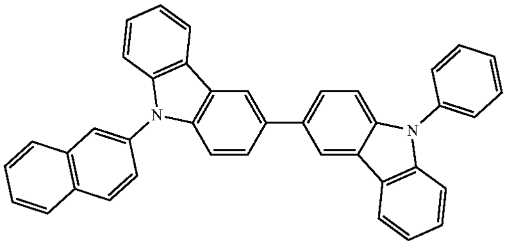

β NCCP

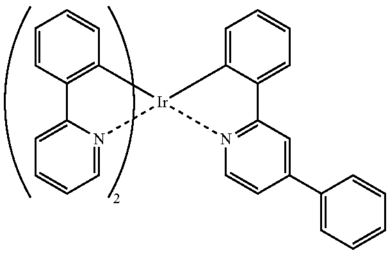

$[Ir(ppy)_2(4dppy)]$

<<Fabrication of Light-Emitting Devices>>

Figure 20:
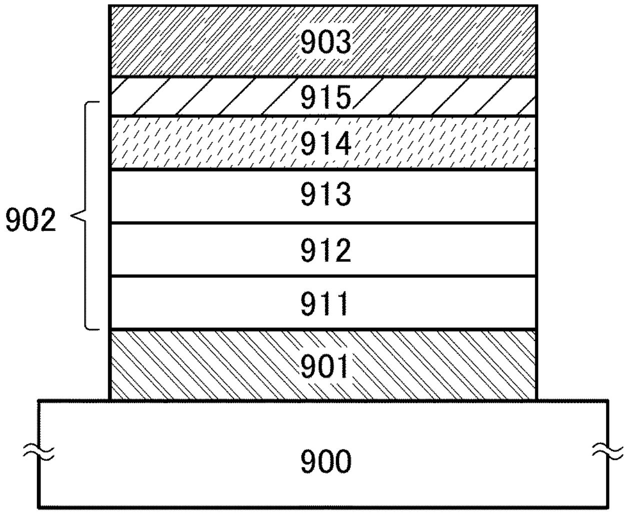
FIG. 20 illustrates a structure of a light-emitting device according to an example.
Figure 21:
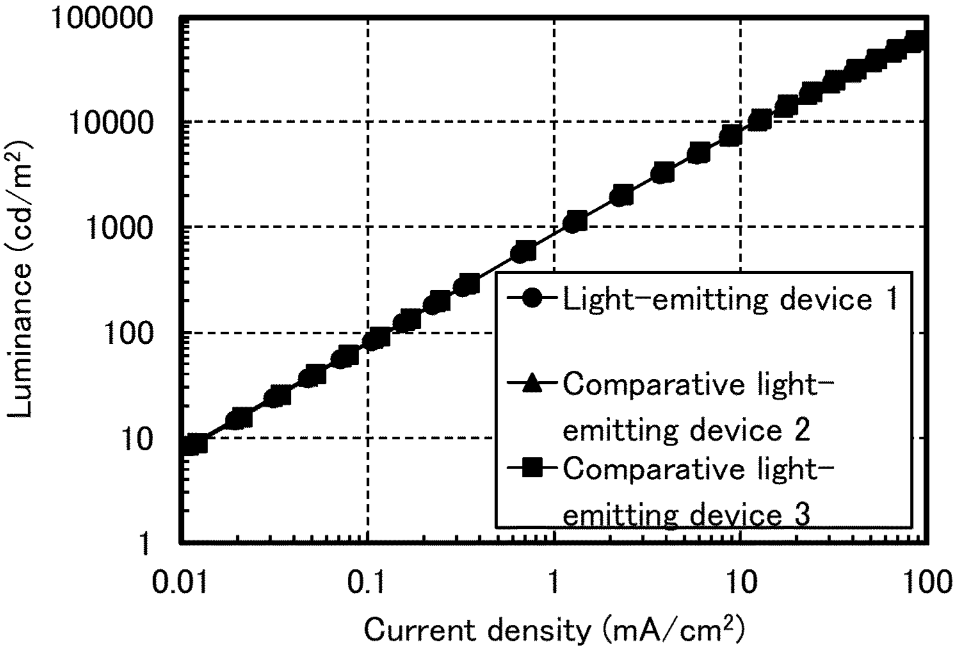
FIG. 21 shows luminance-current density characteristics of a light-emitting device 1, a comparative light-emitting device 2, and a comparative light-emitting device 3.
Figure 22:
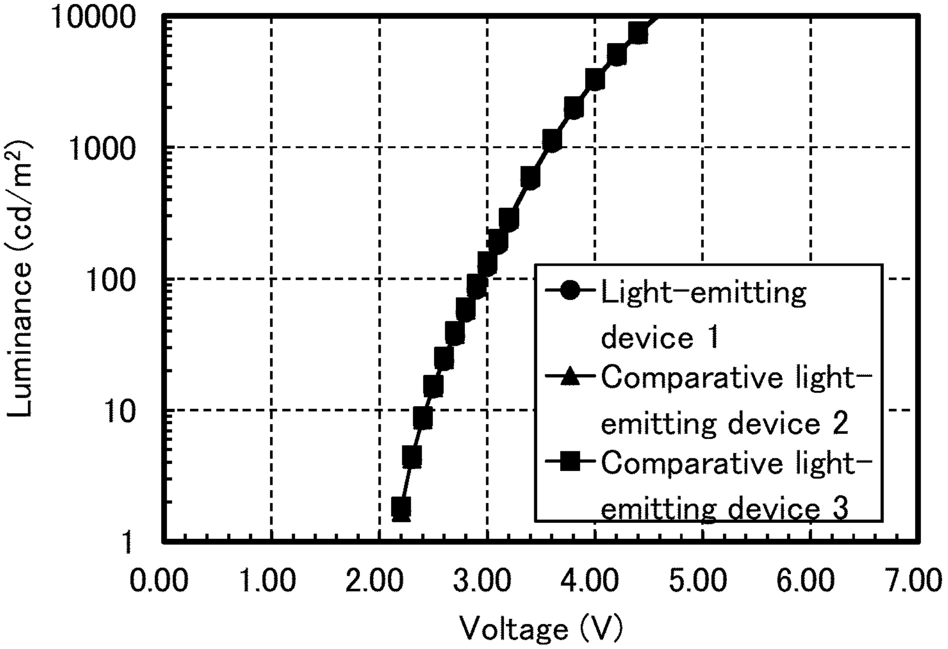
FIG. 22 shows luminance-voltage characteristics of the light-emitting device 1, the comparative light-emitting device 2, and the comparative light-emitting device 3.
Figure 23:
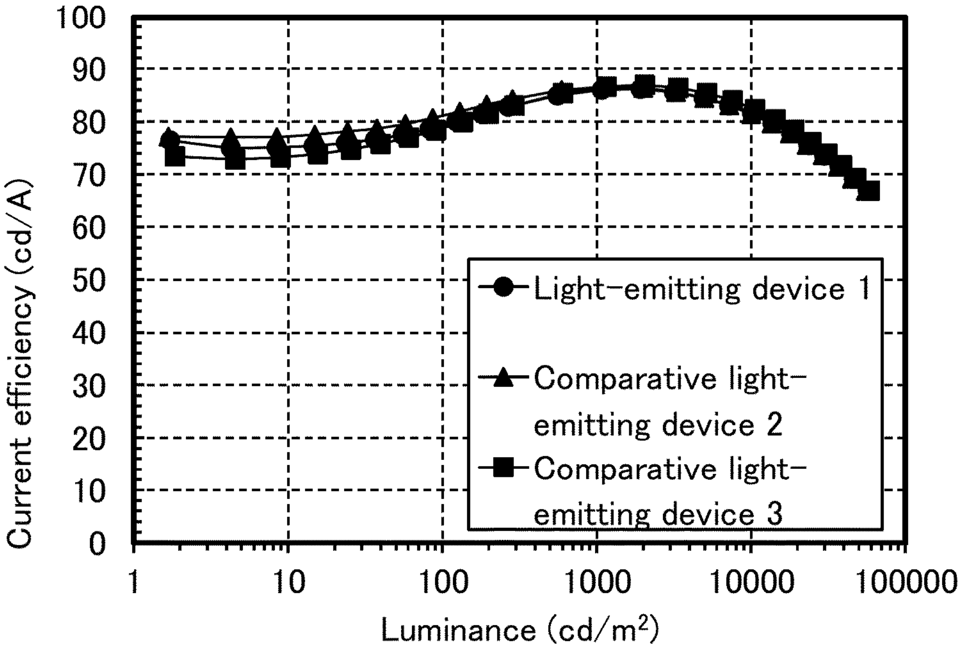
FIG. 23 shows current efficiency-luminance characteristics of the light-emitting device 1, the comparative light-emitting device 2, and the comparative light-emitting device 3.
Figure 24:
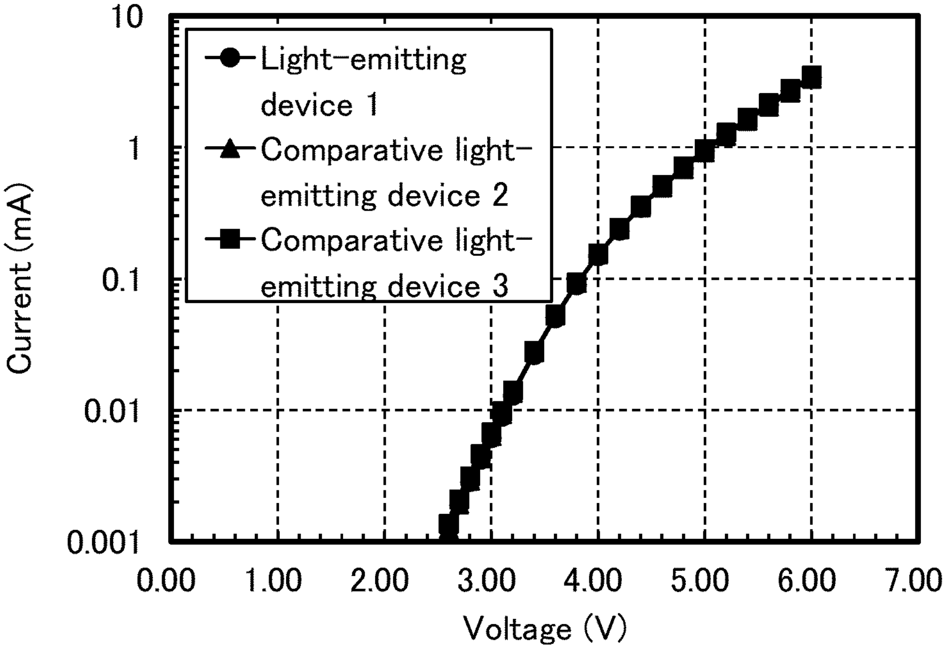
FIG. 24 shows current-voltage characteristics of the light-emitting device 1, the comparative light-emitting device 2, and the comparative light-emitting device 3.
Figure 25:
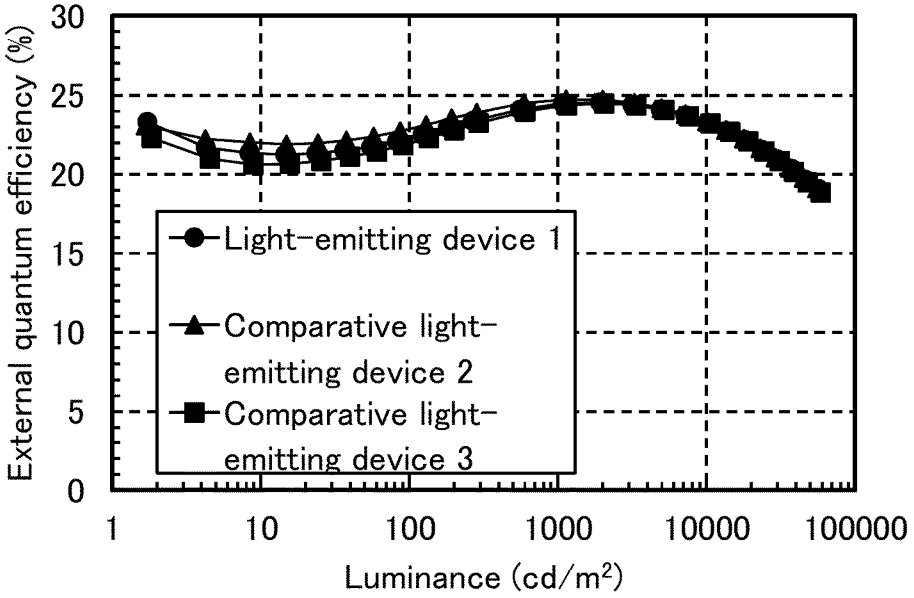
FIG. 25 shows external quantum efficiency-luminance characteristics of the light-emitting device 1, the comparative light-emitting device 2, and the comparative light-emitting device 3.
Figure 26:
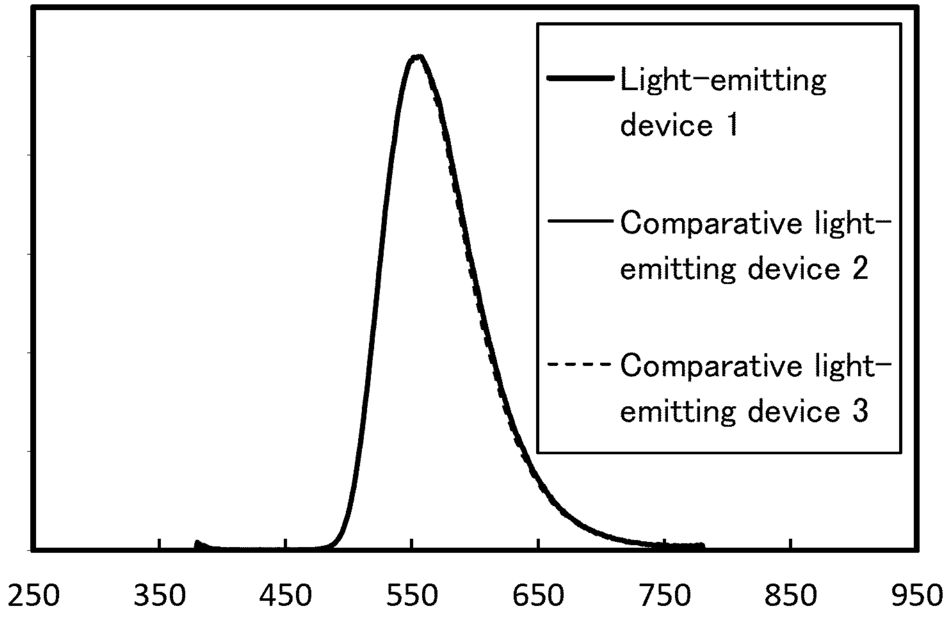
FIG. 26 shows emission spectra of the light-emitting device 1, the comparative light-emitting device 2, and the comparative light-emitting device 3.

In the light-emitting devices described in this example, as illustrated in FIG. 20, a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915.

First, the first electrode 901 was formed over the substrate 900. The electrode area was set to 4 $mm^2$ (2 mm×2 mm). A glass substrate was used as the substrate 900. The first electrode 901 was formed to a thickness of 70 nm using indium tin oxide containing silicon oxide (ITSO) by a sputtering method.

For pretreatment, a surface of the substrate was washed with water, baking was performed at 200° C. for 1 hour, and then UV ozone treatment was performed for 370 seconds. After that, the substrate was transferred into a vacuum evaporation apparatus where the pressure was reduced to approximately $1\times10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 911 was formed over the first electrode 901. The hole-injection layer 911 was formed in such a manner that the pressure in the vacuum evaporation apparatus was reduced to $1\times10^{-4}$ Pa, and then N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) and an electron acceptor material (OCHD-003) that contains fluorine and has a molecular weight of 672 were deposited by co-evaporation to a thickness of 10 nm in a weight ratio of PCBBiF:OCHD-003=1:0.03.

Then, the hole-transport layer 912 was formed over the hole-injection layer 911. The hole-transport layer 912 was formed to a thickness of 40 nm by evaporation of PCBBiF and to a thickness of 10 nm by evaporation of 4,4'-diphenyl-4''-(9-phenyl-9H-carbazol-3-yl)triphenylamine (abbreviation: PCBBi1BP).

Next, the light-emitting layer 913 was formed over the hole-transport layer 912.

The light-emitting layer 913 was formed to a thickness of 50 nm by co-evaporation of 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'- phenyl-9H,9'H-3,3'-bicarbazole (abbreviation: PNCCP), and bis[2-(2-pyridinyl-κN)phenyl-κC][2-(4-phenyl-2-pyridinyl-κN)phenyl-κC]iridium(III) (abbreviation: [Ir(ppy)$_2$ (4dppy)]) such that the weight ratio of 8BP-4mDBtPBfpm to PNCCP and [Ir(ppy)$_2$(4dppy)] were 0.4:0.6:0.05.

Next, the electron-transport layer 914 was formed over the light-emitting layer 913. Note that in this example, the electron-transport layer 914 has a stacked-layer structure of the first electron-transport layer 914-1 and the second electron-transport layer 914-2.

In the light-emitting element 1, the first electron-transport layer 914-1 was formed to a thickness of 10 nm by evaporation of 8BP-4mDBtPBfpm, and then the second electron-transport layer 914-2 was formed to a thickness of 20 nm by co-evaporation of 2,4,6-tris[3'-(pyridin-3-yl)biphenyl-3-yl]-1,3,5-triazine (abbreviation: TmPPPyTz) and 2,9-di(2-naphthyl)-4,7-diphenyl-1,10-phenanthroline (abbreviation: NBPhen) such that the weight ratio of TmPPPyTz to NBPhen was 1:1.

In the comparative light-emitting device 2, the first electron-transport layer 914-1 was formed to a thickness of 10 nm by evaporation of 8BP-4mDBtPBfpm, and then the second electron-transport layer 914-2 was formed to a thickness of 20 nm by evaporation of NBPhen.

In the comparative light-emitting device 3, the first electron-transport layer 914-1 was formed to a thickness of 10 nm by evaporation of 8BP-4mDBtPBfpm, and then the second electron-transport layer 914-2 was formed to a thickness of 20 nm by evaporation of TmPPPyTz.

Then, the electron-injection layer 915 was formed over the electron-transport layer 914. The electron-injection layer 915 was formed to a thickness of 1 nm by evaporation of lithium fluoride (LiF).

After that, the second electrode 903 was formed over the electron-injection layer 915. The second electrode 903 was formed to a thickness of 200 nm by evaporation of aluminum. In this example, the second electrode 903 functions as a cathode.

Through the above steps, the light-emitting device 1 including the EL layer between the pair of electrodes was formed over the substrate 900. Note that the hole-injection layer 911, the hole-transport layer 912, the light-emitting layer 913, the electron-transport layer 914, and the electron-injection layer 915 described above are functional layers forming the EL layer in one embodiment of the present invention. Furthermore, in all the evaporation steps in the above fabrication method, evaporation was performed by a resistance-heating method.

The fabricated light-emitting device 1 was sealed in a glove box with a nitrogen atmosphere so as not to be exposed to the air (specifically, a sealant was applied to surround the element, and at the time of sealing, UV treatment was performed and then heat treatment was performed at 80° C. for 1 hour).

<<Operation Characteristics of Light-Emitting Devices>>

FIG. 21, FIG. 22, FIG. 23, FIG. 24, FIG. 25, and FIG. 26 show the luminance-current density characteristics, the luminance-voltage characteristics, the current efficiency-luminance characteristics, the current-voltage characteristics, the external quantum efficiency-luminance characteristics, and the emission spectra, respectively, of the light-emitting device 1, the comparative light-emitting device 2 and the comparative light-emitting device 3. Table 8 shows the main characteristics of the light-emitting device 1, the comparative light-emitting device 2, and the comparative light-emitting device 3 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

TABLE 8

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 1 | 3.6 | 0.054 | 1.3 | (0.43, 0.56) | 1100 | 86 | 75 | 24 |
| Comparative light-emitting device 2 | 3.6 | 0.052 | 1.3 | (0.43, 0.56) | 1100 | 87 | 76 | 25 |
| Comparative light-emitting device 3 | 3.6 | 0.053 | 1.3 | (0.42, 0.56) | 1200 | 87 | 76 | 24 |

The results in FIG. 21 to FIG. 26 and Table 8 show that the light-emitting device 1 of one embodiment of the present invention has operation characteristics equivalent to those of the comparative light-emitting devices 2 and 3.

Figure 27:
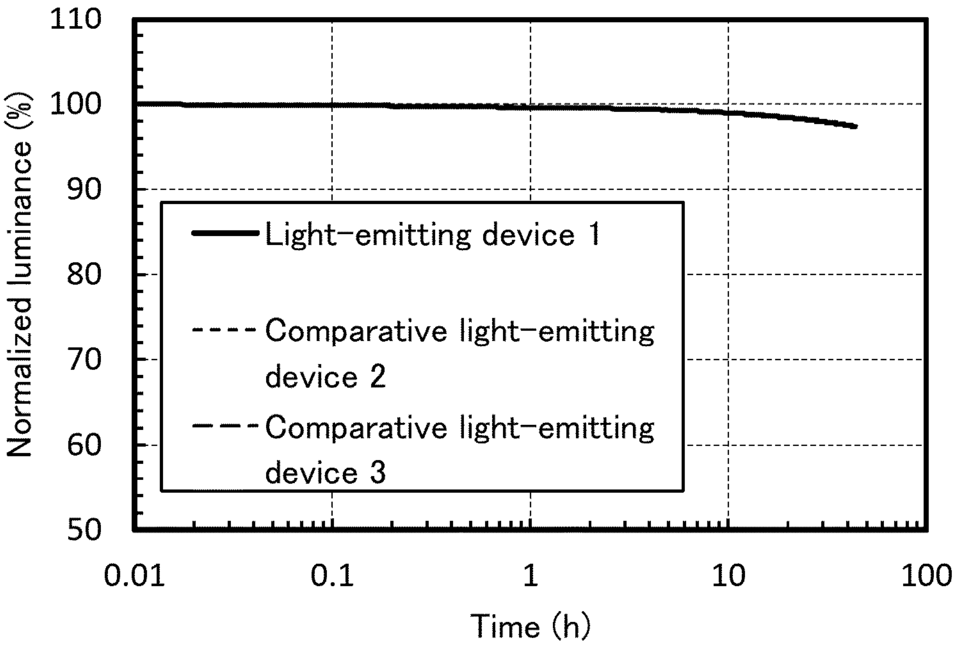
FIG. 27 shows reliabilities of the light-emitting device 1, the comparative light-emitting device 2, and the comparative light-emitting device 3.

Next, reliability test was performed on the light-emitting devices. FIG. 27 shows the result of the reliability test of the light-emitting device 1 and the comparative light-emitting devices 2 and 3. In FIG. 27, the vertical axis represents normalized luminance (%) with an initial luminance of 100%, and the horizontal axis represents driving time (h) of the devices. In the reliability test, driving test at a constant current density of 50 mA/cm$^2$ was performed on the light-emitting devices.

The result in FIG. 27 shows that the light-emitting device 1 had favorable reliability equivalent to those of the comparative light-emitting devices 2 and 3.

Regarding the light-emitting device 1 using the mixed material for a light-emitting device of one embodiment of the present invention, the above results in Example 3 show that the mixed material for a light-emitting device has a high heat-resistance. Accordingly, the light-emitting device 1 using the mixed material for a light-emitting device for its electron-transport layer has a heat-resistance adequate for the manufacturing process, as compared with the comparative light-emitting devices 2 and 3 each using a single material included in the mixed material for a light-emitting device for the electron-transport layer.

This application is based on Japanese Patent Application Serial No. 2021-061504 filed with Japan Patent Office on Mar. 31, 2021, the entire contents of which are hereby incorporated by reference.

What is claimed is:

1. A light-emitting device comprising:

a first electrode;

a first light-emitting layer over the first electrode;

a first charge-generation layer over the first light-emitting layer;

a second light-emitting layer over the first charge-generation layer;

a third light-emitting layer over the second light-emitting layer;

a second charge-generation layer over the third light-emitting layer;

a fourth light-emitting layer over the second charge-generation layer;

an electron-transport layer over the fourth light-emitting layer; and a second electrode, wherein the first light-emitting layer comprises a first light-emitting substance, wherein the second light-emitting layer comprises a second light-emitting substance, wherein the third light-emitting layer comprises a third light-emitting substance, wherein the fourth light-emitting layer comprises a fourth light-emitting substance, wherein one of the second light-emitting substance and the third light-emitting substance emits red light, wherein the other one of the second light-emitting substance and the third light-emitting substance emits green light, wherein the electron-transport layer comprises:

a first heteroaromatic compound comprising a first heteroaromatic ring being a benzimidazole ring; and a second heteroaromatic compound comprising a second heteroaromatic ring, and wherein the second heteroaromatic ring comprises at least one of a phenanthroline ring, a quinoxaline ring, a dibenzoquinoxaline ring, a quinazoline ring, a benzoquinazoline ring, a dibenzoquinazoline ring, a benzofropyrimidine ring, a benzofropyrazine ring, a diazine ring, and triazine ring.

2. The light-emitting device according to claim 1, wherein the second heteroaromatic ring is a triazine ring.

3. The light-emitting device according to claim 1, wherein each of the first light-emitting substance and the fourth light-emitting substance emits fluorescent light.

4. The light-emitting device according to claim 1, wherein the fourth light-emitting substance comprises one or both of a pyrene skeleton and an anthracene skeleton.

5. The light-emitting device according to claim 1, wherein the first charge-generation layer and the second charge-generation layer each comprises:

a third heteroaromatic compound comprising a third heteroaromatic ring;

a fourth heteroaromatic compound comprising a fourth heteroaromatic ring; and an electron donor, wherein the third heteroaromatic ring and the fourth heteroaromatic ring each comprises at least one of a phenanthroline ring, a quinoxaline ring, a dibenzoquinoxaline ring, a quinazoline ring, a benzoquinazoline ring, a dibenzoquinazoline ring, a benzimidazole ring, a benzofropyrimidine ring, a benzofropyrazine ring, a diazine ring, and triazine ring, and wherein a structure of the third heteroaromatic ring is different from a structure of the fourth heteroaromatic ring.

6. The light-emitting device according to claim 1, wherein a glass transition temperature of one of the first heteroaromatic compound and the second heteroaromatic compound is 100° C. or higher.

7. The light-emitting device according to claim 1, wherein a glass transition temperature of one of the first heteroaromatic compound and the second heteroaromatic compound is 100° C. or higher, and wherein a difference from a glass transition temperature of the other one of the first heteroaromatic compound and the second heteroaromatic compound is 40° C. or higher.

8. The light-emitting device according to claim 1, wherein a glass transition temperature of the first heteroaromatic compound is 100° C. or higher, and wherein a glass transition temperature of the second heteroaromatic compound is 100° C. or higher.

9. The light-emitting device according to claim 1, wherein the first heteroaromatic compound is represented by following formula

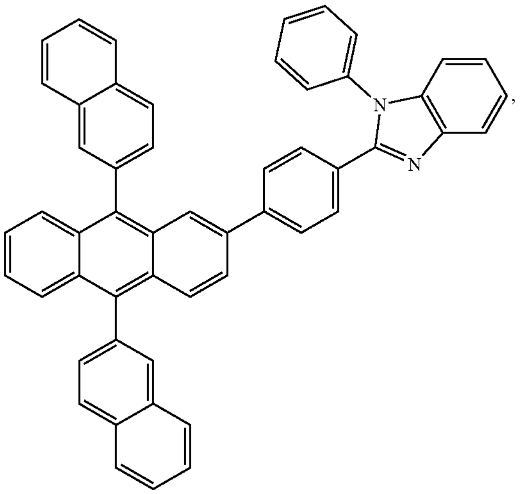

ZADN and wherein the second heteroaromatic compound is represented by formula (117)

(117)

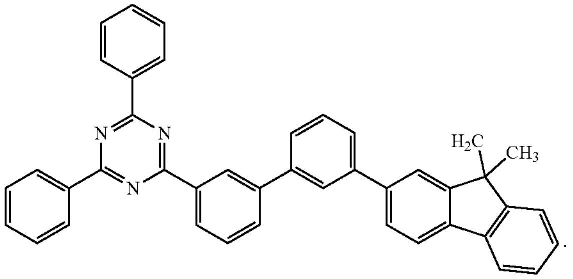

10. A light-emitting device comprising:
a first electrode;
a first light-emitting layer over the first electrode;
a first charge-generation layer over the first light-emitting layer;
a second light-emitting layer over the first charge-generation layer;
a third light-emitting layer over the second light-emitting layer;
a second charge-generation layer over the third light-emitting layer;
a fourth light-emitting layer over the second charge-generation layer;
an electron-transport layer over the fourth light-emitting layer; and
a second electrode,
wherein the first light-emitting layer comprises a first light-emitting substance,
wherein the second light-emitting layer comprises a second light-emitting substance,
wherein the third light-emitting layer comprises a third light-emitting substance,
wherein the fourth light-emitting layer comprises a fourth light-emitting substance,
wherein the second light-emitting substance emits light,
wherein the third light-emitting substance emits light having the same color as the light emitted by the second light-emitting substance,
wherein the electron-transport layer comprises:
a first heteroaromatic compound comprising a first heteroaromatic ring being a benzimidazole ring; and
a second heteroaromatic compound comprising a second heteroaromatic ring, and
wherein the second heteroaromatic ring comprises at least one of a phenanthroline ring, a quinoxaline ring, a dibenzoquinoxaline ring, a quinazoline ring, a benzoquinazoline ring, a dibenzoquinazoline ring, a benzofropyrimidine ring, a benzofropyrazine ring, a diazine ring, and triazine ring.

11. The light-emitting device according to claim 10,
wherein the second heteroaromatic ring is a triazine ring.

12. The light-emitting device according to claim 10,
wherein each of the first light-emitting substance and the fourth light-emitting substance emits fluorescent light.

13. The light-emitting device according to claim 10,
wherein the fourth light-emitting substance comprises one or both of a pyrene skeleton and an anthracene skeleton.

14. The light-emitting device according to claim 10,
wherein the first charge-generation layer and the second charge-generation layer each comprises:
a third heteroaromatic compound comprising a third heteroaromatic ring;
a fourth heteroaromatic compound comprising a fourth heteroaromatic ring; and
an electron donor,
wherein the third heteroaromatic ring and the fourth heteroaromatic ring each comprises at least one of a phenanthroline ring, a quinoxaline ring, a dibenzoquinoxaline ring, a quinazoline ring, a benzoquinazoline ring, a dibenzoquinazoline ring, a benzimidazole ring, a benzofropyrimidine ring, a benzofropyrazine ring, a diazine ring, and triazine ring, and
wherein a structure of the third heteroaromatic ring is different from a structure of the fourth heteroaromatic ring.

15. The light-emitting device according to claim 10,
wherein a glass transition temperature of one of the first heteroaromatic compound and the second heteroaromatic compound is 100° C. or higher.

16. The light-emitting device according to claim 10,
wherein a glass transition temperature of one of the first heteroaromatic compound and the second heteroaromatic compound is 100° C. or higher, and
wherein a difference from a glass transition temperature of the other one of the first heteroaromatic compound and the second heteroaromatic compound is 40° C. or higher.

17. The light-emitting device according to claim 10,
wherein a glass transition temperature of the first heteroaromatic compound is 100° C. or higher, and
wherein a glass transition temperature of the second heteroaromatic compound is 100° C. or higher.

18. The light-emitting device according to claim 10,
wherein the first heteroaromatic compound is represented by following formula

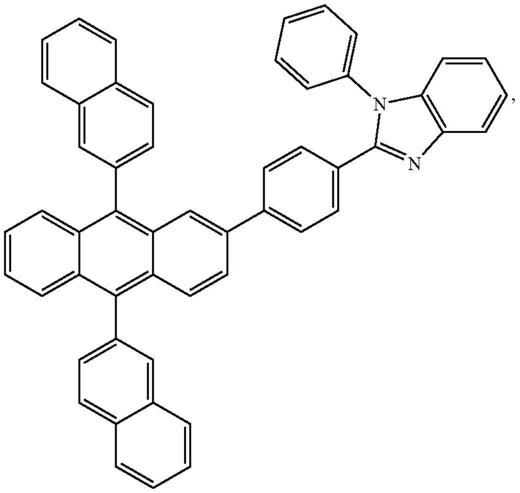

ZADN and
wherein the second heteroaromatic compound is represented by formula (117)

(117)

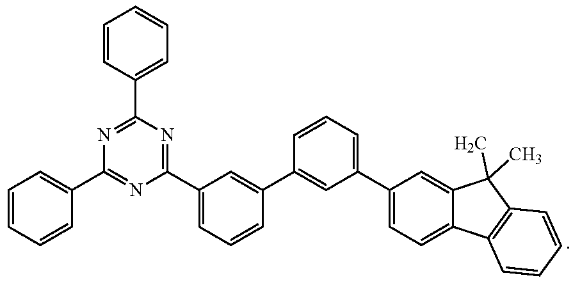

19. A light-emitting device comprising:
a first electrode;
a first light-emitting layer over the first electrode;
a first charge-generation layer over the first light-emitting layer;

a second light-emitting layer over the first charge-generation layer;

a third light-emitting layer over the second light-emitting layer;

a second charge-generation layer over the third light-emitting layer;

a fourth light-emitting layer over the second charge-generation layer;

an electron-transport layer over the fourth light-emitting layer; and a second electrode, wherein the first light-emitting layer comprises a first light-emitting substance, wherein the second light-emitting layer comprises a second light-emitting substance, wherein the third light-emitting layer comprises a third light-emitting substance, wherein the fourth light-emitting layer comprises a fourth light-emitting substance, wherein one of the second light-emitting substance and the third light-emitting substance emits red light, wherein the other one of the second light-emitting substance and the third light-emitting substance emits green light, wherein the electron-transport layer comprises:

a first heteroaromatic compound comprising a first heteroaromatic ring; and a second heteroaromatic compound comprising a second heteroaromatic ring, wherein the first heteroaromatic ring and the second heteroaromatic ring each comprises at least one of a phenanthroline ring, a quinoxaline ring, a dibenzoquinoxaline ring, a quinazoline ring, a benzoquinazoline ring, a dibenzoquinazoline ring, a benzofropyrimidine ring, a benzofropyrazine ring, a benzimidazole ring a diazine ring, and triazine ring, and wherein a structure of the first heteroaromatic ring is different from a structure of the second heteroaromatic ring.

20. The light-emitting device according to claim 19, wherein a glass transition temperature of one of the first heteroaromatic compound and the second heteroaromatic compound is 100° C. or higher.

21. The light-emitting device according to claim 19, wherein a glass transition temperature of one of the first heteroaromatic compound and the second heteroaromatic compound is 100° C. or higher, and wherein a difference from a glass transition temperature of the other one of the first heteroaromatic compound and the second heteroaromatic compound is 40° C. or higher.

22. The light-emitting device according to claim 19, wherein a glass transition temperature of the first heteroaromatic compound is 100° C. or higher, and wherein a glass transition temperature of the second heteroaromatic compound is 100° C. or higher.

23. A light-emitting device comprising:

a first electrode;

a first light-emitting layer over the first electrode;

a first charge-generation layer over the first light-emitting layer;

a second light-emitting layer over the first charge-generation layer;

a third light-emitting layer over the second light-emitting layer;

a second charge-generation layer over the third light-emitting layer;

a fourth light-emitting layer over the second charge-generation layer;

an electron-transport layer over the fourth light-emitting layer; and a second electrode, wherein the first light-emitting layer comprises a first light-emitting substance, wherein the second light-emitting layer comprises a second light-emitting substance, wherein the third light-emitting layer comprises a third light-emitting substance, wherein the fourth light-emitting layer comprises a fourth light-emitting substance, wherein the second light-emitting substance emits light, wherein the third light-emitting substance emits light having the same color as the light emitted by the second light-emitting substance, wherein the electron-transport layer comprises:

a first heteroaromatic compound comprising a first heteroaromatic ring; and a second heteroaromatic compound comprising a second heteroaromatic ring, wherein the first heteroaromatic ring and the second heteroaromatic ring each comprises at least one of a phenanthroline ring, a quinoxaline ring, a dibenzoquinoxaline ring, a quinazoline ring, a benzoquinazoline ring, a dibenzoquinazoline ring, a benzofropyrimidine ring, a benzofropyrazine ring, a benzimidazole ring a diazine ring, and triazine ring, and wherein a structure of the first heteroaromatic ring is different from a structure of the second heteroaromatic ring.

24. The light-emitting device according to claim 23, wherein a glass transition temperature of one of the first heteroaromatic compound and the second heteroaromatic compound is 100° C. or higher.

25. The light-emitting device according to claim 23, wherein a glass transition temperature of one of the first heteroaromatic compound and the second heteroaromatic compound is 100° C. or higher, and wherein a difference from a glass transition temperature of the other one of the first heteroaromatic compound and the second heteroaromatic compound is 40° C. or higher.

26. The light-emitting device according to claim 23, wherein a glass transition temperature of the first heteroaromatic compound is 100° C. or higher, and wherein a glass transition temperature of the second heteroaromatic compound is 100° C. or higher.

* * * * *